(12) United States Patent
Sunaga et al.

(10) Patent No.: US 8,211,984 B2
(45) Date of Patent: Jul. 3, 2012

(54) RING-OPENING METATHESIS POLYMER, HYDROGENATED PRODUCT THEREOF, METHOD FOR PREPARING THE SAME, AND USE THEREOF

(75) Inventors: Tadahiro Sunaga, Yamato (JP); Yuichi Okawa, Ichihara (JP); Takashi Ochiai, Chiba (JP); Keiichi Ikeda, Chigasaki (JP)

(73) Assignee: Mitsui Chemicals, Inc., Minato-Ku, Tokyo (JP)

( * ) Notice: Subject to any disclaimer, the term of this patent is extended or adjusted under 35 U.S.C. 154(b) by 347 days.

(21) Appl. No.: 12/374,281

(22) PCT Filed: Jan. 17, 2007

(86) PCT No.: PCT/JP2007/000768
§ 371 (c)(1),
(2), (4) Date: Jan. 16, 2009

(87) PCT Pub. No.: WO2008/010317
PCT Pub. Date: Jan. 24, 2008

(65) Prior Publication Data
US 2009/0215974 A1 Aug. 27, 2009

(30) Foreign Application Priority Data
Jul. 21, 2006 (JP) .................................. 2006-199133

(51) Int. Cl.
C08F 8/12 (2006.01)
C08F 8/04 (2006.01)
C08G 61/06 (2006.01)
G03F 7/004 (2006.01)

(52) U.S. Cl. ............ 525/329.5; 525/326.2; 525/326.6; 525/326.7; 525/327.2; 525/328.2; 525/338; 525/359.4; 525/369; 526/281; 430/270.1

(58) Field of Classification Search ........... 525/327.2, 525/329.5, 328.5, 338, 326.2, 326.7, 328, 525/2, 326.6, 328.8, 359.4, 369; 430/270.1; 526/281
See application file for complete search history.

(56) References Cited

U.S. PATENT DOCUMENTS
6,878,508 B2 4/2005 Watanabe et al.
2005/0148746 A1 7/2005 Taguchi et al.

FOREIGN PATENT DOCUMENTS
| JP | 5-097978 A | 4/1993 |
| JP | 6-051117 A | 2/1994 |
| JP | 11-130843 A | 5/1999 |
| JP | 2001-139776 A | 5/2001 |
| JP | 2003-003048 A | 1/2003 |
| JP | 2003-192688 A | 7/2003 |
| JP | 2003-316027 A | 11/2003 |
| JP | 2004-002795 A | 1/2004 |

OTHER PUBLICATIONS

Machine translation of JP 2001-139776; pub. date: May 2001.*
Form PCT/ISA/210 (International Search Report) dated Oct. 23, 2007.

* cited by examiner

*Primary Examiner* — Fred M Teskin
(74) *Attorney, Agent, or Firm* — Buchanan Ingersoll & Rooney PC

(57) ABSTRACT

Provided are a ring-opening metathesis polymer and a hydrogenated product thereof that are useful as materials for an optical component, and a method for preparation thereof. The present invention relates to a ring-opening metathesis polymer comprising at least repeating structural units [A] represented by the following General Formula [1] and repeating structural units [B] represented by the following General Formula [2] at a constitutional molar ratio [A]/[B] of 0.1/99.9 to 100/0. The present invention relates to a ring-opening metathesis polymer comprising at least repeating structural units [A] represented by the following General Formula [1] and repeating structural units [B] represented by the following General Formula [2] at a constitutional molar ratio [A]/[B] of 0.1/99.9 to 100/0.

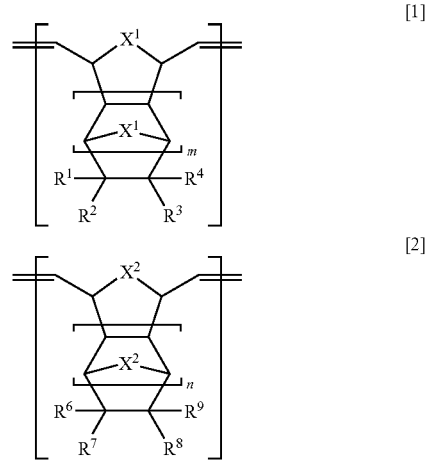

17 Claims, 1 Drawing Sheet

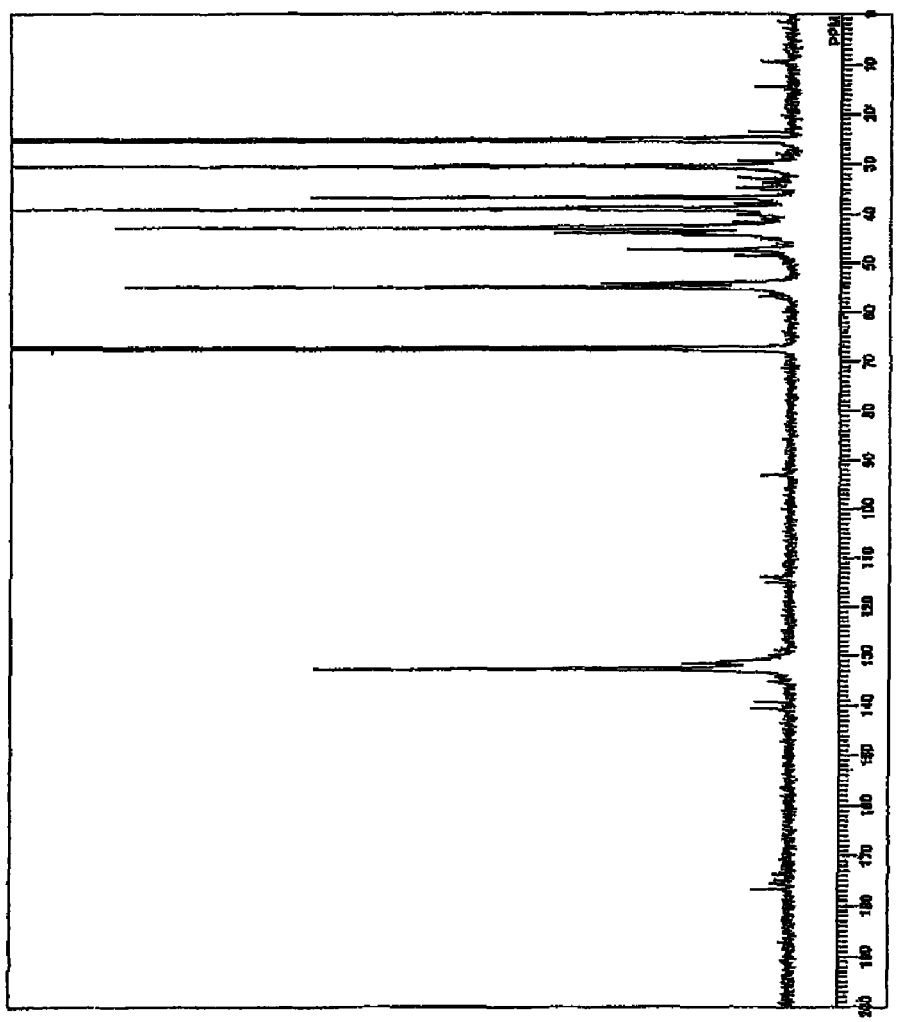

RING-OPENING METATHESIS POLYMER, HYDROGENATED PRODUCT THEREOF, METHOD FOR PREPARING THE SAME, AND USE THEREOF

TECHNICAL FIELD

The present invention relates to a novel ring-opening metathesis polymer, a hydrogenated product thereof, a process for producing the same, and a use of the same. Specifically, the present invention relates to a ring-opening metathesis polymer including structural units containing a substituent including at least organic acid residue, a hydrogenated product thereof, a process for producing the same, a material for an optical component including the ring-opening metathesis polymer and/or the hydrogenated product thereof, and a film or molded product obtained by molding the material for an optical component, and further to a resist including the ring-opening metathesis polymer and/or the hydrogenated product thereof.

BACKGROUND ART

Transparent resins have been widely used as the materials for molded products requiring transparency, such as automobile components, illumination equipments, and electric components. Recently, in addition to these application, other applications of these resins as optical materials or materials for electric components continue to progress.

The optical materials or materials for electric components require, in addition to transparency, a higher level of function that could not be satisfied by conventional common transparent resins, for example, a polycarbonate resin, a polymethylmethacrylate resin, and the like. For example, a base material for an optical disk as an optical material requires heat resistance, low birefringence, moldability, mechanical strength, adhesiveness to a recording layer, and the like.

As other resin materials in addition to the transparent resin, a hydrogenated product of a thermoplastic ring-opening metathesis polymer is excellent in transparency, heat resistance, low birefringence, moldability, or the like. Due to such characteristics, a hydrogenated product of a thermoplastic ring-opening metathesis polymer has been evaluated as a very suitable resin material that is excellent in physical strength, heat resistance, transparency, and low birefringence, as for the materials for plastic lens, a retardation film, or a polarizer protective film among the optical applications.

Patent Document 1 discloses a hydrogenated product of a ring-opening metathesis polymer, which contains a specific ratio of oligomers, such that it has high light transmittance and low birefringence, and as a result, it is very useful as a lens material. However, this document has no description of regulation of its refractive index that is an important factor for a lens.

In addition, Patent Document 2 discloses a polarizing film for a liquid crystal display, in which a thermoplastic saturated norbornene-based resin sheet is laminated as a protective layer on a polarizing film. The polarizing film is laminated on a liquid crystal substrate or a retardation film by a transparent acrylic adhesive, or the like, but it has a problem that it is difficult to exhibit adhesion strength.

The reason why sufficient adhesiveness cannot be obtained is that adhesion between a high-polarity polyvinyl alcohol and a low-polarity norbornene-based resin is effected.

Patent Document 3 reviews a method involving blending an oligomer of a norbornene-based resin having an enhanced polarity, which is obtained by polymerizing monomers containing an ester or an alcohol, with another norbornene-based resin to increase the adhesiveness and to lower the melt viscosity of the resin, thereby improving the moldability. However, the adhesion power by blending with a norbornene-based resin having an increased polarity is 0.07 kN/m, which is higher than 0.04 kN/m of the polarity when not blended therewith, but an effect of increasing the adhesion power is not sufficient. Also, the addition of the oligomer lowers the glass transition temperature, which in turn leads to a problem that heat resistance is lowered.

As for a method for further improving the polarity of a polymer, Patent Documents 4 and 5 each propose a method involving introducing a high-polarity carboxyl group. For introduction of a carboxyl group, a method in which cyclic olefins each containing an ester or an acid anhydride are copolymerized and then the ester or the acid anhydride is decomposed to obtain a carboxyl group, is disclosed, and further, Patent Document 6 discloses a method for directly copolymerizing cyclic olefins each containing a carboxyl group.

However, these documents mention a polymer containing a carboxyl group, but none of them disclose the relationship with heat resistance, melting characteristics upon melt molding, and optical properties and adhesiveness of the polymer containing a carboxyl group.

In addition, in the case where a polycarbonate, a polymethacrylate, a polystyrene, a cyclic olefin polymer, and the like, each of which has common transparency, are combined, and then applied as an optical material, small difference in the refractive indice is important since it does not cause light scattering such as refraction and reflection, and it is also necessary to arbitrarily control the refractive index by a polymer structure.

Moreover, if a hydrogenated product of a ring-opening metathesis polymer is used as an optical film or a molded product, a method for obtaining a film by a melt molding method, or a method for obtaining a molded product by injection molding had a drawback that the polymer gets deteriorated since high heat resistance leads to a molding temperature as high as 250° C. or higher, or that its appearance has defects due to generation of decomposed products, gels, or the like. Thus, there has been a need of development of a hydrogenated product of a thermoplastic ring-opening metathesis polymer, which has a high glass transition temperature, excellent heat resistance at a temperature used, and suitable flowability at a temperature zone for a molding process such as melt molding, or the like.

[Patent Document 1] Japanese Unexamined Patent Application Publication No. H5-97978
[Patent Document 2] Japanese Unexamined Patent Application Publication No. H 6-51117
[Patent Document 3] Japanese Unexamined Patent Application Publication No. 2003-3048
[Patent Document 4] Japanese Unexamined Patent Application Publication No. 2001-139776
[Patent Document 5] Japanese Unexamined Patent Application Publication No. H11-130843
[Patent Document 6] Japanese Unexamined Patent Application Publication No. 2004-2795

DISCLOSURE OF THE INVENTION

As described above, if a ring-opening metathesis polymer and a hydrogenated product thereof are used in optical applications, there is a need of development of a thermoplastic ring-opening metathesis polymer and a hydrogenated product thereof having heat resistance, low birefringence, moldability, adhesiveness, and mechanical strength, as desired according to the purposes, and capable of controlling a refractive index, and the like, as optical characteristics.

The present invention relates to the followings.

(1) A ring-opening metathesis polymer comprising at least repeating structural units [A] represented by the following General Formula [1]

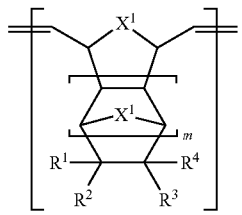

[1]

(wherein at least one of $R^1$ to $R^4$ is a substituent comprising an organic acid residue having 1 to 20 carbon atoms, and the remainders of $R^1$ to $R^4$ are each a group selected from the group consisting of hydrogen, an alkyl group having 1 to 20 carbon atoms, halogen, a halogenated alkyl group having 1 to 20 carbon atoms, an alkoxy group having 1 to 20 carbon atoms, an alkoxyalkyl group having 2 to 20 carbon atoms, an alkoxycarbonyl group having 2 to 20 carbon atoms, an aryloxycarbonyl group having 6 to 20 carbon atoms, a hydroxy group, a hydroxyalkyl group having 1 to 20 carbon atoms, an acid anhydride, a cyano group, and a silicon-containing group, while $R^1$ to $R^4$ may be bonded to each other to form a cyclic structure, and $X^1$ is selected from —O—, —S—, —$NR^5$—, —$PR^5$—, and —$CR^5{}_2$— (wherein $R^5$ represents hydrogen, or an alkyl group having 1 to 20 carbon atoms), and may be the same as or different from each other. m represents 0 or an integer of 1 to 3.), and repeating structural units [B] represented by the following General Formula [2]

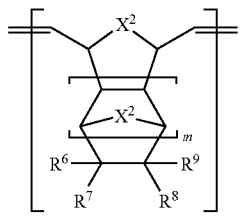

[2]

(wherein $R^6$ to $R^9$ are each a group selected from the group consisting of hydrogen, an alkyl group having 1 to 20 carbon atoms, halogen, a halogenated alkyl group having 1 to 20 carbon atoms, an alkoxy group having 1 to 20 carbon atoms, an alkoxyalkyl group having 2 to 20 carbon atoms, an alkoxycarbonyl group having 2 to 20 carbon atoms, an aryloxycarbonyl group having 6 to 20 carbon atoms, a hydroxy group, a hydroxyalkyl group having 1 to 20 carbon atoms, an acid anhydride, a cyano group, and a silicon-containing group, while $R^6$ to $R^9$ may be bonded to each other to form a cyclic structure, and $X^2$ is selected from —O—, —S—, —$NR^{10}$—, —$PR^{10}$—, and —$CR^{10}{}_2$— (wherein $R^{10}$ represents hydrogen, or an alkyl group having 1 to 20 carbon atoms), and may be the same as or different from each other. n represents 0 or an integer of 1 to 3.) at a constitutional molar ratio [A]/[B] of 0.1/99.9 to 100/0.

(2) A hydrogenated product of the ring-opening metathesis polymer of (1), wherein 50 to 100% of the double bonds in the main chain of the polymer is hydrogenated.

(3) The ring-opening metathesis polymer as described in (1), wherein at least one of $X^1$ of the structural units [A] represented by General Formula [1] and $X^2$ of the structural units [B] represented by General Formula [2] is —O— or —S—.

(4) The hydrogenated product of the ring-opening metathesis polymer as described in (2), wherein at least one of $X^1$ of the structural units [A] represented by General Formula [1] and $X^2$ of the structural units [B] represented by General Formula [2] is —O— or —S—.

(5) The ring-opening metathesis polymer as described in (1), wherein the water contact angle is 105° or less.

(6) The hydrogenated product of the ring-opening metathesis polymer as described in (2), wherein the water contact angle is 105° or less.

(7) The ring-opening metathesis polymer as described in (1), wherein the refractive index for a light at a D-ray wavelength is 1.48 or more.

(8) The hydrogenated product of the ring-opening metathesis polymer as described in (2), wherein the refractive index for the light at a D-ray wavelength is 1.48 or more.

(9) The ring-opening metathesis polymer as described in (1), wherein the adhesion strength is 0.1 kN/m or less, and the glass transition temperature is from 20° C. to 300° C.

(10) The hydrogenated product of the ring-opening metathesis polymer as described in (2), wherein the adhesion strength is 0.1 kN/m or more, and the glass transition temperature is from 20° C. to 300° C.

(11) A material for an optical component, comprising the ring-opening metathesis polymer and/or the hydrogenated product thereof as described in any one of (1) to (10).

(12) A film obtained by molding the material for an optical component as described in (11).

(13) A molded product obtained by molding the material for an optical component as described in (11).

(14) A resist material comprising the ring-opening metathesis polymer and/or the hydrogenated product thereof as described in any one of (1) to (10).

(15) A process for producing the ring-opening metathesis polymer as described in (1), comprising:

polymerizing at least one kind of a cyclic olefin monomer [C] represented by the following General Formula [3]

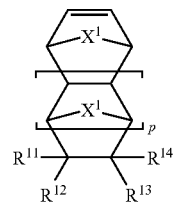

[3]

(wherein at least one of $R^{11}$ to $R^{14}$ is a substituent comprising an acid- or alkali-decomposable group having 1 to 20 carbon atoms, and the remainders of $R^{11}$ to $R^{14}$ are each a group selected from the group consisting of hydrogen, an alkyl group having 1 to 20 carbon atoms, halogen, a halogenated alkyl group having 1 to 20 carbon atoms, an alkoxy group having 1 to 20 carbon atoms, an alkoxyalkyl group having 2 to 20 carbon atoms, an alkoxycarbonyl group having 2 to 20 carbon atoms, an aryloxycarbonyl group having 6 to 20 carbon atoms, a hydroxy group, a hydroxyalkyl group having 1 to 20 carbon atoms, an acid anhydride, a cyano group, and a silicon-containing group, while $R^{11}$ to $R^{14}$ may be bonded to each other to form a cyclic structure, and $X^1$ is selected from —O—, —S—, —$NR^{15}$—, —$PR^{15}$—, and —$CR^{15}{}_2$— (wherein $R^{15}$ represents hydrogen, or an alkyl group having 1 to 20 carbon atoms), and may be the same as or different from each other. p represents 0 or an integer of 1 to 3.), or at least two kinds of the cyclic olefin monomers from a cyclic olefin monomer [C] represented by General Formula [3] and a cyclic olefin monomer [D] represented by the following General Formula [4]

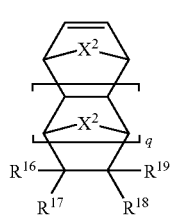

[4]

(wherein $R^{16}$ to $R^{19}$ are each a group selected from the group consisting of hydrogen, an alkyl group having 1 to 20 carbon atoms, halogen, a halogenated alkyl group having 1 to 20 carbon atoms, an alkoxy group having 1 to 20 carbon atoms, an alkoxyalkyl group having 2 to 20 carbon atoms, an alkoxycarbonyl group having 2 to 20 carbon atoms, an aryloxycarbonyl group having 6 to 20 carbon atoms, a hydroxy group, a hydroxyalkyl group having 1 to 20 carbon atoms, an acid anhydride, a cyano group, and a silicon-containing group, while $R^{16}$ to $R^{19}$ may be bonded to each other to form a cyclic structure, and $X^2$ is selected from —O—, —S—, —$NR^{20}$—, —$PR^{20}$—, and —$CR^{20}{}_2$— (wherein $R^{20}$ represents hydrogen, or an alkyl group having 1 to 20 carbon atoms), and may be the same as or different from each other. q represents 0 or an integer of 1 to 3.), in the presence of a ring-opening metathesis polymerization catalyst, and
    subjecting it to hydrolysis or acid elimination.
    (16) A process for producing the hydrogenated product of the ring-opening metathesis polymer as described in (2), comprising:
    polymerizing at least one kind of a cyclic olefin monomer [C] represented by the following General Formula [3]

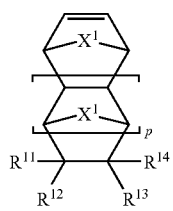

[3]

(wherein at least one of $R^{11}$ to $R^{14}$ is a substituent comprising an acid- or alkali-decomposable group having 1 to 20 carbon atoms, and the remainders of $R^{11}$ to $R^{14}$ are each a group selected from the group consisting of hydrogen, an alkyl group having 1 to 20 carbon atoms, halogen, a halogenated alkyl group having 1 to 20 carbon atoms, an alkoxy group having 1 to 20 carbon atoms, an alkoxyalkyl group having 2 to 20 carbon atoms, an alkoxycarbonyl group having 2 to 20 carbon atoms, an aryloxycarbonyl group having 6 to 20 carbon atoms, a hydroxy group, a hydroxyalkyl group having 1 to 20 carbon atoms, an acid anhydride, a cyano group, and a silicon-containing group, while $R^{11}$ to $R^{14}$ may be bonded to each other to form a cyclic structure, and $X^1$ is selected from —O—, —S—, —$NR^{15}$—, —$PR^{15}$—, and —$CR^{15}{}_2$— (wherein $R^{15}$ represents hydrogen, or an alkyl group having 1 to 20 carbon atoms), and may be the same as or different from each other. p represents 0 or an integer of 1 to 3.), or at least two kinds of the cyclic olefin monomers from a cyclic olefin monomer [C] represented by General Formula [3] and a cyclic olefin monomer [D] represented by the following General Formula [4]

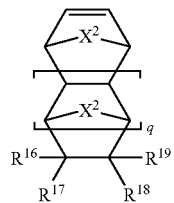

[4]

(wherein $R^{16}$ to $R^{19}$ are each a group selected from the group consisting of hydrogen, an alkyl group having 1 to 20 carbon atoms, halogen, a halogenated alkyl group having 1 to 20 carbon atoms, an alkoxy group having 1 to 20 carbon atoms, an alkoxyalkyl group having 2 to 20 carbon atoms, an alkoxycarbonyl group having 2 to 20 carbon atoms, an aryloxycarbonyl group having 6 to 20 carbon atoms, a hydroxy group, a hydroxyalkyl group having 1 to 20 carbon atoms, an acid anhydride, a cyano group, and a silicon-containing group, while $R^{16}$ to $R^{19}$ may be bonded to each other to form a cyclic structure, and $X^2$ is selected from —O—, —S—, —$NR^{20}$—, —$PR^{20}$—, and —$CR^{20}{}_2$— (wherein $R^{20}$ represents hydrogen, or an alkyl group having 1 to 20 carbon atoms), and may be the same as or different from each other. q represents 0 or an integer of 1 to 3.), in the presence of a ring-opening metathesis polymerization catalyst,
    subjecting it to hydrolysis or acid elimination, and
    further subjecting it to hydrogenation in the presence of a hydrogenation catalyst.
    (17) A process for producing the hydrogenated product of the ring-opening metathesis polymer as described in (2), comprising:
    polymerizing at least one kind of a cyclic olefin monomer [C] represented by the following General Formula [3]

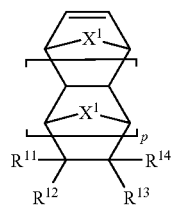

[3]

(wherein at least one of $R^{11}$ to $R^{14}$ is a substituent comprising an acid- or alkali-decomposable group having 1 to 20 carbon atoms, and the remainders of $R^{11}$ to $R^{14}$ are each a group selected from the group consisting of hydrogen, an alkyl group having 1 to 20 carbon atoms, halogen, a halogenated alkyl group having 1 to 20 carbon atoms, an alkoxy group having 1 to 20 carbon atoms, an alkoxyalkyl group having 2 to 20 carbon atoms, an alkoxycarbonyl group having 2 to 20 carbon atoms, an aryloxycarbonyl group having 6 to 20 carbon atoms, a hydroxy group, a hydroxyalkyl group having 1 to 20 carbon atoms, an acid anhydride, a cyano group, and a silicon-containing group, while $R^{11}$ to $R^{14}$ may be bonded to each other to form a cyclic structure, and $X^1$ is selected from —O—, —S—, —$NR^{15}$—, —$PR^{15}$—, and —$CR^{15}{}_2$— (wherein $R^{15}$ represents hydrogen, or an alkyl group having 1 to 20 carbon atoms), and may be the same as or different from each other. p represents 0 or an integer of 1 to 3.), or at least two kinds of a cyclic olefin monomer [C] represented by General Formula [3] and a cyclic olefin monomer [D] represented by the following General Formula [4]

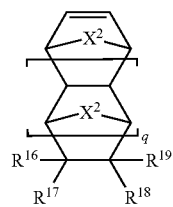

[4]

(wherein $R^{16}$ to $R^{19}$ are each a group selected from the group consisting of hydrogen, an alkyl group having 1 to 20 carbon atoms, halogen, a halogenated alkyl group having 1 to 20 carbon atoms, an alkoxy group having 1 to 20 carbon atoms, an alkoxyalkyl group having 2 to 20 carbon atoms, an alkoxycarbonyl group having 2 to 20 carbon atoms, an aryloxycarbonyl group having 6 to 20 carbon atoms, a hydroxy group, a hydroxyalkyl group having 1 to 20 carbon atoms, an acid anhydride, a cyano group, and a silicon-containing group, while $R^{16}$ to $R^{19}$ may be bonded to each other to form a cyclic structure, and $X^2$ is selected from —O—, —S—, —$NR^{20}$—, —$PR^{20}$—, and —$CR^{20}{}_2$— (wherein $R^{20}$ represents hydrogen, or an alkyl group having 1 to 20 carbon atoms), and may be the same as or different from each other. q represents 0 or an integer of 1 to 3.), in the presence of a ring-opening metathesis polymerization catalyst, subjecting it to hydrogenation in the presence of a hydrogenation catalyst, and further subjecting it to hydrolysis or acid elimination.

A ring-opening metathesis polymer and a hydrogenated product thereof of the present invention, comprising repeating structural units containing a substituent comprising at least an organic acid residue represented by General Formula (1) are excellent in all the characteristics such as transparency and optical characteristic.

BRIEF DESCRIPTION OF THE DRAWINGS

The drawing shows a $^{13}$C-NMR spectrum (400 MHz, solvent: deuterated tetrahydrofuran) of the ring-opening metathesis polymer obtained in Example 1.

BEST MODE FOR CARRYING OUT THE INVENTION

Hereinbelow, the ring-opening metathesis polymer, the hydrogenated product thereof, and the process for producing the same, and the use of the same according to the present invention are described in detail.

[Ring-Opening Metathesis Polymer]

The ring-opening metathesis polymer in the present invention is a ring-opening metathesis polymer comprising at least repeating structural units [A] represented by the following General Formula [1] and repeating structural units [B] represented by the following General Formula [2] at a constitutional molar ratio [A]/[B] of 0.1/99.9 to 100/0.

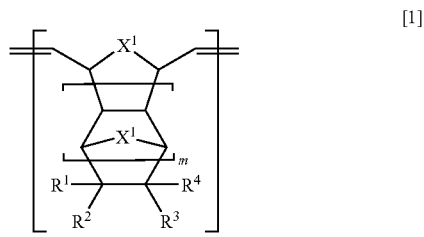

[1]

(wherein at least one of $R^1$ to $R^4$ is a substituent comprising an organic acid residue having 1 to 20 carbon atoms, and the remainders of $R^1$ to $R^4$ are each a group selected from the group consisting of hydrogen, an alkyl group having 1 to 20 carbon atoms, halogen, a halogenated alkyl group having 1 to 20 carbon atoms, an alkoxy group having 1 to 20 carbon atoms, an alkoxyalkyl group having 2 to 20 carbon atoms, an alkoxycarbonyl group having 2 to 20 carbon atoms, an aryloxycarbonyl group having 6 to 20 carbon atoms, a hydroxy group, a hydroxyalkyl group having 1 to 20 carbon atoms, an acid anhydride, a cyano group, and a silicon-containing group, while $R^1$ to $R^4$ may be bonded to each other to form a cyclic structure, and $X^1$ is selected from —O—, —S—, —$NR^5$—, —$PR^5$—, and —$CR^5{}_2$— (wherein $R^5$ represents hydrogen, or an alkyl group having 1 to 20 carbon atoms), and may be the same as or different from each other. m represents 0 or an integer of 1 to 3.)

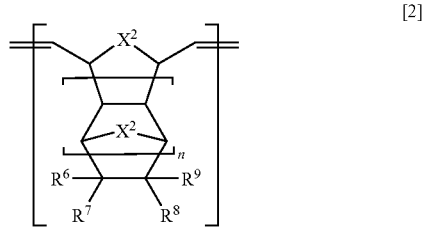

[2]

(wherein $R^6$ to $R^9$ are each a group selected from the group consisting of hydrogen, an alkyl group having 1 to 20 carbon atoms, halogen, a halogenated alkyl group having 1 to 20 carbon atoms, an alkoxy group having 1 to 20 carbon atoms, an alkoxyalkyl group having 2 to 20 carbon atoms, an alkoxycarbonyl group having 2 to 20 carbon atoms, an aryloxycarbonyl group having 6 to 20 carbon atoms, a hydroxy group, a hydroxyalkyl group having 1 to 20 carbon atoms, an acid anhydride, a cyano group, and a silicon-containing group, while $R^6$ to $R^9$ may be bonded to each other to form a cyclic structure, and $X^2$ is selected from —O—, —S—, —$NR^{10}$—, —$PR^{10}$—, and —$CR^{10}{}_2$— (wherein $R^{10}$ represents hydrogen, or an alkyl group having 1 to 20 carbon atoms), and may be the same as or different from each other. n represents 0 or an integer of 1 to 3.)

At least one of $R^1$ to $R^4$ in General Formula [1] of the present invention is a substituent comprising an organic acid residue having 1 to 20 carbon atoms, for example, a substituent comprising an organic acid residue of a carboxylic acid having 1 to 20 carbon atoms, an alkyl carboxylic acid, an alkyl sulfonic acid having 1 to 20 carbon atoms, and a fluorine-containing alkyl alcohol having 1 to 20 carbon atoms, and an aryl alcohol having 6 to 20 carbon atoms, an aryl carboxylic acid having 7 to 20 carbon atoms, and an aryl sulfonic acid having 6 to 20 carbon atoms.

Such a substituent comprising an organic acid residue does not deteriorate thermoplasticity, has high polarity and excellent transparency, and thus has crosslinking reactivity, and in addition, has an effect of increasing the glass transition temperature due to hydrogen bonds by organic acids, thereby increasing the heat resistance characteristics. Also, it can suitably control a contact angle to water by increasing hydrophilicity, that is, polarity, and for example, when it is used as a base polymer for a resist, the adhesiveness or cohesiveness with a substrate, or the surface treatment properties of a surface coat or a coating can be improved. Further, by applying light or heat, it can undergo a reaction in the presence of a crosslinking agent such as a diamine and a diepoxy, which offers characteristics such as curability, thereby improving heat resistance, or solvent resistance.

Further, specific examples of the substituent comprising an organic acid residue include a carboxylic acid having one carbon atom; and others as exemplified below. Examples of the alkyl carboxylic acid having 2 to 20 carbon atoms include methyl carboxylic acid, ethyl carboxylic acid, cyclohexyl carboxylic acid, and hexyl-3-carboxylic acid; examples of the alkyl sulfonic acid having 1 to 20 carbon atoms include methyl sulfonic acid, ethyl sulfonic acid, and cyclohexyl sulfonic acid; examples of the fluorine-containing alkyl alcohol having 1 to 20 carbon atoms include hydroxydifluoromethyl, and hydroxybis(trifluoromethyl)methyl; examples of the aryl alcohol having 6 to 20 carbon atoms include hydroxyphenyl and dihydroxyphenyl; examples of the aryl carboxylic acid having 7 to 20 carbon atoms include phenyl carboxylic acid, and phenyldicarboxylic acid; and examples of the aryl sulfonic acid having 6 to 20 carbon atoms include phenyl sulfonic acid and toluoyl sulfonic acid.

Examples of the remainders of $R^1$ to $R^4$ include a hydrogen; and others as exemplified below. Examples of an alkyl group having 1 to 20 carbon atoms include methyl, ethyl, propyl, isopropyl, n-butyl, tert-butyl, cyclohexyl, and menthyl; examples of the halogen include a chlorine atom, a bromine atom, an iodine atom, and a fluorine atom; and examples of the halogenated alkyl group having 1 to 20 carbon atoms include fluoromethyl, chloromethyl, bromomethyl, difluoromethyl, dichloromethyl, dibromomethyl, trifluoromethyl, trichloromethyl, and tribromomethyl. Moreover, examples of a substituent include an alkoxy group having 1 to 20 carbon atoms including methoxy, ethoxy, isopropoxy, n-butoxy, tert-butoxy, and menthoxy; and others as exemplified below. Examples of the alkoxyalkyl group having 2 to 20 carbon atoms include methoxymethyl, methoxyethyl, tert-butoxymethyl, tert-butoxyethyl, methoxymenthol, and alkoxy saccharides such as methylglucose. Examples of the alkoxycarbonyl group having 2 to 20 carbon atoms include methoxycarbonyl, ethoxycarbonyl, n-propoxycarbonyl, isopropoxycarbonyl, n-butoxycarbonyl, tert-butoxycarbonyl, 1-methylcyclopentyloxycarbonyl, 1-ethylcyclopentyloxycarbonyl, 1-ethylnorbonyloxycarbonyl, 1-ethyladamantyloxycarbonyl, cyclohexyloxycarbonyl, tetrahydropyran-2-yloxycarbonyl, tetrahydrofuran-2-yloxycarbonyl, 1-ethoxyethoxycarbonyl, and 1-butoxyethoxycarbonyl; examples of the aryloxycarbonyl group having 6 to 20 carbon atoms include phenoxycarbonyl; and hydroxy group; examples of hydroxyalkyl group having 1 to 20 carbon atoms include hydroxymethyl, hydroxyethyl, hydroxypropyl, hydroxybutyl, hydroxyhexyl, menthol, and hydroxyalkyl groups containing saccharides such as glucose. Moreover, examples of the acid anhydride include a carboxylic acid anhydride; examples of the cyano group include a cyano group having 1 to 20 carbon atoms such as nitrile, cyanomethyl and cyanoethyl; and specific examples of the silicon-containing group include a trialkylsilyl group having 3 to 20 carbon atoms such as trimethylsilyl, triethylsilyl, tripropylsilyl, triisopropylsilyl, tributylsilyl, triisobutylsilyl, tri-tert-butylsilyl, tripentylsilyl, and trihexylsilyl; trialkylsilyloxy groups having 3 to 20 carbon atoms such as trimethylsilyloxy, triethylsilyloxy, tripropylsilyloxy, triisopropylsilyloxy, tributylsilyloxy, triisobutylsilyloxy, tri-tert-butylsilyloxy, tripentylsilyloxy, and trihexylsilyloxy; and trialkylsilyloxycarbonyl groups having 3 to 20 carbon atoms such as trimethylsilyloxycarbonyl, triethylsilyloxycarbonyl, tripropylsilyloxycarbonyl, tributylsilyloxycarbonyl, triisobutylsilyloxycarbonyl, tri-tert-butylsilyloxycarbonyl, tripentylsilyloxycarbonyl, and trihexylsilyloxycarbonyl groups. Among these, particularly preferred is hydrogen.

Furthermore, $R^1$ to $R^4$ may be bonded to each other to form a cyclic structure. Examples of the cyclic structure include a cyclic alkyl structure capable of forming a cyclohexyl ring, a cyclic ester structure capable of forming a lactone ring, a cyclic imide structure capable of forming a phenylmaleimide ring, and an acid anhydride structure capable of forming a carboxylic acid anhydride.

Moreover, $X^1$ is selected from —O—, —S—, —$NR^5$—, —$PR^5$—, and —$CR^5{}_2$— (wherein $R^5$ represents hydrogen, or an alkyl group having 1 to 20 carbon atoms), and m is 0 or an integer of 1 to 3, and preferably 0 or 1. Also, if m is an integer of 1 to 3, $X^1$ may be the same as or different from each other. Specific examples of $R^5$ of —$NR^5$—, —$PR^5$—, and —$CR^5{}_2$— include hydrogen, and an alkyl group having 1 to 20 carbon atoms such as methyl, ethyl, n-propyl, isopropyl, n-butyl, tert-butyl, cyclohexyl, and menthyl. $X^1$ is preferably —O—, —S— or —$CH_2$—, and particularly preferably —O— or —S—.

Furthermore, examples of $R^6$ to $R^9$ in General Formula [2] of the present invention include hydrogen; and others as exemplified below. Examples of the alkyl group having 1 to 20 carbon atoms include methyl, ethyl, propyl, isopropyl, n-butyl, tert-butyl, cyclohexyl, and menthyl; examples of the halogen include a chlorine atom, a bromine atom, an iodine atom, and a fluorine atom; and examples of the halogenated alkyl group having 1 to 20 carbon atoms include fluoromethyl, chloromethyl, bromomethyl, difluoromethyl, dichloromethyl, dibromomethyl, trifluoromethyl, trichloromethyl, and tribromomethyl. Moreover, examples of the alkoxy group having 1 to 20 carbon atoms include methoxy, ethoxy, isopropoxy, n-butoxy, tert-butoxy, and menthoxy; examples of the alkoxyalkyl group having 2 to 20 carbon atoms include methoxymethyl, methoxyethyl, tert-butoxymethyl, tert-butoxyethyl, methoxymenthol, and alkoxy saccharides such as methylglucose. Examples of the alkoxycarbonyl group having 2 to 20 carbon atoms include methoxycarbonyl, ethoxycarbonyl, n-propoxycarbonyl, isopropoxycarbonyl, n-butoxycarbonyl, tert-butoxycarbonyl, 1-methylcyclopentyloxycarbonyl, 1-ethylcyclopentyloxycarbonyl, 1-ethylnorbonyloxycarbonyl, 1-ethyladamantyloxycarbonyl, cyclohexyloxycarbonyl, tetrahydropyran-2-yloxycarbonyl, tetrahydrofuran-2-yloxycarbonyl, 1-ethoxyethoxycarbonyl, and 1-butoxyethoxycarbonyl; examples of the aryloxycarbonyl group having 6 to 20 carbon atoms include phenoxycarbonyl; and hydroxy group; examples of hydroxyalkyl group having 1 to 20 carbon atoms include hydroxymethyl, hydroxyethyl, hydroxypropyl, hydroxybutyl, hydroxyhexyl, menthol, and a hydroxyalkyl group including saccharides such as glucose. Moreover, examples of the acid anhydride include anhydrous carboxylic acid; examples of the cyano group include a cyano group having 1 to 20 carbon atoms such as nitrile, cyanomethyl and cyanoethyl; and specific examples of the silicon-containing group include a trialkylsilyl group having 3 to 20 carbon atoms such as trimethylsilyl, triethylsilyl, tripropylsilyl, triisopropylsilyl, tributylsilyl, triisobutylsilyl, tri-tert-butylsilyl, tripentylsilyl, and trihexylsilyl, a trialkylsilyloxy group having 3 to 20 carbon atoms such as trimethylsilyloxy, triethylsilyloxy, tripropylsilyloxy, triisopropylsilyloxy, tributylsilyloxy, triisobutylsilyloxy, tri-tert-butylsilyloxy, tripentylsilyloxy, and trihexylsilyloxy, a trialkylsilyloxycarbonyl group having 3 to 20 carbon atoms such as trimethylsilyloxycarbonyl, triethylsilyloxycarbonyl, tripropylsilyloxycarbonyl, tributylsilyloxycarbonyl, triisobutylsilyloxycarbonyl, tri-tert-butylsilyloxycarbonyl, tripentylsilyloxycarbonyl, and trihexylsilyloxycarbonyl.

Examples of $R^6$ to $R^9$ preferably include hydrogen; and others as exemplified below. Examples of the alkyl group having 1 to 20 carbon atoms include methyl, ethyl, propyl, isopropyl, n-butyl, tert-butyl, cyclohexyl, and menthyl; examples of the halogen include a chlorine atom, a bromine atom, an iodine atom, and a fluorine atom; and examples of the halogenated alkyl group having 1 to 20 carbon atoms include fluoromethyl, chloromethyl, bromomethyl, difluoromethyl, dichloromethyl, dibromomethyl, trifluoromethyl, trichloromethyl, and tribromomethyl. Moreover, examples of the alkoxy group having 1 to 20 carbon atoms include methoxy, ethoxy, isopropoxy, n-butoxy, tert-butoxy, and menthoxy. Examples of the alkoxyalkyl group having 2 to 20 carbon atoms include methoxymethyl, methoxyethyl, tert-butoxymethyl, tert-butoxyethyl, methoxymenthol, and alkoxy saccharides such as methylglucose. Examples of the alkoxycarbonyl group having 2 to 20 carbon atoms include methoxycarbonyl, ethoxycarbonyl, n-propoxycarbonyl, isopropoxycarbonyl, n-butoxycarbonyl, tert-butoxycarbonyl, 1-methylcyclopentyloxycarbonyl, 1-ethylcyclopentyloxycarbonyl, 1-ethylnorbornyloxycarbonyl, 1-ethyladamantyloxycarbonyl, cyclohexyloxycarbonyl, tetrahydropyran-2-yloxycarbonyl, tetrahydrofuran-2-yloxycarbonyl, 1-ethoxyethoxycarbonyl, and 1-butoxyethoxycarbonyl; examples of the aryloxycarbonyl group having 6 to 20 carbon atoms include phenoxycarbonyl; hydroxy group; examples of hydroxyalkyl group having 1 to 20 carbon atoms include hydroxymethyl, hydroxyethyl, hydroxypropyl, hydroxybutyl, hydroxyhexyl, menthol, and a hydroxyalkyl group including saccharides such as glucose. Moreover, examples of the acid anhydride include anhydrous carboxylic acid.

Examples of $R^6$ to $R^9$ preferably include hydrogen; and others as exemplified below. Examples of the alkyl group having 1 to 20 carbon atoms include methyl, ethyl, propyl, isopropyl, n-butyl, tert-butyl, cyclohexyl, and menthyl; examples of the halogen include a chlorine atom, a bromine atom, an iodine atom, and a fluorine atom; and examples of the halogenated alkyl group having 1 to 20 carbon atoms include fluoromethyl, chloromethyl, bromomethyl, difluoromethyl, dichloromethyl, dibromomethyl, trifluoromethyl, trichloromethyl, and tribromomethyl. More preferably, $R^6$ to $R^9$ are each hydrogen.

Furthermore, $R^6$ to $R^9$ may be bonded to each other to form a cyclic structure. Examples of the cyclic structure include a cyclic alkyl structure capable of forming a cyclohexyl ring, a cyclic ester structure capable of forming a lactone ring, a cyclic imide structure capable of forming a phenylmaleimide ring, and an acid anhydride structure capable of forming a carboxylic anhydride.

Moreover, $X^2$ is selected from —O—, —S—, —NR$^{10}$—, —PR$^{10}$—, and —CR$^{10}_2$— (wherein R$^{10}$ represents hydrogen, or an alkyl group having 1 to 20 carbon atoms), and n is 0 or an integer of 1 to 3, and preferably 0 or 1. Also, if n is an integer of 1 to 3, $X^2$ may be the same as or different from each other. Specific examples of $R^{10}$ of —NR$^{10}$—, —PR$^{10}$—, and —CR$^{10}_2$— include hydrogen, and an alkyl group having 1 to 20 carbon atoms such as methyl, ethyl, n-propyl, isopropyl, n-butyl, tert-butyl, cyclohexyl, and menthyl. $X^2$ is preferably —O—, —S— or —CH$_2$—, and particularly preferably —O— or —S—.

The substituent comprising an organic acid residue of the repeating structural units [A] represented by General Formula [1] forms a suitable intermolecular network by the hydrogen bonds between the molecules, as mediated by the acidic proton. By this, the mobility of the polymer is limited, and the glass transition temperature is high and the heat resistance characteristics are improved at a used temperature, and on the other hand, the hydrogen bond strength is weakened, thereby exhibiting thermoplasticity with suitable flowability at a temperature for a molding process such as melt molding. It is important to suitably control these characteristics according to the content of the repeating structural units [A].

Furthermore, adhesiveness or cohesiveness with a substrate, or the surface treatment properties of a surface coat or a coating can be effected by the intermolecular strength due to the hydrogen bonds, and can be controlled by the content of the repeating structural units [A]. For these characteristics, the exhibition of the functions such as the adhesiveness or cohesiveness, and surface treatment properties can be predicted by evaluation of the contact angles to water, and the content of the repeating structural units [A] can be suitably adjusted according to the applications for use and the effects to be expected for controlling those contact angles. More specifically, when the content of the repeating structural units [A] represented by General Formula [1] is high, the heat resistance at a temperature used can be high, and the water contact angle can be decreased.

Moreover, a diamine compound, for example, a bifunctional low molecular compound such as hexamethylene diamine, or both-end diepoxypolyols or an oligomer having an epoxy group incorporated by oxidation of an olefinic polymer can be subjected to a reaction as a crosslinking agent with the organic acid residue of the repeating structural units [A] by melt-heating it at a high temperature, by mixing and contacting in a solution, or by exposure to a UV light having a specific wavelength, so as to exhibit curing characteristics, or may be reacted in the presence of a Lewis acid. By this, the heat resistance and the solvent resistance can be further improved.

In order to exhibit these characteristics, the ring-opening metathesis polymer in the present invention is a ring-opening metathesis polymer comprising at least the repeating structural units [A] represented by General Formula [1] and the repeating structural units [B] represented by General Formula [2] at a constitutional molar ratio [A]/[B] of 0.1/99.9 to 100/0, and preferably at a constitutional molar ratio [A]/[B] of 1/99 to 100/0. Further, if other repeating structural units are contained in addition to the repeating structural units [A] and the structural units [B], the content of the additional structural units is preferably 50 mol % or less, based on the total amount of the structural units [A] and [B].

Furthermore, the ring-opening metathesis polymer in the present invention has a water contact angle of preferably 105° or lower, more preferably from 50° to 105°, and most preferably from 80° to 100°.

The ring-opening metathesis polymer comprising the structural units selected from at least the structural units [A]

in which $X^1$ in the General Formula [1] is selected from —O—, —S—, —NR$^5$—, and —PR$^5$— (wherein R$^5$ represents hydrogen, or an alkyl group having 1 to 20 carbon atoms) and the structural units [B] in which $X^2$ in General Formula [2] is selected from —O—, —S—, —NR$^{10}$—, and —PR$^{10}$— (wherein R$^{10}$ represents hydrogen, or an alkyl group having 1 to 20 carbon atoms) can have an increased interaction such as hydrogen bonds, and can further decrease a water contact angle. Particularly, at least one of $X^1$ of General Formula [1] and $X^2$ of General Formula [2] is preferably —O—.

The ring-opening metathesis polymer in the present invention has a refractive index for a light at a D-ray wavelength of preferably 1.48 or more, and more preferably from 1.48 to 1.70.

The refractive index of light varies generally depending on the wavelength of the light, but when applying to a component that is combined with a material having general transparency such as polycarbonate, polymethacrylate, polystyrene, a cyclic olefin polymer, or the like, it is particularly important to evaluate a refractive index, based on a refractive index for a D-ray (wavelength: 589 nm). When there is no significant difference in the refractive index between the ring-opening metathesis polymer of the present invention and a material having such transparency, the difference in refractive indices of the light among the materials is small, thus causing no light scattering such as refraction or reflection.

This refraction property of the light can be adjusted according to the repeating structural units [B] represented by General Formula [2]. Particularly, in the case of willing to increase the refractive index, it is effective to contain aryl such as phenyl as a substituent of R$^6$ to R$^9$ in General Formula [2], and further, when $X^1$ or $X^2$ in General Formulae [1] and [2] is —S—, and preferably $X^1$ and $X^2$ are —S—, high refraction property can be exhibited.

The constitutional molar ratio [A]/[B] of the ring-opening metathesis polymer in the present invention comprising the repeating structural units [A] represented by General Formula [1] and the repeating structural units [B] represented by General Formula [2] so as to exhibit the above-described optical characteristics can be arbitrarily determined according to the balance among the cohesiveness depending on a contact angle to water, the surface treatment property, and the heat resistance by intermolecular hydrogen bond due to an organic acid residue.

Furthermore, the ring-opening metathesis polymer of the present invention has a light transmittance in a visible light region of preferably 80% or more, and more preferably from 85% to 100%.

The peel strength (adhesion strength) of the ring-opening metathesis polymer of the present invention can be measured by the following method.

(i) First, a solution of a ring-opening metathesis polymer dissolved in THF at a concentration of 20 wt % is cast-applied onto one side of an adherend film to give a dry thickness of 10 µm, and heated for drying at a temperature of 100° C. for 10 minutes to prepare two adhesive sheets.

(ii) Thereafter, three sheets with a thickness of 3.2 mm are cut out from one sheet of the resulting adhesive sheet, and the polymer-applied surfaces of the remaining adhesive sheet are superposed onto the polymer-applied surfaces of the three obtained adhesive sheets that have been cut. Here, the three obtained adhesive sheets should not be superposed onto each other.

(iii) Next, about 1 cm of an edge on the other side of the adhesive sheet is not pressed, interposed between two metal sheets in which their surfaces are mirror polished and polyimide sheets as cushioning materials, subjected to heating and pressurizing treatments under a load of 5 MPa at a temperature that is 20 to 60° C. higher than the glass transition temperature of the ring-opening metathesis polymer for 1 minute by means of a heating press machine, and then taken out and cooled to prepare a stacked sheet.

(iv) The adhesive sheet side that is not cut in the resulting stacked sheet is adhered onto a sheet made of an epoxy resin reinforced with a glass cloth that is fixed by a jig, using a double-side tape, and an edge of the cut adhesive sheet on the other side that is not pressed is secured with a clamp. Then, in accordance with an IPC-TM650 method, drawing is continuously performed at a peel angle of 90° between the surface of the sheet fixed on the sheet made of an epoxy resin and the surface of the sheet secured by the clamp at a rate of 50 mm/min to measure a peel strength, that is, an adhesion strength.

The peel strength (adhesion strength) of the ring-opening metathesis polymer according to the present invention is preferably 0.1 kN/m or more, more preferably from 0.1 kN/m to 3.0 kN/m, and most preferably from 0.4 kN/m to 3.0 kN/m. With this adhesion strength, a polymer having sufficient tolerance in practical uses can be provided.

The glass transition temperature (Tg) of the ring-opening metathesis polymer according to the present invention can be measured by means of Differential Scanning Calorimetry (DSC).

The glass transition temperature (Tg) of the ring-opening metathesis polymer according to the present invention is preferably 20° C. or higher. With this temperature, reduction of an elastic modulus at room temperature is inhibited, and accordingly, a sufficient strength can be obtained. Further, the glass transition temperature (Tg) is preferably 300° C. or lower, and more preferably 280° C. or lower. With this polymer, the molding temperature or the adhesion temperature is not needed to be extremely increased, and accordingly, deterioration of the ring-opening metathesis polymer can be prevented.

The weight average molecular weight (Mw) of the ring-opening metathesis polymer in the present invention in terms of polystyrene, as determined by Gel Permeation Chromatography (GPC), is preferably in a range of from 2,000 to 1,000,000, and more preferably in a range of from 5,000 to 300,000. With this range, the physical properties of the polymer are exhibited well, and the flowability upon formation of a thin film or injection molding is improved.

Furthermore, the molecular weight distribution (Mw/Mn), which is a ratio of the weight average molecular weight (Mw) to the number average molecular weight (Mn), is preferably in a range of from 1.0 to 5.0, more preferably in a range of from 1.4 to 5.0, and most preferably in a range of from 1.5 to 3.0. From a viewpoint of attaining formation of a film having a uniform thickness or good injection moldability, a wide molecular weight distribution is desirable.

[Hydrogenated Product of Ring-Opening Metathesis Polymer]

The hydrogenated product of the ring-opening metathesis polymer in the present invention is a product obtained by hydrogenation of preferably from 50% to 100%, and more preferably 80 to 100% of the double bonds in the main chain of the ring-opening metathesis polymer as described in (1). Moreover, specifically, in the hydrogenated product of the ring-opening metathesis polymer, the ring-opening metathesis polymer is a ring-opening metathesis polymer comprising at least the repeating structural units [A] represented by General Formula [1] and the repeating structural units [B] represented by General Formula [2] at a constitutional molar ratio

[A]/[B] of 0.1/99.9 to 100/0, and preferably at a constitutional molar ratio [A]/[B] of 1/99 to 100/0.

Furthermore, other repeating structural units may be contained in addition to the repeating structural units [A] and the structural units [B], and the content of the additional structural units is preferably 50 mol % or less, based on the total amount of the structural units [A] and [B]. The hydrogenated product is hydrogenated of from 50% to 100%, preferably from 80% to 100% of the double bonds in the main chain of the ring-opening metathesis polymer.

For the optical characteristics, when the double bond in the main chain which absorbs a light at a specific wavelength, particularly, a light at a wavelength in a UV ray region, is contained in a large amount, light transmission at a wavelength in a UV ray region is lowered, thereby leading to deterioration of the optical characteristics. For this light transmission, a desired transmittance can be controlled by hydrogenation of the double bonds in the main chain of the ring-opening metathesis polymer as described in (1) to saturated bonds, and in this case, if the amount of the double bonds is high, the refractive index is increased, and accordingly, by increasing the amount of the saturated bonds by hydrogenation, the refractive index can be lowered. By increasing or decreasing the hydrogenation rate, the refractive index can be arbitrarily adjusted.

On the other hand, these double bonds in the main chain limit free mobility of a polymer by taking a geometrically flat structure. That is, if there are lots of double bonds, the glass transition temperature is increased, and the heat resistance characteristics are improved. However, since the double bonds may deteriorate stability against oxidation, the related problems can be generally solved by suitably adding an antioxidant, or the like that can be used for olefinic polymers in order to prevent oxidation. Further, it may have the structure of an epoxide by oxidation of the double bonds.

Moreover, the amount of these double bonds affects the mechanical strength or impact resistance of the polymer. Accordingly, when the amount is high, the rigidity is increased, and when the double bonds are hydrogenated to saturated bonds, the flexibility or the impact resistance strength can be increased. Such the ratio of hydrogenation (hereinafter referred to as hydrogenation rate) of the double bonds in the main chain can be arbitrarily determined according to the balance the physical properties of a polymer, such as light transmission, heat resistance, weather resistance, mechanical strength, and impact property.

The hydrogenation rate of these double bonds gives little influence on contact angle to water, as in the ring-opening metathesis polymer.

For the hydrogenated product of the ring-opening metathesis polymer in the present invention, the peel strength, that is, the adhesion strength, is preferably 0.1 kN/m or more, more preferably from 0.1 kN/m to 3.0 kN/m, and most preferably from 0.4 kN/m and 3.0 kN/m. For the measurement thereof, the edge of adherends of a laminated film that is obtained by interposing between two sheets of adherend films followed by pressing it under heating are secured with a clamp, and then subjected to the measurement by withdrawing one end of the adherend at a rate of 50 mm/min in a 90° direction in accordance with an IPC-TM650 method. With this adhesion strength, a hydrogenated product of a polymer that is sufficiently available in practical uses can be provided.

For the hydrogenated product of the ring-opening metathesis polymer in the present invention, the glass transition temperature (Tg), as measured by means of Differential Scanning Calorimetry (DSC), is 20° C. to 300° C., and preferably 20° C. to 280° C. When Tg is 20° C. or higher, reduction of an elastic modulus at room temperature is inhibited, and accordingly, a sufficient strength can be obtained. Further, when Tg is 300° C. or lower, and preferably 280° C. or lower, the molding temperature or the adhesion temperature is not needed to be extremely increased, and accordingly, deterioration of the ring-opening metathesis polymer can be prevented.

The hydrogenated product of the ring-opening metathesis polymer in the present invention preferably has a weight average molecular weight (Mw) in terms of polystyrene, as determined by Gel Permeation Chromatography (GPC), in a range of from 2,000 to 1,000,000, and more preferably in a range of from 5,000 to 300,000. With this range, the physical properties of the polymer are exhibited well, and the flowability upon thin film formation or injection molding is improved.

Furthermore, the molecular weight distribution (Mw/Mn), which is a ratio of the weight average molecular weight (Mw) to the number average molecular weight (Mn), is preferably in a range of from 1.0 to 5.0, more preferably in a range of from 1.4 to 5.0, and most preferably in a range of from 1.5 to 3.0. From a viewpoint of attaining formation of a film having a uniform thickness or good injection moldability, a wide molecular weight distribution is desirable.

[Method for Preparing Ring-Opening Metathesis Polymer]

In the present invention, the ring-opening metathesis polymer having a substituent including organic acid residue which comprises repeating structural units [A] represented by the following General Formula [1] and repeating structural units [B] represented by the following General Formula [2] at a constitutional ratio [A]/[B] of 0.1/99.9 to 100/0. The ring-opening metathesis polymer can be prepared by polymerizing at least one kind of a cyclic olefin monomer [C] represented by General Formula [3], or at least two kinds of the cyclic olefin monomers from a cyclic olefin monomer [C] represented by General Formula [3] and a cyclic olefin monomer [D] represented by General Formula [4] with a ring-opening metathesis polymerization catalyst, and then subjecting it to hydrolysis or acid elimination. By hydrolysis or acid elimination, a substituent comprising an organic acid residue is produced.

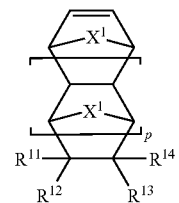

[3]

(wherein at least one of $R^{11}$ to $R^{14}$ is a substituent comprising an acid- or alkali-decomposable group having 1 to 20 carbon atoms, and the remainders of $R^{11}$ to $R^{14}$ are each a group selected from the group consisting of hydrogen, an alkyl group having 1 to 20 carbon atoms, halogen, a halogenated alkyl group having 1 to 20 carbon atoms, an alkoxy group having 1 to 20 carbon atoms, an alkoxyalkyl group having 2 to 20 carbon atoms, an alkoxycarbonyl group having 2 to 20 carbon atoms, an aryloxycarbonyl group having 6 to 20 carbon atoms, a hydroxy group, a hydroxyalkyl group having 1 to 20 carbon atoms, an acid anhydride, a cyano group, and a silicon-containing group, while $R^{11}$ to $R^{14}$ may be bonded to each other to form a cyclic structure, and $X^1$ is selected from —O—, —S—, —$NR^{15}$—, —$PR^{15}$—, and —$CR^{15}_2$— (wherein $R^{15}$ represents hydrogen, or an alkyl group having 1 to 20 carbon atoms), and may be the same as or different from each other. p represents 0 or an integer of 1 to 3.)

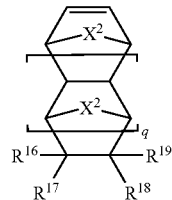

[4]

(wherein $R^{16}$ to $R^{19}$ are each a group selected from the group consisting of hydrogen, an alkyl group having 1 to 20 carbon atoms, halogen, a halogenated alkyl group having 1 to 20 carbon atoms, an alkoxy group having 1 to 20 carbon atoms, an alkoxyalkyl group having 2 to 20 carbon atoms, an alkoxycarbonyl group having 2 to 20 carbon atoms, an aryloxycarbonyl group having 6 to 20 carbon atoms, a hydroxy group, a hydroxyalkyl group having 1 to 20 carbon atoms, an acid anhydride, a cyano group, and a silicon-containing group, while $R^{16}$ to $R^{19}$ may be bonded to each other to form a cyclic structure, and $X^2$ is selected from —O—, —S—, —$NR^{20}$—, —$PR^{20}$—, and —$CR^{20}_2$— (wherein $R^{20}$ represents hydrogen, or an alkyl group having 1 to 20 carbon atoms), and may be the same as or different from each other. q represents 0 or an integer of 1 to 3.)

Moreover, the ring-opening metathesis polymer, which comprises the repeating structural units [A] represented by General Formula [1] having a substituent comprising an organic acid residue and the repeating structural units [B] represented by General Formula [2] at a constitutional molar ratio [A]/[B] of 0.1/99.9 to 100/0, can have a relationship with a constitutional molar ratio [C]/[D] of the cyclic olefin monomers, which satisfies [A]≦[C], and [A]/[B]≦[C]/[D].

That is, the repeating structural units [A] derived from the cyclic olefin monomer [C] represented by General Formula [3], which has a substituent comprising an organic acid residue, which is converted from a substituent comprising an acid- or alkali-decomposable group can be obtained by hydrolysis or acid elimination of a part or whole of the substituents comprising an acid- or alkali-decomposable group in the cyclic olefin monomer [C] to convert it to the repeating structural units [A] having a substituent comprising an organic acid residue.

In the present invention, examples of the cyclic olefin monomer represented by General Formula [3] or General Formula [4] to be polymerized using a ring-opening metathesis polymerization catalyst include a bicycloheptene derivative in which p or q is 0, a tetracyclododecene derivative in which p or q is 1, a hexacycloheptadecene derivative in which p or q is 2, and an octacyclodococene derivative in which p or q is 3.

In General Formula [3], a substituent including an acid- or alkali-decomposable group having 1 to 20 carbon atoms in at least one of $R^{11}$ to $R^{14}$ means a substituent capable of producing the above-mentioned organic acid residue by hydrolysis with an acid or an alkali or acid elimination. The substituent includes for example, an alkoxycarbonyl group having 2 to 20 carbon atoms, an alkoxycarbonylalkyl group having 3 to 20 carbon atoms, an alkylsulfonyloxy group having 1 to 20 carbon atoms, an alkylsulfonyloxyalkyl group having 2 to 20 carbon atoms, a fluorine-containing alkoxycarbonyloxyalkyl group having 3 to 20 carbon atoms, a fluorine-containing alkoxyalkyl having 2 to 20 carbon atoms, an alkoxyaryl group having 7 to 20 carbon atoms, an alkoxycarbonylaryl group having 8 to 20 carbon atoms, or an alkylsulfonyloxyaryl group having 7 to 20 carbon atoms.

Further specific examples of the substituent comprising an organic acid residue include a carboxylic acid having one carbon atom; and others as exemplified below. Examples of the alkyl carboxylic acid having 2 to 20 carbon atoms include methyl carboxylic acid, ethyl carboxylic acid, cyclohexyl carboxylic acid, and hexyl-3-carboxylic acid; examples of the alkyl sulfonic acid having 1 to 20 carbon atoms include methyl sulfonic acid, ethyl sulfonic acid, and cyclohexyl sulfonic acid; examples of the fluorine-containing alkyl alcohol having 1 to 20 carbon atoms include hydroxydifluoromethyl and hydroxybis(trifluoromethyl)methyl; examples of the aryl alcohol having 6 to 20 carbon atoms include hydroxyphenyl and dihydroxyphenyl; examples of the aryl carboxylic acid having 7 to 20 carbon atoms include phenyl carboxylic acid and phenyldicarboxylic acid; and examples of the aryl sulfonic acid having 6 to 20 carbon atoms include phenyl sulfonic acid and toluoyl sulfonic acid.

Specifically, examples of the alkoxycarbonyl group having 2 to 20 carbon atoms include methoxycarbonyl, ethoxycarbonyl, n-propoxycarbonyl, isopropoxycarbonyl, n-butoxycarbonyl, tert-butoxycarbonyl, cyclohexyloxycarbonyl, 1-methylcyclopentyloxycarbonyl, 1-ethylcyclopentyloxycarbonyl, tetrahydropyran-2-yloxycarbonyl, tetrahydrofuran-2-yloxycarbonyl, 1-ethoxyethoxycarbonyl, and 1-butoxyethoxycarbonyl, and particularly an alkoxycarbonyl group having a secondary or tertiary alkoxy is preferably used. Examples of the alkoxycarbonylalkyl group having 3 to 20 carbon atoms include methoxycarbonylmethyl, ethoxycarbonylmethyl, isopropoxycarbonylmethyl, tert-butoxycarbonylmethyl, tert-butoxycarbonylethyl, tert-butoxycarbonylmenthyl, cyclohexyloxycarbonylmethyl, 1-methylcyclopentyloxycarbonylmethyl, 1-ethylcyclopentyloxycarbonylmethyl, tetrahydropyran-2-yloxycarbonylmethyl, tetrahydropyran-2-yloxycarbonylmenthyl, tetrahydrofuran-2-yloxycarbonylmethyl, 1-ethoxyethoxycarbonylmethyl, and 1-butoxyethoxycarbonylmethyl, and an alkoxycarbonylalkyl group having a secondary or tertiary alkoxy is particularly preferably used.

Furthermore, examples of the alkylsulfonyloxy group having 1 to 20 carbon atoms include methylsulfonyloxy, ethylsulfonyloxy, isopropylsulfonyloxy, and tert-butylsulfonyloxy; examples of the alkylsulfonyloxyalkyl group having 2 to 20 carbon atoms include methylsulfonyloxymethyl, ethylsulfonyloxyethyl, and isopropylsulfonyloxycyclohexyl; examples of the fluorine-containing alkoxycarbonyloxyalkyl group having 3 to 20 carbon atoms include acetoxydifluoromethyl, acetoxybis(trifluoromethyl)methyl, ethylcarbonyloxybis(trifluoromethyl)methyl, and tert-butylcarbonyloxybis(trifluoromethyl)methyl; and further examples of the fluorine-containing alkoxyalkyl group having 2 to 20 carbon atoms include tert-butoxydifluoromethyl, tert-butoxybis(trifluoromethyl)methyl, 1-ethylcyclopentyloxydifluoromethyl, and 1-ethylcyclopentyloxy bis(trifluoromethyl)methyl. Further, examples of the alkoxyaryl group having 7 to 20 carbon atoms include methoxyphenyl and dimethoxyphenyl; examples of the alkoxycarbonylaryl group having 8 to 20 carbon atoms include methoxycarbonylphenyl and di(methoxycarbonyl)phenyl; or examples of the alkylsulfonyloxyaryl group having 7 to 20 carbon atoms include methylsulfonyloxyphenyl and methylsulfonyloxytoluoyl.

Examples of the remainders of $R^{11}$ to $R^{14}$ include hydrogen; and others as exemplified below. Examples of an alkyl group having 1 to 20 carbon atoms including such as methyl, ethyl, propyl, isopropyl, n-butyl, tert-butyl, cyclohexyl, and menthyl; examples of the halogen include a chlorine atom, a bromine atom, an iodine atom, and a fluorine atom; and examples of the halogenated alkyl group having 1 to 20 carbon atoms include fluoromethyl, chloromethyl, bromomethyl, difluoromethyl, dichloromethyl, dibromomethyl, trifluoromethyl, trichloromethyl, and tribromomethyl. Moreover, examples of the alkoxy group having 1 to 20 carbon atoms include methoxy, ethoxy, isopropoxy, n-butoxy, tert-butoxy, and menthoxy; and examples of the alkoxyalkyl group having 2 to 20 carbon atoms include methoxymethyl, methoxyethyl, tert-butoxymethyl, tert-butoxyethyl, methoxymenthol, and alkoxy saccharides such as methylglucose. Examples of the alkoxycarbonyl group having 2 to 20 carbon atoms include methoxycarbonyl, ethoxycarbonyl, n-propoxycarbonyl, isopropoxycarbonyl, n-butoxycarbonyl, tert-butoxycarbonyl, 1-methylcyclopentyloxycarbonyl, 1-ethylcyclopentyloxycarbonyl, 1-ethylnorbonyloxycarbonyl, 1-ethyladamantyloxycarbonyl, cyclohexyloxycarbonyl, tetrahydropyran-2-yloxycarbonyl, tetrahydrofuran-2-yloxycarbonyl, 1-ethoxyethoxycarbonyl, and 1-butoxyethoxycarbonyl; examples of the aryloxycarbonyl group having 6 to 20 carbon atoms include phenoxycarbonyl; and hydroxyl group; examples of hydroxyalkyl group having 1 to 20 carbon atoms include hydroxymethyl, hydroxyethyl, hydroxypropyl, hydroxybutyl, hydroxyhexyl, menthol, and hydroxyalkyl groups containing saccharides such as glucose. Moreover, examples of the acid anhydride include carboxylic acid anhydrous; examples of the cyano group include a cyano group having 1 to 20 carbon atoms such as nitrile, cyanomethyl and cyanoethyl; and specific examples of the silicon-containing group include a trialkylsilyl group having 3 to 20 carbon atoms such as trimethylsilyl, triethylsilyl, tripropylsilyl, triisopropylsilyl, tributylsilyl, triisobutylsilyl, tri-tert-butylsilyl, tripentylsilyl, and trihexylsilyl; and trialkylsilyloxy groups having 3 to 20 carbon atoms such as trimethylsilyloxy, triethylsilyloxy, tripropylsilyloxy, triisopropylsilyloxy, tributylsilyloxy, triisobutylsilyloxy, tri-tert-butylsilyloxy, tripentylsilyloxy, and trihexylsilyloxy; trialkylsilyloxycarbonyl groups having 3 to 20 carbon atoms such as trimethylsilyloxycarbonyl, triethylsilyloxycarbonyl, tripropylsilyloxycarbonyl, tributylsilyloxycarbonyl, triisobutylsilyloxycarbonyl, tri-tert-butylsilyloxycarbonyl, tripentylsilyloxycarbonyl, and trihexylsilyloxycarbonyl groups. Among these, particularly preferred is hydrogen.

Furthermore, $R^{11}$ to $R^{14}$ may be bonded to each other to form a cyclic structure. Examples of the cyclic structure include a cyclic alkyl structure capable of forming a cyclohexyl ring, a cyclic ester structure capable of forming a lactone ring, a cyclic imide structure capable of forming a phenylmaleimide ring, and an acid anhydride structure capable of forming a carboxylic acid anhydride.

Moreover, $X^1$ is selected from —O—, —S—, —NR$^{15}$—, —PR$^{15}$—, and —CR$^{15}_2$— (wherein $R^{15}$ represents hydrogen, or an alkyl group having 1 to 20 carbon atoms), and p is 0 or an integer of 1 to 3, and preferably 0 or 1. Also, if p is an integer of 1 to 3, $X^1$ may be the same as or different from each other. Specific examples of $R^{15}$ of —NR$^{15}$—, —PR$^{15}$—, and —CR$^{15}_2$ include hydrogen, and an alkyl group having 1 to 20 carbon atoms such as methyl, ethyl, n-propyl, isopropyl, n-butyl, tert-butyl, cyclohexyl, and menthyl. $X^1$ is preferably —O—, —S— or —CH$_2$—, and particularly preferably —O—.

Furthermore, examples of $R^{16}$ to $R^{19}$ in General Formula [4] of the present invention include hydrogen; and others as exemplified below. Examples of the alkyl group having 1 to 20 carbon atoms include methyl, ethyl, propyl, isopropyl, n-butyl, tert-butyl, cyclohexyl, and menthyl; examples of the halogen include a chlorine atom, a bromine atom, an iodine atom, and a fluorine atom; and examples of the halogenated alkyl group having 1 to 20 carbon atoms include fluoromethyl, chloromethyl, bromomethyl, difluoromethyl, dichloromethyl, dibromomethyl, trifluoromethyl, trichloromethyl, and tribromomethyl. Moreover, examples of the alkoxy group having 1 to 20 carbon atoms include methoxy, ethoxy, isopropoxy, n-butoxy, tert-butoxy, and menthoxy; examples of the alkoxyalkyl group having 2 to 20 carbon atoms include methoxymethyl, methoxyethyl, tert-butoxymethyl, tert-butoxyethyl, methoxymenthol, and alkoxy saccharides such as methylglucose. Examples of the alkoxycarbonyl group having 2 to 20 carbon atoms include methoxycarbonyl, ethoxycarbonyl, n-propoxycarbonyl, isopropoxycarbonyl, n-butoxycarbonyl, tert-butoxycarbonyl, 1-methylcyclopentyloxycarbonyl, 1-ethylcyclopentyloxycarbonyl, 1-ethylnorbonyloxycarbonyl, 1-ethyladamantyloxycarbonyl, cyclohexyloxycarbonyl, tetrahydropyran-2-yloxycarbonyl, tetrahydrofuran-2-yloxycarbonyl, 1-ethoxyethoxycarbonyl, and 1-butoxyethoxycarbonyl; examples of the aryloxycarbonyl group having 6 to 20 carbon atoms include phenoxycarbonyl; and examples of the hydroxy group, and hydroxyalkyl group having 1 to 20 carbon atoms include hydroxymethyl, hydroxyethyl, hydroxypropyl, hydroxybutyl, hydroxyhexyl, menthol, and a hydroxyalkyl group including saccharides such as glucose. Moreover, examples of the acid anhydride include carboxylic acid anhydride; examples of the cyano group include a cyano group having 1 to 20 carbon atoms such as nitrile, cyanomethyl and cyanoethyl; and specific examples of the silicon-containing group include a trialkylsilyl group having 3 to 20 carbon atoms such as trimethylsilyl, triethylsilyl, tripropylsilyl, triisopropylsilyl, tributylsilyl, triisobutylsilyl, tri-tert-butylsilyl, tripentylsilyl and trihexylsilyl, a trialkylsilyloxy group having 3 to 20 carbon atoms such as trimethylsilyloxy, triethylsilyloxy, tripropylsilyloxy, triisopropylsilyloxy, tributylsilyloxy, triisobutylsilyloxy, tri-tert-butylsilyloxy, tripentylsilyloxy and trihexylsilyloxy, and a trialkylsilyloxycarbonyl group having 3 to 20 carbon atoms such as trimethylsilyloxycarbonyl, triethylsilyloxycarbonyl, tripropylsilyloxycarbonyl, tributylsilyloxycarbonyl, triisobutylsilyloxycarbonyl, tri-tert-butylsilyloxycarbonyl, tripentylsilyloxycarbonyl and trihexylsilyloxycarbonyl.

Examples of $R^{16}$ to $R^{19}$ preferably include hydrogen; others as exemplified below. Examples of the alkyl group having 1 to carbon atoms include methyl, ethyl, propyl, isopropyl, n-butyl, tert-butyl, cyclohexyl, and menthyl; examples of the halogen include a chlorine atom, a bromine atom, an iodine atom, and a fluorine atom; and examples of the halogenated alkyl group having 1 to 20 carbon atoms include fluoromethyl, chloromethyl, bromomethyl, difluoromethyl, dichloromethyl, dibromomethyl, trifluoromethyl, trichloromethyl, and tribromomethyl. Moreover, examples of the alkoxy group having 1 to 20 carbon atoms include methoxy, ethoxy, isopropoxy, n-butoxy, tert-butoxy, and menthoxy. Examples of the alkoxyalkyl group having 2 to 20 carbon atoms include methoxymethyl, methoxyethyl, tert-butoxymethyl, tert-butoxyethyl, methoxymenthol, and alkoxy saccharides such as methylglucose. Examples of the alkoxycarbonyl group having 2 to 20 carbon atoms include methoxycarbonyl, ethoxycarbonyl, n-propoxycarbonyl, isopropoxycarbonyl, n-butoxycarbonyl, tert-butoxycarbonyl, 1-methylcyclopentyloxycarbonyl, 1-ethylcyclopentyloxycarbonyl, 1-ethylnorbonyloxycarbonyl, 1-ethyladamantyloxycarbonyl, cyclohexyloxycarbonyl, tetrahydropyran-2- yloxycarbonyl, tetrahydrofuran-2-yloxycarbonyl, 1-ethoxyethoxycarbonyl, and 1-butoxyethoxycarbonyl; examples of the aryloxycarbonyl group having 6 to 20 carbon atoms include phenoxycarbonyl; hydroxyl group; examples of hydroxyalkyl group having 1 to 20 carbon atoms include hydroxymethyl, hydroxyethyl, hydroxypropyl, hydroxybutyl, hydroxyhexyl, menthol, and a hydroxyalkyl group including saccharides such as glucose. Moreover, examples of the acid anhydride include carboxylic acid anhydride.

Examples of $R^{16}$ to $R^{19}$ particularly preferably include hydrogen and others as exemplified below. Examples of the alkyl group having 1 to 20 carbon atoms include methyl, ethyl, propyl, isopropyl, n-butyl, tert-butyl, cyclohexyl, and menthyl; examples of the halogen include a chlorine atom, a bromine atom, an iodine atom, and a fluorine atom; and examples of the halogenated alkyl group having 1 to 20 carbon atoms include fluoromethyl, chloromethyl, bromomethyl, difluoromethyl, dichloromethyl, dibromomethyl, trifluoromethyl, trichloromethyl, and tribromomethyl. More preferably, $R^{16}$ to $R^{19}$ are each hydrogen.

Furthermore, $R^{16}$ to $R^{19}$ may be bonded to each other to form a cyclic structure. Examples of such cyclic structures include a cyclic alkyl structure capable of forming a cyclohexyl ring, a cyclic ester structure capable of forming a lactone ring, a cyclic imide structure capable of forming a phenylmaleimide ring, and an acid anhydride structure capable of forming a carboxylic anhydride.

Moreover, $X^2$ is selected from —O—, —S—, —NR$^{20}$—, —PR$^{20}$—, and —CR$^{20}{}_2$— (wherein $R^{20}$ represents hydrogen, or an alkyl group having 1 to 20 carbon atoms), and q is 0 or an integer of 1 to 3, and preferably 0 or 1. Also, if q is an integer of 1 to 3, $X^2$ may be the same as or different from each other. Specific examples of $R^{20}$ of —NR$^{20}$—, —PR$^{20}$—, or —CR$^{20}{}_2$— include hydrogen, and an alkyl group having 1 to 20 carbon atoms such as methyl, ethyl, n-propyl, isopropyl, n-butyl, tert-butyl, cyclohexyl, and menthyl. $X^2$ is preferably —O—, —S— or —CH$_2$—, and particularly preferably —O—.

Specific examples of General Formula [3] in the present invention include 7-oxabicycloheptenes such as 5-methoxycarbonyl-7-oxabicyclo[2.2.1]hept-2-ene, 5-ethoxycarbonyl-7-oxabicyclo[2.2.1]hept-2-ene, 5-isopropoxycarbonyl-7-oxabicyclo[2.2.1]hept-2-ene, 5-tert-butoxycarbonyl-7-oxabicyclo[2.2.1]hept-2-ene, 5-cyclohexyloxycarbonyl-7-oxabicyclo[2.2.1]hept-2-ene, 5-(1'-methylcyclopentyloxycarbonyl)-7-oxabicyclo[2.2.1]hept-2-ene, 5-(1'-ethylcyclopentyloxycarbonyl)-7-oxabicyclo[2.2.1]hept-2-ene, 5-(tetrahydropyran-2'-yl oxycarbonyl)-7-oxabicyclo[2.2.1]hept-2-ene, 5-(1'-ethoxyethoxycarbonyl)-7-oxabicyclo[2.2.1]hept-2-ene, 5-(1'-butoxyethoxycarbonyl)-7-oxabicyclo[2.2.1]hept-2-ene, 5-methoxycarbonylmethyl-7-oxabicyclo[2.2.1]hept-2-ene, 5-ethoxycarbonylmethyl-7-oxabicyclo[2.2.1]hept-2-ene, 5-isopropoxycarbonylmethyl-7-oxabicyclo[2.2.1]hept-2-ene, 5-tert-butoxycarbonylmethyl-7-oxabicyclo[2.2.1]hept-2-ene, 5-cyclohexyloxycarbonylmethyl-7-oxabicyclo[2.2.1]hept-2-ene, 5-(1'-methylcyclopentyloxycarbonylmethyl)-7-oxabicyclo[2.2.1]hept-2-ene, 5-(1'-ethylcyclopentyloxycarbonylmethyl)-7-oxabicyclo[2.2.1]hept-2-ene, 5-(tetrahydropyran-2'-yloxycarbonylmethyl)-7-oxabicyclo[2.2.1]hept-2-ene, 5-(1'-ethoxyethoxycarbonylmethyl)-7-oxabicyclo[2.2.1]hept-2-ene, 5-(1'-butoxyethoxycarbonylmethyl)-7-oxabicyclo[2.2.1]hept-2-ene, 5-methylsulfonyloxy-7-oxabicyclo[2.2.1]hept-2-ene, 5-ethylsulfonyloxy-7-oxabicyclo[2.2.1]hept-2-ene, 5-isopropylsulfonyloxy-7-oxabicyclo[2.2.1]hept-2-ene, 5-tert-butylsulfonyloxy-7-oxabicyclo[2.2.1]hept-2-ene, 5-methylsulfonyloxymethyl-7-oxabicyclo[2.2.1]hept-2-ene, 5-ethylsulfonyloxyethyl-7-oxabicyclo[2.2.1]hept-2-ene, 5-isopropylsulfonyloxycyclohexyl-7-oxabicyclo[2.2.1]hept-2-ene, 2-(bicyclo[2.2.1]hepta-5-en-2-ylmethyl)-1,1,1,3,3,3-hexafluoropropan-2-yl acetate, 5-acetoxydifluoromethyl-7-oxabicyclo[2.2.1]hept-2-ene, 5-acetoxybis(trifluoromethyl)methyl-7-oxabicyclo[2.2.1]hept-2-ene, 5-ethylcarbonyloxybis(trifluoromethyl)methyl-7-oxabicyclo[2.2.1]hept-2-ene, 5-tert-butylcarbonyloxybis(trifluoromethyl)methyl-7-oxabicyclo[2.2.1]hept-2-ene, 5-tert-butoxydifluoromethyl-7-oxabicyclo[2.2.1]hept-2-ene, 5-(1'-ethylcyclopentyloxy difluoromethyl)-7-oxabicyclo[2.2.1]hept-2-ene, 5-(1',1-ethylcyclopentyloxy bis(trifluoromethyl)methyl)-7-oxabicyclo[2.2.1]hept-2-ene, 5-methoxyphenyl-7-oxabicyclo[2.2.1]hept-2-ene, 5-dimethoxyphenyl-7-oxabicyclo[2.2.1]hept-2-ene, 5-methoxycarbonylphenyl-7-oxabicyclo[2.2.1]hept-2-ene, 5-di(methoxycarbonyl)phenyl-7-oxabicyclo[2.2.1]hept-2-ene, 5-methylsulfonyloxyphenyl-7-oxabicyclo[2.2.1]hept-2-ene, and 5-methylsulfonyloxytoluoyl 7-oxabicyclo[2.2.1]hept-2-ene. Further examples include 7-thiabicycloheptenes obtained by replacing oxa (—O—) of these oxabicycloheptenes with thia (—S—), 7-azabicycloheptenes or 7-methyl-7-azabicycloheptenes obtained by replacing oxa (—O—) with aza (—NH—) or methylaza (—N(methyl)-), and 7-phosphabicycloheptenes or 7-methyl-7-phosphabicycloheptenes obtained by replacing oxa (—O—) with phospha (—PH—) or methylphospha (—P(methyl)-).

Moreover, other examples include bicycloheptenes or 7-methylbicycloheptenes obtained by replacing oxa of the 7-oxabicycloheptenes with methylene (—CH$_2$—) or methylmethylene (—CH(methyl)-), for example, bicycloheptenes such as 5-methoxycarbonyl-bicyclo[2.2.1]hept-2-ene, 5-ethoxycarbonyl-bicyclo[2.2.1]hept-2-ene, 5-isopropoxycarbonyl-bicyclo[2.2.1]hept-2-ene, 5-tert-butoxycarbonyl-bicyclo[2.2.1]hept-2-ene, 5-cyclohexyloxycarbonyl-bicyclo[2.2.1]hept-2-ene, 5-(1'-methylcyclopentyloxycarbonyl)-bicyclo[2.2.1]hept-2-ene, 5-(1'-ethylcyclopentyloxycarbonyl)-bicyclo[2.2.1]hept-2-ene, 5-(tetrahydropyran-2'-yl)oxycarbonyl-bicyclo[2.2.1]hept-2-ene, 5-(1'-ethoxyethoxycarbonyl)-bicyclo[2.2.1]hept-2-ene, 5-(1'-butoxyethoxycarbonyl)-bicyclo[2.2.1]hept-2-ene, 5-methoxycarbonylmethylbicyclo[2.2.1]hept-2-ene, 5-ethoxycarbonylmethyl-bicyclo[2.2.1]hept-2-ene, 5-isopropoxycarbonylmethyl-bicyclo[2.2.1]hept-2-ene, 5-tert-butoxycarbonylmethyl-bicyclo[2.2.1]hept-2-ene, 5-cyclohexyloxycarbonylmethyl-bicyclo[2.2.1]hept-2-ene, 5-(1'-methylcyclopentyloxycarbonylmethyl)-bicyclo[2.2.1]hept-2-ene, 5-(1'-ethylcyclopentyloxycarbonylmethyl)-bicyclo[2.2.1]hept-2-ene, 5-(tetrahydropyran-2'-yloxycarbonylmethyl)-bicyclo[2.2.1]hept-2-ene, 5-(1'-ethoxyethoxycarbonylmethyl)-bicyclo[2.2.1]hept-2-ene, 5-(1'-butoxyethoxycarbonylmethyl)-bicyclo[2.2.1]hept-2-ene, 5-methylsulfonyloxy-bicyclo[2.2.1]hept-2-ene, 5-ethylsulfonyloxy-bicyclo[2.2.1]hept-2-ene, 5-isopropylsulfonyloxy-bicyclo[2.2.1]hept-2-ene, 5-tert-butylsulfonyloxy-bicyclo[2.2.1]hept-2-ene, 5-methylsulfonyloxymethyl-bicyclo[2.2.1]hept-2-ene, 5-ethylsulfonyloxyethyl-bicyclo[2.2.1]hept-2-ene, 5-isopropylsulfonyloxycyclohexyl-bicyclo[2.2.1]hept-2-ene, 5-acetoxydifluoromethyl-bicyclo[2.2.1]hept-2-ene, 5-acetoxybis(trifluoromethyl)methyl-bicyclo[2.2.1]hept-2-ene, 5-ethylcarbonyloxybis(trifluoromethyl)methyl-bicyclo[2.2.1]hept-2-ene, 5-tert-butylcarbonyloxybis(trifluoromethyl)methyl-bicyclo[2.2.1]hept-2-ene, 5-tert-butoxydifluoromethyl-bicyclo[2.2.1]hept-2-ene, 5-(1'-ethylcyclopentyloxy difluoromethyl)-bicyclo[2.2.1]hept-2-ene, 5-(1',1-ethylcyclopentyloxy bis (trifluoromethyl)methyl)-bicyclo[2.2.1]hept-2-ene, 5-methoxyphenyl-bicyclo[2.2.1]hept-2-ene, 5-dimethoxyphenyl-bicyclo[2.2.1]hept-2-ene, 5-methoxycarbonylphenyl-bicyclo[2.2.1]hept-2-ene, 5-di(methoxycarbonyl)phenyl-bicyclo[2.2.1]hept-2-ene, 5-methylsulfonyloxyphenyl-bicyclo[2.2.1]hept-2-ene, and 5-methylsulfonyloxytoluoyl-bicyclo[2.2.1]hept-2-ene.

As specific example of General Formula [3] in the present invention, tetracyclododecenes can be used. Examples of the tetracyclododecenes include 8-methoxycarbonyl-tetracyclo[4.4.0.1$^{2,5}$.1$^{7,10}$]-3-dodecene, 8-ethoxycarbonyl-tetracyclo[4.4.0.1$^{2,5}$.1$^{7,10}$]-3-dodecene, 8-isopropoxycarbonyl-tetracyclo[4.4.0.1$^{2,5}$.1$^{7,10}$]-3-dodecene, 8-tert-butyloxycarbonyl-tetracyclo[4.4.0.1$^{2,5}$.1$^{7,10}$]-3-dodecene, 8-tert-butyloxycarbonyl-1'-oxa-tetracyclo[4.4.0.1$^{2,5}$.1$^{7,10}$]-3-dodecene, 8-cyclohexyloxycarbonyl-tetracyclo[4.4.0.1$^{2,5}$.1$^{7,10}$]-3-dodecene, 8-(1'-methylcyclopentyloxycarbonyl)-tetracyclo[4.4.0.1$^{2,5}$.1$^{7,10}$]-3-dodecene, 8-(1'-ethylcyclopentyloxycarbonyl)-tetracyclo[4.4.0.1$^{2,5}$.1$^{7,10}$]-3-dodecene, 8-(tetrahydropyran-2'-yl)oxycarbonyl-tetracyclo[4.4.0.1$^{2,5}$.1$^{7,10}$]-3-dodecene, 8-(1'-ethoxyethoxycarbonyl)-tetracyclo[4.4.0.1$^{2,5}$.1$^{7,10}$]-3-dodecene, 8-(1'-butoxyethoxycarbonyl)-tetracyclo[4.4.0.1$^{2,5}$.1$^{7,10}$]-3-dodecene, 8-methoxycarbonylmethyl-tetracyclo[4.4.0.1$^{2,5}$.1$^{7,10}$]-3-dodecene, 8-ethoxycarbonylmethyl-tetracyclo[4.4.0.1$^{2,5}$.1$^{7,10}$]-3-dodecene, 8-isopropoxycarbonylmethyl-tetracyclo[4.4.0.1$^{2,5}$.1$^{7,10}$]-3-dodecene, 8-tert-butyloxycarbonylmethyl-tetracyclo[4.4.0.1$^{2,5}$.1$^{7,10}$]-3-dodecene, 8-cyclohexyloxycarbonylmethyl-tetracyclo[4.4.0.1$^{2,5}$.1$^{7,10}$]-3-dodecene, 8-(1'-methylcyclopentyloxycarbonylmethyl)-tetracyclo[4.4.0.1$^{2,5}$.1$^{7,10}$]-3-dodecene, 8-(1'-ethylcyclopentyloxycarbonylmethyl)-tetracyclo[4.4.0.1$^{2,5}$.1$^{7,10}$]-3-dodecene, 8-(tetrahydropyran-2'-yloxycarbonylmethyl)-tetracyclo[4.4.0.1$^{2,5}$.1$^{7,10}$]-3-dodecene, 8-(1'-ethoxyethoxycarbonylmethyl)-tetracyclo[4.4.0.1$^{2,5}$.1$^{7,10}$]-3-dodecene, 8-(1'-butoxyethoxycarbonylmethyl)-tetracyclo[4.4.0.1$^{2,5}$.1$^{7,10}$]-3-dodecene, 8-methylsulfonyloxy-tetracyclo[4.4.0.1$^{2,5}$.1$^{7,10}$]-3-dodecene, 8-ethylsulfonyloxy-tetracyclo[4.4.0.1$^{2,5}$.1$^{7,10}$]-3-dodecene, 8-isopropylsulfonyloxy-tetracyclo[4.4.0.1$^{2,5}$.1$^{7,10}$]-3-dodecene, 8-tert-butylsulfonyloxy-tetracyclo[4.4.0.1$^{2,5}$.1$^{7,10}$]-3-dodecene, 8-methylsulfonyloxymethyl-tetracyclo[4.4.0.1$^{2,5}$.1$^{7,10}$]-3-dodecene, 8-ethylsulfonyloxyethyl-tetracyclo[4.4.0.1$^{2,5}$.1$^{7,10}$]-3-dodecene, 8-isopropylsulfonyloxycyclohexyl-tetracyclo[4.4.0.1$^{2,5}$1$^{7,10}$]-3-dodecene, 8-acetoxydifluoromethyl-tetracyclo[4.4.0.1$^{2,5}$.1$^{7,10}$]-3-dodecene, 8-acetoxybis(trifluoromethyl)methyl-tetracyclo[4.4.0.1$^{2,5}$.1$^{7,10}$]-3-dodecene, 8-ethylcarbonyloxybis(trifluoromethyl)-tetracyclo[4.4.0.1$^{2,5}$.1$^{7,10}$]-3-dodecene, 8-tert-butylcarbonyloxybis(trifluoromethyl)-tetracyclo[4.4.0.1$^{2,5}$.1$^{7,10}$]-3-dodecene, 8-tert-butyloxydifluoromethyl-tetracyclo[4.4.0.1$^{2,5}$.1$^{7,10}$]-3-dodecene, 8-(1'-ethylcyclopentyloxy difluoromethyl)-tetracyclo[4.4.0.1$^{2,5}$.1$^{7,10}$]-3-dodecene, 8-(1'-ethylcyclopentyloxy bis(trifluoromethyl)methyl)-tetracyclo[4.4.0.1$^{2,5}$.1$^{7,10}$]-3-dodecene, 8-methoxyphenyl-tetracyclo[4.4.0.1$^{2,5}$.1$^{7,10}$]-3-dodecene, 8-dimethoxyphenyl-tetracyclo[4.4.0.1$^{2,5}$.1$^{7,10}$]-3-dodecene, 8-methoxycarbonylphenyl-tetracyclo[4.4.0.1$^{2,5}$.1$^{7,10}$]-3-dodecene, 8-di(methoxycarbonyl)phenyl-tetracyclo[4.4.0.1$^{2,5}$.1$^{7,10}$]-3-dodecene, 8-methylsulfonyloxyphenyl-tetracyclo[4.4.0.1$^{2,5}$.1$^{7,10}$]-3-dodecene, and 8-methylsulfonyloxytoluoyl-tetracyclo[4.4.0.1$^{2,5}$.1$^{7,10}$]-3-dodecene. Further examples include thia-tetracyclododecenes obtained by replacing methylene of $X^1$ with thia (—S—); aza-tetracyclododecenes and methylaza-tetracyclododecenes obtained by replacing the methylene with aza (—NH—) and methylaza (—N(methyl)-), respectively; and phospha-tetracyclododecenes and methylphospha-tetracyclododecenes obtained by replacing the methylene with phospha (—PH—) and methylphospha (—P(methyl)-), respectively, while $X^1$ may be same with or different from each other.

Further, examples other than the substituent containing an acid- or alkali-decomposable group having 1 to 20 carbon atoms in $R^{11}$ to $R^{14}$ include hydrogen, an alkyl group having 1 to 20 carbon atoms, halogen, a halogenated alkyl group having 1 to 20 carbon atoms, an alkoxy group having 1 to 20 carbon atoms, an alkoxyalkyl group having 2 to 20 carbon atoms, an alkoxycarbonyl group having 2 to 20 carbon atoms, an aryloxycarbonyl group having 6 to 20 carbon atoms, a hydroxy group, a hydroxyalkyl group having 1 to 20 carbon atoms, an acid anhydride or a cyano group. The cyclic olefin monomers [c] has a substituent, at any position, selected from above-mentioned substituents.

$R^{11}$ to $R^{14}$ may be bonded to each other to form a cyclic structure. Examples of the structure of a basic cyclic olefin monomer containing other substituent than a substituent including an acid- or alkali-decomposable group include cyclic olefin monomers having a cyclic alkyl structure capable of forming a cyclohexyl ring such as 1,4,4a,5,6,7,8,8a-octahydro-1,4-methanonaphthalene; a cyclic ester structure capable of forming a lactone ring such as 4,10-dioxatricyclo[5.2.1.0$^{2,6}$]-8-decen-3-one; a cyclic imide structure capable of forming a phenylmaleimide ring such as 4-cyclohexyl-4-aza-tricyclo[5.2.1.0$^{2,6}$]-8-decene-3,5-dione, and 4-cyclohexyl-4-aza-10-oxa-tricyclo[5.2.1.0$^{2,6}$]-8-decene-3,5-dione; and an acid anhydride structure capable of forming a carboxylic acid anhydride such as 4-oxa-tricyclo[5.2.1.0$^{2,6}$]-8-decene-3,5-dione and 4,10-dioxa-tricyclo[5.2.1.0$^{2,6}$]-8-decene-3,5-dione, and 4-oxa-10-thia-tricyclo[5.2.1.0$^{2,6}$]-8-decene-3,5-dione.

Specific examples of General Formula [4] in the present invention include cyclic olefin monomers including hydrocarbons of bicycloheptenes such as bicyclo[2.2.1]hept-2-ene, 5-methylbicyclo[2.2.1]hept-2-ene, 5-ethylbicyclo[2.2.1]hept-2-ene, 5-chlorobicyclo[2.2.1]hept-2-ene, 5-bromobicyclo[2.2.1]hept-2-ene, and 5-methyl-6-methylbicyclo[2.2.1]hept-2-ene, tetracyclododecenes such as tetracyclo[4.4.0.1$^{2,5}$.1$^{7,10}$]-3-dodecene, 8-methyl-tetracyclo[4.4.0.1$^{2,5}$.1$^{7,10}$]-3-dodecene, 8-ethyl-tetracyclo[4.4.0.1$^{2,5}$.1$^{7,10}$]-3-dodecene, 8-cyano-tetracyclo[4.4.0.1$^{2,5}$.1$^{7,10}$]-3-dodecene, 8-chloro-tetracyclo[4.4.0.1$^{2,5}$.1$^{7,10}$]-3-dodecene, 8-bromo-tetracyclo[4.4.0.1$^{2,5}$.1$^{7,10}$]-3-dodecene, and 8-methyl-9-methyl-tetracyclo[4.4.0.1$^{2,5}$.1$^{7,10}$]-3-dodecene, hexacycloheptadecenes such as hexacyclo[4.4.0.1$^{2,5}$.1$^{7,10}$]-4-heptadecene, 11-methyl-hexacyclo[6.6.1.1$^{3,6}$.1$^{10,13}$.0$^{2,7}$.0$^{9,14}$]-4-heptadecene, and 11-ethyl-hexacyclo[6.6.1.1$^{3,6}$.1$^{10,13}$.0$^{2,7}$.0$^{9,14}$]-4-heptadecene, or octacyclododecenes such as octacyclo[8.8.0.1$^{2,9}$.1$^{4,7}$.1$^{11,18}$.1$^{13,16}$.0$^{3,8}$.0$^{12,17}$]-5-dococene, 14-methyl-octacyclo[8.8.0.1$^{2,9}$.1$^{4,7}$.1$^{11,18}$.1$^{13,16}$.0$^{3,8}$.0$^{12,17}$]-5-dococene, and 14-ethyl-octacyclo[8.8.0.1$^{2,9}$.1$^{4,7}$.1$^{11,18}$.1$^{13,16}$.0$^{3,8}$.0$^{12,17}$]-5-dococene, and the substituent in $R^{16}$ to $R^{19}$ is selected from hydrogen, an alkyl group having 1 to 20 carbon atoms, halogen, a halogenated alkyl group having 1 to 20 carbon atoms, an alkoxy group having 1 to 20 carbon atoms, an alkoxyalkyl group having 2 to 20 carbon atoms, an alkoxycarbonyl group having 2 to 20 carbon atoms, an aryloxycarbonyl group having 6 to 20 carbon atoms, a hydroxy group, a hydroxyalkyl group having 1 to 20 carbon atoms, an acid anhydride, and a cyano group. Further, $X^2$ is selected from —O—, —S—, —NR$^{20}$—, —PR$^{20}$—, and —CR$^{20}_2$—

(wherein $R^{20}$ represents hydrogen, or an alkyl group having 1 to 20 carbon atoms), and $X^2$ may be different from or the same as each other.

$R^{16}$ to $R^{19}$ may be bonded to each other to form a cyclic structure. Examples of the cyclic alkyl structure capable of forming a cyclohexyl ring include 1,4,4a,5,6,7,8,8a-octahydro-1,4-methanonaphthalene; examples of the cyclic ester structure capable of forming a lactone ring include 4-oxatricyclo[5.2.1.0$^{2,6}$]-8-decene-3-one and 4,10-dioxa-tricyclo [5.2.1.0$^{2,6}$]-8-decene-3-one; examples of the cyclic imide structures capable of forming a phenylmaleimide ring include 4-cyclohexyl-4-aza-tricyclo[5.2.1.0$^{2,6}$]-8-decene-3,5-dione and 4-cyclohexyl-4-aza-10-oxa-tricyclo[5.2.1.0$^{2,6}$]-8-decene-3,5-dione; and examples of the acid anhydride structure capable of forming a carboxylic acid anhydride include cyclic olefin monomers include 4-oxa-tricyclo[5.2.1.0$^{2,6}$]-8-decene-3,5-dione or 4,10-dioxa-tricyclo[5.2.1.0$^{2,6}$]-8-decene-3,5-dione, and 4-oxa-10-thia-tricyclo[5.2.1.0$^{2,6}$]-8-decene-3,5-dione.

In the present invention, the ring-opening metathesis polymer may be formed by polymerization of cycloolefins such as dicyclopentadiene, cyclopropene, cyclobutene, cyclopentene, cyclooctene, cyclooctadiene and cyclooctatriene, in addition to at least one kind of a cyclic olefin monomer represented by General Formula [3], or at least two kinds of the cyclic olefin monomers represented by General Formula [3] and General Formula [4]. The content of the additional structural units is preferably 50 mol % or less, based on the total amount of the structural units [A] and [B].

Furthermore, the ring-opening metathesis polymerization catalyst that is used for the preparation of the ring-opening metathesis polymer of the present invention is not limited as long as it causes ring-opening metathesis polymerization, but examples of the catalyst include a tungsten-based alkylidene catalyst such as W(N-2,6-Pr$^i_2$C$_6$H$_3$)(CHBu$^t$)(OBu$^t$)$_2$, W(N-2,6-Pr$^i_2$C$_6$H$_3$)(CHBu$^t$)(OCMe$_2$CF$_3$)$_2$, W(N-2,6-Pr$^i_2$C$_6$H$_3$)(CHBu$^t$)(OCMe$_2$ (CF$_3$)$_2$)$_2$, W(N-2,6-Pr$^i_2$C$_6$H$_3$)(CHCMe$_2$Ph)(OBu$^t$)$_2$, W(N-2,6-Pr$^i_2$C$_6$H$_3$)(CHCMe$_2$Ph)(OCMe$_2$CF$_3$)$_2$, W(N-2,6-Pr$^i_2$C$_6$H$_3$)(CHCMe$_2$Ph)(OCMe$_2$(CF$_3$)$_2$)$_2$, W(N-2,6-Pr$^i_2$C$_6$H$_3$)(CHCMe$_2$Ph)(OC(CF$_3$)$_3$)$_2$, and W(N-2,6-Me$_2$C$_6$H$_3$)(CHCMe$_2$Ph)(OC(CF$_3$)$_3$)$_2$ (wherein Pr$^i$ represents an iso-propyl group, Bu$^t$ represents a tert-butyl group, Me represents a methyl group, and Ph represents a phenyl group); a tungsten-based alkylidene catalyst such as W(N-2,6-Me$_2$C$_6$H$_3$)(CHCHCMePh)(OBu$^t$)$_2$(PMe$_3$), W(N-2,6-Me$_2$C$_6$H$_3$)(CHCHCMe$_2$)(OBu$^t$)$_2$(PMe$_3$), W(N-2,6-Me$_2$C$_6$H$_3$)(CHCHCPh$_2$)(OBu$^t$)$_2$(PMe$_3$), W(N-2,6-Me$_2$C$_6$H$_3$)(CHCHCMePh)(OCMe$_2$(CF$_3$))$_2$(PMe$_3$), W(N-2,6-Me$_2$C$_6$H$_3$)(CHCHCMe$_2$)(OCMe$_2$(CF$_3$))$_2$(PMe$_3$), W(N-2,6-Me$_2$C$_6$H$_3$)(CHCHCPh$_2$)(OCMe$_2$(CF$_3$))$_2$(PMe$_3$), W(N-2,6-Me$_2$C$_6$H$_3$)(CHCHCMe$_2$)(OCMe(CF$_3$)$_2$)$_2$(PMe$_3$), W(N-2,6-Me$_2$C$_6$H$_3$)(CHCHCMe$_2$)(OCMe(CF$_3$)$_2$)$_2$(PMe$_3$), W(N-2,6-Me$_2$C$_6$H$_3$)(CHCHCPh$_2$)(OCMe(CF$_3$)$_2$)$_2$(PMe$_3$), W(N-2,6-Pr$^i_2$C$_6$H$_3$)(CHCHCMePh)(OCMe$_2$(CF$_3$))$_2$(PMe$_3$), W(N-2,6-Pr$^i_2$C$_6$H$_3$)(CHCHCMePh)(OCMe(CF$_3$)$_2$)$_2$(PMe$_3$), and W(N-2,6-Pr$^i_2$C$_6$H$_3$)(CHCHCMePh)(OPh)$_2$(PMe$_3$) (wherein Pr$^i$ represents an iso-propyl group, Bu$^t$ represents a tert-butyl group, Me represents a methyl group, and Ph represents a phenyl group); a molybdenum-based alkylidene catalyst such as Mo(N-2,6-Pr$^i_2$C$_6$H$_3$)(CHBu$^t$)(OBu$^t$)$_2$, Mo(N-2,6-Pr$^i_2$C$_6$H$_3$)(CHBu$^t$)(OCMe$_2$CF$_3$)$_2$, Mo(N-2,6-Pr$^i_2$C$_6$H$_3$)(CHBu$^t$)(OCMe(CF$_3$)$_2$)$_2$, Mo(N-2,6-Pr$^i_2$C$_6$H$_3$)(CHCMe$_2$Ph)(OBu$^t$)$_2$, Mo(N-2,6-Pr$^i_2$C$_6$H$_3$)(CHCMe$_2$Ph)(OCMe$_2$CF$_3$)$_2$, Mo(N-2,6-Pr$^i_2$C$_6$H$_3$)(CHCMe$_2$Ph)(OCMe(CF$_3$)$_2$)$_2$, Mo(N-2,6-Pr$^i_2$C$_6$H$_3$)(CHCMe$_2$Ph)(OC(CF$_3$)$_3$)$_2$, and Mo(N-2,6-Me$_2$C$_6$H$_3$)(CHCMe$_2$Ph)(OC(CF$_3$)$_3$)$_2$ (wherein Pr$^i$ represents an iso-propyl group, Bu$^t$ represents a tert-butyl group, Me represents a methyl group, and Ph represents a phenyl group); a rhenium-based alkylidene catalyst such as Re(CBu$^t$)(CHBu$^t$)(O-2,6-Pr$^i_2$C$_6$H$_3$)$_2$, Re(CBu$^t$)(CHBu$^t$)(O-2-Bu$^t$C$_6$H$_4$)$_2$, Re(CBu$^t$)(CHBu$^t$)(OCMe$_2$CF$_3$)$_2$, Re(CBu$^t$)(CHBu$^t$)(OCMe(CF$_3$)$_2$)$_2$, and Re(CBu$^t$)(CHBu$^t$)(O-2,6-Me$_2$C$_6$H$_3$)$_2$ (wherein Bu$^t$ represents a tert-butyl group); a tantalum-based alkylidene catalyst such as Ta[C(Me)C(Me)CHMe$_3$](O-2,6-Pr$^i_2$C$_6$H$_3$)$_3$Py, and Ta[C(Ph)C(Ph)CHMe$_3$](O-2,6-Pr$^i_2$C$_6$H$_3$)$_3$Py (wherein Me represents a methyl group, Ph represents a phenyl group, and Py represents a pyridine group); a ruthenium-based alkylidene catalyst such as Ru (CHCHCPh$_2$)(PPh$_3$)$_2$Cl$_2$, Ru (CHCHCPh$_2$)(P(C$_6$H$_{11}$)$_3$)$_2$Cl$_2$ (wherein Ph represents a phenyl group); and titanacyclobutane catalyst. The above-mentioned ring-opening metathesis catalyst may be used alone or in combination of two or more kinds thereof.

Specific examples of the organic transition metal halogen complex include catalysts obtained by combining a tungsten-based halogen complex such as W(N-2,6-Pr$^i_2$C$_6$H$_3$)(thf)(OBu$^t$)$_2$Cl$_2$, W(N-2,6-Pr$^i_2$C$_6$H$_3$)(thf)(OCMe$_2$CF$_3$)$_2$Cl$_2$, W(N-2,6-Pr$^i_2$C$_6$H$_3$)(thf)(OCMe$_2$ (CF$_3$)$_2$)$_2$Cl$_2$, W(N-2,6-Pr$^i_2$C$_6$H$_3$)(thf)(OBu$^t$)$_2$Cl$_2$, W(N-2,6-Pr$^i_2$C$_6$H$_3$)(thf)(OCMe$_2$CF$_3$)$_2$Cl$_2$, and W(N-2,6-Pr$^i_2$C$_6$H$_3$)(thf)(OCMe$_2$(CF$_3$)$_2$)$_2$Cl$_2$ (wherein Pr$^i$ represents an iso-propyl group, Bu$^t$ represents a tert-butyl group, Me represents a methyl group, Ph represents a phenyl group, and thf represents a tetrahydrofuran) with an organometallic compound as described below, and catalysts obtained by combining a molybdenum-based halogen complex such as Mo(N-2,6-Pr$^i_2$C$_6$H$_3$)(thf)(OBu$^t$)$_2$Cl$_2$, Mo(N-2,6-Pr$^i_2$C$_6$H$_3$)(thf)(OCMe$_2$CF$_3$)$_2$Cl$_2$, Mo(N-2,6-Pr$^i_2$C$_6$H$_3$)(thf)(OCMe (CF$_3$)$_2$)$_2$Cl$_2$, Mo(N-2,6-Pr$^i_2$C$_6$H$_3$)(thf)(OBu$^t$)$_2$Cl$_2$, Mo(N-2,6-Pr$^i_2$C$_6$H$_3$)(thf)(OCMe$_2$CF$_3$)$_2$Cl$_2$, Mo(N-2,6-Pr$^i_2$C$_6$H$_3$)(thf)(OCMe (CF$_3$)$_2$)$_2$Cl$_2$, (wherein Pr$^i$ represents an iso-propyl group, Bu$^t$ represents a tert-butyl group, Me represents a methyl group, Ph represents a phenyl group, and thf represents a tetrahydrofuran) with an organometallic compound as described below. Moreover, examples of the inorganic transition metal halogen catalyst include a catalyst obtained by combining an inorganic transition metal halogen compound such as MoCl$_6$, WCl$_6$, ReCl$_5$, TiCl$_4$, RuCl$_3$, and IrCl$_3$ with an organometallic compound as described below, and the inorganic transition metal halogen catalyst may be used in the presence of an electron-donating compound such as an amine compound, an ester compound, and an ether compound.

Specific examples of the organometallic compound to be combined with the above-mentioned catalysts include an organoaluminum compound such as trimethylaluminum, triethylaluminum, triisobutylaluminum, trihexylaluminum, trioctylaluminum, triphenylaluminum, tribenzylaluminum, diethylaluminum monochloride, di-n-butylaluminum, diethylaluminum monobromide, diethylaluminum monoiodide, diethylaluminum monohydride, ethylaluminum sesquichloride, and ethylaluminum dichloride, an organotin compound such as tetramethyltin, diethyldimethyltin, tetraethyltin, dibutyldiethyltin, tetrabutyltin, tetraoctyltin, trioctyltin fluoride, trioctyltin chloride, trioctyltin bromide, trioctyltin iodide, dibutyltin difluoride, dibutyltin dichloride, dibutyltin dibromide, dibutyltin diiodide, butyltin trifluoride, butyltin trichloride, butyltin tribromide, and butyltin triiodide, an organo-lithium compound such as n-butyllithium, an organosodium compound such as n-pentylsodium, an organomagnesium compound such as methylmagnesium iodide, ethylmagnesium bromide, methylmagnesium bromide, n-propylmagnesium bromide, t-butylmagnesium chloride, and allyl-magnesium chloride, an organozinc compound such as diethylzinc, an organocadmium compound such as diethylcadmium, and an organoboron compound such as trimethylboron, triethylboron, and tri-n-butylboron.

Regarding the ring-opening metathesis polymerization of the present invention, the molar ratio of a cyclic olefinic monomer to the ring-opening metathesis catalyst is such that the molar ratio of the cyclic olefinic monomer, based on one mole of the transition metal alkylidene complex, is preferably from 2 to 30000, and more preferably from 10 to 20000, in a case of a transition metal alkylidene catalyst containing tungsten, molybdenum, rhenium, tantalum, and ruthenium and so on, or a titana-clobutane catalyst. In the case of a ring-opening metathesis catalyst composed of an organic transition metal halogen complex or inorganic transition metal halogen compound and an organometallic compound, the molar ratio of the cyclic olefinic monomer, based on one mole of the organic transition metal halogen complex or inorganic transition metal halogen compound is preferably from 2 to 10000, and preferably from 10 to 5000, and the molar ratio of an organometallic compound as a co-catalyst, based on one mole of an organic transition metal halogen complex, is preferably in a range of from 0.1 to 10, and more preferably in a range of from 1 to 5.

Furthermore, the ring-opening metathesis polymerization in the present invention may be effected with a solvent or without a solvent. Examples of the solvent that is particularly used include ethers such as tetrahydrofuran, diethyl ether, dibutyl ether, dimethoxyethane, and dioxane, aromatic hydrocarbons such as benzene, toluene, xylene, and ethylbenzene, aliphatic hydrocarbons such as pentane, hexane, and heptane, alicyclic hydrocarbons such as cyclopentane, cyclohexane, methylcyclohexane, dimethylcyclohexane, and decalin, and halogenated hydrocarbons such as methylene dichloride, dichloroethane, dichloroethylene, tetrachloroethane, chlorobenzene, and trichlorobenzene, and these may be used in combination of two or more kinds thereof.

Also, in the present invention, polymerization can be conducted in the presence of a chain transfer agent such as an olefin, and a diene, for the purpose of obtaining a polymer having desired molecular weights and molecular weight distributions by enhancing the catalyst efficiency or by controlling the molar ratio of the cyclic olefin monomers and the catalyst. Examples of the olefin used as a chain transfer agent include α-olefins such as ethylene, propylene, butene, pentene, hexene, and octene, and silicon-containing olefins such as vinyltrimethylsilane, allyltrimethylsilane, allyltriethylsilane, and allyltriisopropylsilane, and example of the diene include non-conjugated dienes such as 1,4-pentadiene, 1,5-hexadiene, and 1,6-heptadiene. Further, these olefins or dienes may be used alone or in combination of two or more kinds thereof.

Regarding the amount of the olefin or diene to be used that coexists in the present invention, the amount of the olefin or diene is preferably in a range of from 0.001 to 1000 mol, and more preferably in a range of from 0.01 to 100 mol, based on one mole of the cyclic olefinic monomers. Further, the amount of the olefin or diene is preferably in a range of from 0.1 to 1000 equivalents, and more preferably in a range of from 1 to 500 equivalents, based on 1 equivalent of the alkylidene in the transition metal alkylidene complex.

In the ring-opening metathesis polymerization, the concentrations of the monomers/the ring-opening metathesis catalyst and the solvent are each preferably in a range of from 0.1 to 100 mol/L, although it varies depending on the reactivity and the solubility of the cyclic olefin monomers in a polymerization solvent, and the reaction is usually effected at a temperature in a range of from −30 to 150° C. for 1 minute to 10 hours. Thereafter, the reaction can be terminated with a de-activating agent including aldehydes such as butyraldehyde, ketones such as acetone, and alcohols such as methanol to obtain a ring-opening metathesis polymer solution.

The weight average molecular weight (Mw) of the ring-opening metathesis polymer in the present invention in terms of polystyrene, as determined by Gel Permeation Chromatography (GPC), is preferably in a range of from 2,000 to 1,000,000, and more preferably in a range of from 5,000 to 300,000. With this range, the physical properties of the polymer are exhibited well, and the flowability upon thin film formation or injection molding is improved.

Furthermore, the molecular weight distribution (Mw/Mn), which is a ratio of the weight average molecular weight (Mw) to the number average molecular weight (Mn), is preferably in a range of from 1.0 to 5.0, more preferably in a range of from 1.4 to 5.0, and most preferably in a range of from 1.5 to 3.0. From a viewpoint of attaining formation of a film having a uniform thickness or good injection moldability, a wide molecular weight distribution is desirable.

In the present invention, the ring-opening metathesis polymer comprising the repeating structural units [A] represented by General Formula [1] having a substituent comprising an organic acid residue and the repeating structural units [B] represented by General Formula [2] at a constitutional molar ratio [A]/[B] of 0.1/99.9 to 100/0 can have a relationship with a constitutional molar ratio [C]/[D] of the cyclic olefin monomers, which satisfies [A]≦[C], and [A]/[B]≦[C]/[D].

In addition, for the repeating structural units [A] having a substituent comprising an organic acid residue which is converted from a substituent including an acid- or alkali-decomposable group of the cyclic olefin monomer [C] represented by General Formula [3], a part or whole of the substituents including the acid- or alkali-decomposable group derived from the cyclic olefin monomer [C] can be subjected to hydrolysis or acid elimination to convert to the repeating structural units [A] having a substituent comprising an organic acid residue.

For hydrolysis or acid elimination of the substituent including an acid- or alkali-decomposable group, any one of acidic hydrolysis or acid elimination conducted in the presence of an acidic catalyst such as sulfuric acid, hydrochloric acid, nitric acid, toluenesulfonic acid, trifluoroacetic acid, and acetic acid, alkaline hydrolysis conducted in the presence of an alkaline catalyst such as sodium hydroxide, potassium hydroxide, and barium hydroxide, and neutral hydrolysis using sodium acetate, lithium iodide and the like instead of the acidic or alkaline catalyst may be used.

The hydrolysis or acid elimination reaction in the present invention may use an aqueous solvent or an organic solvent, and particularly, examples of the organic solvent to be used include alcohols such as methanol and ethanol, ketones such as acetone, ethers such as tetrahydrofuran, diethyl ether, dibutyl ether, dimethoxyethane, and dioxane, aromatic hydrocarbons such as benzene, toluene, xylene, and ethylbenzene, aliphatic hydrocarbons such as pentane, hexane, heptane, and cyclohexane, carboxylic acids such as acetic acid, nitro compounds such as nitromethane, pyridines such as pyridine and lutidine, and formamides such as dimethylformamide, and they may be mixed with water or an alcohol, or the organic solvent may be used alone. Further, two or more kinds thereof may be used in combination. Also, the reaction temperature is usually in a range of from 0 to 300° C., and preferably in a range of from room temperature to 250° C.

Further, after the hydrolysis or acid elimination reaction, neutralization treatment may be effected appropriately with an alkali or an acid. The method of recovering a polymer from a solution or slurry of a ring-opening metathesis polymer, after the hydrolysis or acid elimination reaction, is not particularly limited, and known methods can be used. For example, in the case of a solution, a method in which a reaction solution is discharged into a poor solvent under stirring to precipitate a hydrogenated product of a polymer forming a slurry, and the polymer is recovered by a filtration method, centrifugal separation method, a decantation method, and the like, a steam stripping method in which steam is blown into a reaction solution to precipitate a polymer, a method of directly removing a solvent from a reaction solution by heating, and the like may be mentioned, and in the case of a slurry, a method of recovering a polymer from a slurry itself by a filtration method, a centrifugal separation method, a decantation method, and the like, and other recovering methods may be mentioned.

[Method for Preparing Hydrogenated Product of Ring-Opening Metathesis Polymer]

The hydrogenated product of the ring-opening metathesis polymer of the present invention can be obtained by adding hydrogen at a ratio of preferably 50 to 100%, and more preferably 80 to 100% to the double bonds in the main chain of the ring-opening metathesis polymer in the presence of a catalyst capable of hydrogenation.

Regarding this hydrogenated product, the light transmission for a light at a wavelength in a UV ray region can be controlled by adding hydrogen to the double bonds in the main chain of the ring-opening metathesis polymer mentioned in above (1), to saturated bonds at any ratio. Moreover, the refractive index can also be controlled by increasing or decreasing the amount of the double bonds. Further, the stability against oxidation is increased by hydrogenation, and the hydrogenated product of the ring-opening metathesis polymer can be more easily used by decreasing the double bonds in the main chain according to the applications.

Moreover, the amount of the hydrogen to be added affects the mechanical strength or the impact resistance of the polymer, and accordingly, if the amount is high, the flexibility or the impact strength can be increased. Such the ratio of hydrogenation, that is, the hydrogenation rate of the double bonds in the main chain can be arbitrarily determined according to the balance among the physical properties of a polymer, such as light transmission, heat resistance, weather resistance, mechanical strength, and impact property.

The weight average molecular weight (Mw) of the hydrogenated product of the ring-opening metathesis polymer in the present invention, in terms of polystyrene, as determined by Gel Permeation Chromatography (GPC), is preferably in a range of from 2,000 to 1,000,000, and more preferably in a range of from 5,000 to 300,000. With this range, the physical properties of the polymer are exhibited well, and the flowability upon thin film formation or injection molding is improved.

Furthermore, the molecular weight distribution (Mw/Mn), which is a ratio of the weight average molecular weight (Mw) to the number average molecular weight (Mn), is preferably in a range of from 1.0 to 5.0, more preferably in a range of from 1.4 to 5.0, and most preferably in a range of from 1.5 to 3.0. From a viewpoint of attaining formation of a film having a uniform thickness or good injection moldability, a wide molecular weight distribution is desirable.

For the hydrogenation reaction of the ring-opening metathesis polymer of the present invention, a known hydrogenation catalyst can be used. Specific examples of the catalyst for hydrogenating the double bonds in the main chain of the ring-opening metathesis polymer portion include heterogeneous catalysts, for example, a metal-supported catalyst in which a metal such as palladium, platinum, nickel, rhodium, and ruthenium is supported on a carrier such as carbon, silica, alumina, titania, magnesia, diatomaceous earth, and synthetic zeolite, or homogeneous catalysts, for examples, nickel naphthenate/triethylaluminum, nickel acetylacetonate/triisobutylaluminum, cobalt octenate/n-butyllithium, titanocenedichloride/diethylaluminummonochloride, rhodium acetate, dichlorobis(triphenylphosphine)palladium, chlorotris(triphenylphosphine)rhodium, and dihydridotetrakis(triphenylphosphine)ruthenium.

Moreover, specific examples of the homogeneous catalyst include dichlorobis(triphenylphosphine) nickel, dichlorobis(triphenylphosphine) palladium, dichlorobis(triphenylphosphine) platinum, chlorotris(triphenylphosphine) rhodium, dichlorotris(triphenylphosphine) osmium, dichlorohydridobis(triphenylphosphine) iridium, dichlorotris(triphenylphosphine)ruthenium, dichlorotetrakis(triphenylphosphine)ruthenium, trichloronitrosylbis(triphenylphosphine) ruthenium, dichlorobis(acetonitrile) bis(triphenylphosphine) ruthenium, dichlorobis(tetrahydrofuran) bis(triphenylphosphine)ruthenium, chlorohydrido(toluene)tris(triphenylphosphine)ruthenium, chlorohydridocarbonyltris(triphenylphosphine)ruthenium, chlorohydridocarbonyltris(diethyl phenylphosphine)ruthenium, chlorohydridonitrosyltris(triphenylphosphine)ruthenium, dichlorotris(trimethylphosphine)ruthenium, dichlorotris(triethylphosphine)ruthenium, dichlorotris(tricyclohexylphosphine)ruthenium, dichlorotris(triphenylphosphine)ruthenium, dichlorotris(trimethyl diphenylphosphine)ruthenium, dichlorotris(tridimethyl phenylphosphine)ruthenium, dichlorotris(trio-tolylphosphine)ruthenium, dichlorotris(dichloroethylphosphine)ruthenium, dichlorotris(dichlorophenylphosphine)ruthenium, dichlorotris(trimethylphosphite)ruthenium, and dichlorotris(triphenylphosphite) ruthenium.

Further, these homogeneous catalysts and amine compounds may be used in combination, and specific examples of the amine compounds include a primary amine compound such as methylamine, ethylamine, aniline, ethylene diamine, and 1,3-diaminocyclobutane; a secondary amine compound such as dimethylamine, methylisopropylamine, and N-methylaniline; and a tertiary amine compound such as trimethylamine, triethylamine, triphenylamine, N,N-dimethylaniline, pyridine and γ-picoline, and the tertiary amine compound is preferably used. When a triethylamine is particularly used, the hydrogenation rate is remarkably increased. Further, these homogeneous catalysts or amine compounds can be alone or in combination of two or more kinds thereof at arbitrary ratios.

If the above-mentioned, a known catalyst is used for hydrogenation of the ring-opening metathesis polymer in the present invention, the amounts of the ring-opening metathesis polymer and the hydrogenation catalyst to be each used is such that the ratio of the known hydrogenation catalyst to the ring-opening metathesis polymer is in the range of 5 to 50000 ppm, and preferably in the range of 100 to 1000 ppm. Also, if a hydrogenation catalyst consisting of a homogeneous catalyst and an amine compound is used, the ratio of the homogeneous catalyst to the ring-opening metathesis polymer is in the range of 5 to 50000 ppm, preferably 10 to 10000 ppm, and particularly preferably in the range of 50 to 1000 ppm. Further, the ratio of the amine compound based on one equivalent of the homogeneous catalyst to be used is in a range of from 0.1 equivalent to 1000 equivalents, preferably in the range of 0.5 equivalent to 500 equivalents, and particularly preferably in the range of 1 to 100 equivalents.

As a hydrogenation catalyst consisting of a homogeneous catalyst and an amine compound, the homogeneous catalyst and the amine compound are brought into contact in advance, and the resulting catalyst may be used. However, it is also possible to directly add the homogeneous catalyst and the amine compound into a reaction system without bringing them into contact in advance.

Any type of solvent may be used as a solvent used in the hydrogenation reaction of the ring-opening metathesis polymer if the solvent itself can dissolve the polymer and can not be hydrogenated, and examples of the solvent include ethers such as tetrahydrofuran, diethyl ether, dibutyl ether, and dimethoxyethane, aromatic hydrocarbons such as benzene, toluene, xylene, and ethylbenzene, aliphatic hydrocarbons such as pentane, hexane, and heptane, aliphatic cyclic hydrocarbons such as cyclopentane, cyclohexane, methylcyclohexane, dimethylcyclohexane, and decalin, and halogenated hydrocarbons such as methylene dichloride, dichloroethane, dichloroethylene, tetrachloroethane, chlorobenzene, and trichlorobenzene. These solvents may be used in combination of two or more kinds thereof.

The hydrogenation reaction of the ring-opening metathesis polymer is usually carried out at a pressure in a range of from ambient pressure to 30 MPa, preferably in a range of from 0.5 to 20 MPa, and particularly preferably in a range of from 2 to 15 MPa, and the reaction temperature is usually in a range of from 0 to 300° C., preferably in a range of from room temperature to 250° C., and particularly preferably in a range of from 50 to 200° C. Further, according to desired hydrogenation rates, the condition or the reaction time can be set up.

In the present invention, regarding the hydrogenated product of the ring-opening metathesis polymer comprising the repeating structural units [A] represented by General Formula [1] having a substituent comprising an organic acid residue and the repeating structural units [B] represented by General Formula [2] at a constitutional molar ratio [A]/[B] of 0.1/99.9 to 100/0, a part or whole of a substituent comprising an acid- or alkali-decomposable group of the cyclic olefin monomer [C] in the ring-opening metathesis polymer is subjected to hydrolysis or acid elimination to convert to the repeating structural units [A] having a substituent comprising an organic acid residue, and then subjected to the hydrogenation reaction, or may be subjected to the hydrogenation, and then converted to the repeating structural units [A].

Moreover, in the case where the ring-opening metathesis polymer is subjected to hydrogenation and then to hydrolysis or acid elimination, for the hydrolysis or acid elimination of the substituent including an acid- or alkali-decomposable group, any one of acidic hydrolysis conducted in the presence of an acidic catalyst such as sulfuric acid, hydrochloric acid, nitric acid, toluenesulfonic acid, trifluoroacetic acid, and acetic acid, alkaline hydrolysis conducted in the presence of an alkaline catalyst such as sodium hydroxide, potassium hydroxide, and barium hydroxide, and neutral hydrolysis using sodium acetate, lithium iodide and the like instead of the acidic or alkaline catalyst may be used.

In the hydrolysis or acid elimination reaction in this case an aqueous solvent or an organic solvent may be used, and particularly, examples of the organic solvent to be used include alcohols such as methanol and ethanol, ketones such as acetone, ethers such as tetrahydrofuran, diethyl ether, dibutyl ether, dimethoxyethane, and dioxane, aromatic hydrocarbons such as benzene, toluene, xylene, and ethylbenzene, aliphatic hydrocarbons such as pentane, hexane, heptane, and cyclohexane, carboxylic acids such as acetic acid, nitro compounds such as nitromethane, pyridines such as pyridine and lutidine, and formamides such as dimethylformamide, and they may be mixed with water or an alcohol, or the organic solvent may be used alone. Further, two or more kinds thereof may be used in combination.

After the completion of the hydrogenation reaction of the ring-opening metathesis polymer, a ring-opening metathesis catalyst or a hydrogenation catalyst remaining in a polymer can be removed by a known method. For example, examples of the method include filtration, an adsorption method using an adsorbing agent, a method in which an organic acid such as lactic acid and the like, a poor solvent, and water are added to a solution containing a good solvent and this system is removed by extraction at normal temperature or warming, a method in which a solution containing a good solvent or a polymer slurry is subjected to a contact treatment with a basic compound and an acidic compound, and then removed by washing.

Furthermore, a method of recovering a hydrogenated polymer from a solution of the hydrogenated ring-opening metathesis polymer is not particularly limited, and a known method can be employed. For example, examples of the method include a method in which a reaction solution is discharged into a poor solvent under stirring to coagulate a hydrogenated polymer, and then recovering by filtration, a centrifugal separation method, or a decantation method and the like; a steam stripping method in which steam is blown into a reaction solution to precipitate a hydrogenated polymer, and a method of directly removing a solvent from a reaction solution by heating, and the like.

[Material for Optical Components]

As used in the present invention, the material for an optical component refers to a material used in the applications for transmission of a light such as a visible light, an infrared light, an ultraviolet light, an X-ray, and laser, and includes a film-shaped article and a molded product for optical applications.

The ring-opening metathesis polymer and a hydrogenated product thereof of the present invention are excellent in transparency and optical characteristics, and further the repeating structural units [A] represented by General Formula [1] having a substituent comprising an organic acid residue is incorporated in the structure, thereby forming an intermolecular network by the hydrogen bonds between the molecules, as mediated by the acidic proton. By this, the mobility of the polymer is limited, and a glass transition temperature is high and the heat resistance characteristics are improved at a used temperature of the material for an optical component, and on the other hand, thermoplasticity such as suitable flowability is exhibited at a temperature for a molding process such as injection molding or melt extrusion molding. Thus, the ring-opening metathesis polymer can be suitably used as a material for an optical component by controlling the above-mentioned characteristics according to the content of the repeating structural units [A].

Regarding the uses of the material for an optical component comprising the ring-opening metathesis polymer and/or a hydrogenated product thereof of the present invention, they can be used, for example, in various film applications, and they are specifically used, but not particularly limited, as a member of optical devices such as a liquid crystal display, an organic EL element, a plasma display, and a projector. Specifically, examples of their uses include an IR cut filter, a retardation film, a polarizer protective film, a film for a liquid crystal cell substrate, a liquid crystal display element substrate, a touch panel substrate, and a raw material film thereof. These films may be further used after employing lamination of an anti-reflection film, an optical multilayer film, an anti-glare film, a hard coat layer, an anti-fouling layer, a transparent conductive film, and the like, by means of a dry method or a wet method.

Furthermore, the molded product can be suitably employed, for example, in various applications including optical communication materials such as an optical fiber, an optical waveguide, and an optical switch, recording materials such as an optical recording disk, and display substrates such as a liquid crystal display, a plasma display, a digital paper, an organic EL, an inorganic EL, and a rear projector, and in addition, the molded product can be used, for example, for molding materials including a lens such as an optical pick-up lens, a fθ lens for a laser beam printer, an eyeglass lens, a camera lens, a video camera lens, and a lamp lens; a disk such as a video disk, an audio disk, and a re-writable disk for computer; and a plastic optical fiber (POF), an optical connector, a light guide, and the like.

Regarding the forms of these materials for optical components, the materials can be used as a solution obtained by dissolving the ring-opening metathesis polymer and/or a hydrogenated product thereof of the present invention in a solvent, or as a powder of a polymer and/or a hydrogenated product thereof obtained by discharging them into a poor solvent or the like, and then drying them. Further, the powders of the polymer and/or a hydrogenated product thereof is/are fed to an extruder, with various stabilizers, or a solution of the ring-opening metathesis polymer and/or a hydrogenated product thereof is/are fed to an extruder, or the like via a solvent degassing tank to obtain a pelletized pellet for use, and regardless of the forms, the film or the molded product can be processed.

As a pelletizing method, conventional methods can be exemplified, but examples of the method include a method in which a ring-opening metathesis polymer and/or a hydrogenated product thereof is/are uniformly melt-mixed, and passed through an extruder for a hot cut or a strand cut to obtain a spherical, cylindrical, or lens-like pellets. In this case, the cutting may be carried out in water or in a stream of air and so on. Further, the ring-opening metathesis polymer and/or a hydrogenated product thereof is/are melt-mixed, and then molded on a roll to a sheet, and a sheet pelletizing machine can be used for this to obtain a cube-shaped pellet.

Also, the material for an optical component of the present invention can be blended with dispersing agents or lubricants such as fatty acid, a fatty acid metal salt, a fatty acid ester, and a fatty acid amide, a plasticizer such as a phthalic acid ester, an epoxy ester, and a polyester, and further, additives such as an ultraviolet ray absorber, an antioxidant, a flame retardant, an antistatic agent, a light stabilizer, a heat stabilizer, and a colorant, in addition to the ring-opening metathesis polymer and a hydrogenated product thereof.

Moreover, for the material for an optical component of the present invention, the ring-opening metathesis polymerization and/or a hydrogenated product thereof can be incorporated, if necessary, with a crosslinking agent; be subjected to melt-heating at a high temperature, mixing-contact in a solution, or exposure to an ultraviolet light at a specific wavelength; and be subjected to a crosslinking reaction with a carboxylic acid or an organic acid into a crosslinked resin, to obtain an optical film material or a molded product, which has improved heat resistance, chemical resistance, water resistance, mechanical characteristics, and the like.

Examples of the crosslinking agent include an epoxy compound, an isocyanate group-containing compound, an amino group-containing compound, and a Lewis acid. These crosslinking agents can be used alone or in combination of two or more kinds thereof. Among these, the epoxy compound and the isocyanate group-containing compound are preferably used, and the epoxy compound is particularly preferably used.

Examples of the epoxy compound include a compound having two or more epoxy groups in the molecule, for example, a glycidyl ether-type epoxy compound such as a phenol novolak-type epoxy compound, a cresol novolak-type epoxy compound, a cresol-type epoxy compound, a bisphenol A-type epoxy compound, a bisphenol F-type epoxy compound, a brominated bisphenol A-type epoxy compound, a brominated bisphenol F-type epoxy compound, and a hydrogenated bisphenol A-type epoxy compound; and a multi-valent epoxy compound such as an alicyclic epoxy compound, a glycidyl ester-type epoxy compound, a glycidyl amine-type epoxy compound, and an isocyanurate-type epoxy compound.

Examples of the isocyanate group-containing compound include a compound having two or more isocyanate groups in the molecule, for example, p-phenylene diisocyanate, 2,6-toluene diisocyanate, and hexamethylene diisocyanate.

Examples of the Lewis acid include silicon tetrachloride, hydrochloric acid, sulfuric acid, ferric chloride, aluminum chloride, stannic chloride, and titanium tetrachloride.

Examples of the amino group-containing compound include compounds having two or more amino groups in the molecule, for example, aliphatic diamines such as trimethyl-hexamethylene diamine, ethylene diamine, and 1,4-diaminobutane; aliphatic amines such as triethylenetetramine, pentaethylenehexamine, and aminoethyl ethanolamine; and aromatic amines such as phenylene diamine, 4,4'-methylenedianiline, toluene diamine, and diaminoditolylsulfone.

The amount of the crosslinking agent to be used is not particularly limited, and it can be suitably adjusted according to the kind of the crosslinking agent to be used. For example, if an epoxy compound is used as the crosslinking agent, its amount is usually from 1 to 100 parts by weight, and preferably from 5 to 50 parts by weight based on 100 parts by weight of ring-opening metathesis polymer or a hydrogenated product thereof. If the amount of the crosslinking agent to be added is small, the crosslinking is not sufficient, and as a result, a crosslinking resin having a high crosslinking density cannot be obtained. If the amount to be used is too high, the crosslinking effect is saturated, and as a result, a crosslinking resin having desired physical properties cannot be obtained.

If the solution of the metathesis polymer or a hydrogenated product solution comprising a crosslinking agent is applied, a method for applying it onto the surface of a support is not particularly limited, but examples of the method include known coating methods such as a spin coat method, a spray coat method, a dip coat method, a roll coat method, a curtain coat method, a die coat method, and a slit coat method.

Examples of the method for heating the ring-opening metathesis polymer or a hydrogenated product solution including a crosslinking agent to a predetermined temperature is not particularly limited, and examples of the method comprise a method of loading and heating a support on a heating plate, a method of heating under pressurizing (heat press) using a press machine, a method of pressing with a heated roller, and a method of using a heating furnace.

The temperature for crosslinking is usually from 150 to 250° C., and preferably from 160 to 220° C. Further, the crosslinking time is not particularly limited, but it is usually from several minutes to several hours.

Examples of the crosslinking method are not particularly limited as long as a resin is melt-crosslinked. In a case where the resin is a sheet-like or film-like molded product, the molded product is preferably processed with a method including stacking and heat pressing, if desired. The pressure for heat pressing is usually from 0.5 to 20 MPa, and preferably from 3 to 10 MPa. For the heat pressing method, for example, known press machines having a press frame form for plate molding, or press molding machines such as a sheet molding compound (SMC), and a bulk molding compound (BMC), or other types of ones can be used for carrying out the process, thereby giving high productivity.

Furthermore, in a case of carrying out the crosslinking by a ultraviolet light at a specific wavelength, a chemical lamp, a low-pressure mercury lamp, a medium-pressure mercury lamp, a high-pressure mercury lamp, a ultrahigh-pressure mercury lamp, a xenone lamp, a metal halide lamp, or the like is used to radiate an ultraviolet ray for carrying out the crosslinking. The radiation time is not particularly limited, but it is usually from several seconds to several minutes.

The material for an optical component comprising the ring-opening metathesis polymerization or a hydrogenated product thereof of the present invention can also have improved heat resistance, chemical resistance, water resistance, or mechanical characteristics by carrying out the crosslinking.

[Film]

The film of the present invention can be used in various applications, which is not particularly limited in its uses. However, the film can be suitably used, for example, as an anti-reflection film, an optical multilayer film, and a liquid crystal substrate. Specifically, the anti-reflection film is a film having a function to inhibit light reflection on a surface of the film, and examples of the method for inhibiting light reflection include a method of forming unevenness on a surface of the film to exhibit light scattering and anti-glare effects, and a method of using an interference effect of a light with a reflected wave. The anti-reflection film using the latter effect is composed of a transparent substrate with a high refractive index and a thin film with a low refractive index.

In the anti-reflection film comprising the ring-opening metathesis polymer and/or a hydrogenated product thereof of the present invention, the thin film with a high refractive index may be disposed on one or both sides, or an intermediate portion, of the transparent substrate. Further, as a method for producing a coating film with a low refractive index disposed on a substrate with a high refractive index, a method of preparing a solution obtained by dissolving a material with a low refractive index such as a fluorine-containing polymer in a solvent, uniformly applying the solution on a substrate with a high refractive index, and then drying, a method of applying a material having high refractive index of the present invention on a substrate with a low refractive index, and then drying, or a melt-molding method such as extrusion molding can be used to obtain a film. The method for uniformly applying a solution on a transparent substrate is not particularly limited, but examples of the method include a spin coat method, a dip coat method, a die coat method, a spray coat method, a bar coat method, a roll coat method, and a curtain flow coat method.

Within a range not impairing the effect of the present invention, a resin with a high refractive index and a resin with a low refractive index, each comprising the ring-opening metathesis polymer and/or a hydrogenated product thereof of the present invention, can be mixed to be used, combined together, or laminated.

The ring-opening metathesis polymer and a hydrogenated product thereof of the present invention preferably have a light transmittance in a visible light region of 80% or more.

In the optical characteristics, if there is a high content of the double bonds in the main chain, which absorb the light at a specific wavelength, particularly a light at a wavelength in a UV ray region, light transmission at a specific wavelength is lowered, thereby impairing the optical characteristics. This light transmission can be controlled to a desired transmittance, by hydrogenating the double bonds in the main chain of the ring-opening metathesis polymer of General Formula [1] to saturated bonds. Moreover, if the amount of the double bonds is high, the refractive index is increased, whereas if the content of the saturated bonds is increased by hydrogenation, the refractive index can be lowered. Accordingly, by increasing or decreasing the hydrogenation rate, the refractive index can be arbitrarily adjusted.

Furthermore, if the ring-opening metathesis polymer and a hydrogenated product thereof in the present invention have a refractive index for a light at a D-ray wavelength of preferably 1.48 or more, and more preferably 1.48 to 1.70, they can be suitably used for an anti-reflection film.

The light refractive index generally varies depending on the light wavelengths, but if it is used for a member combined with a material having a general transparency, such as a polycarbonate, a polymethacrylate, a polystyrene, and a cyclic olefin polymer, it is particularly important to evaluate a refractive index for a D-ray (wavelength 589 nm). Also, if there is small difference in the refractive indice between the ring-opening metathesis polymer of the present invention and the material having transparency, light scattering such as refraction and reflection is not caused. This light refraction can be adjusted according to the repeating structural units [B] represented by General Formula [2]. Particularly, if it is intended to increase the refractive index, it is effective to contain an aryl such as phenyl as a substituent of $R^6$ to $R^9$, and further, if $X^1$ and $X^2$ in General Formulae [1] and [2] are —S—, high refraction property can be exhibited.

In the present invention, a method for uniformly applying a polymer solution on a transparent substrate is not particularly limited, but examples of the method include a spin coat method, a dip coat method, a die coat method, a spray coat method, a bar coat method, a roll coat method, and a curtain flow coat method.

The film thickness of an anti-reflection film comprising the ring-opening metathesis polymer and/or a hydrogenated product thereof of the present invention depends on a refractive index of a polymer to be used, or on a wavelength to be used, but it is from 0.05 μm to 10 μm, and preferably from 0.05 μm to 3 μm. With this range, an excellent antireflection effect can be obtained. If the film thickness is too small, for example, reduction of a reflection rate by the interference effect with an incident light may be insufficient. On the other hand, if the film thickness is too high, for example, a wrap is generated when the thin film is dried, and thus the film may be peeled off from the transparent substrate.

Furthermore, the ring-opening metathesis polymer and a hydrogenated product thereof of the present invention preferably have a water contact angle of 105° or less. If the water contact angle is 105° or less, the interaction such as hydrogen bonds is increased with higher polarity, the cohesiveness between the surface of a molded article such as an anti-reflection film and a surface coat material on the surface of the molded article is high, and it gets harder for the coat material to be peeled off.

The adhesiveness or cohesiveness with a substrate, or the surface treatment properties of a surface coat, a coating, or the like can be effected by the intermolecular strength by the hydrogen bonds, and can be controlled by the content of the repeating structural units [A] represented by General Formula [1]. More specifically, by increasing the content of the repeating structural units [A] represented by General Formula [1], the water contact angle can be decreased.

For these characteristics, the exhibition of the functions such as the adhesiveness or cohesiveness, and surface treatment properties can be predicted by evaluation of the contact angles to water, and to control these contact angles, the content of the repeating structural units [A] can be suitably adjusted according to the applications for use, and the effects to be expected. Further, the ring-opening metathesis polymer comprising the structural units selected from at least the structural units [A] in which $X^1$ in the General Formula [1] is selected from —O—, —S—, —NR$^5$—, and —PR$^5$— (wherein R$^5$ represents hydrogen, or an alkyl group having 1 to 20 carbon atoms) and the structural units [B] in which $X^2$ in General Formula [2] is selected from —O—, —S—, —NR$^{10}$—, and —PR$^{10}$— (wherein R$^{10}$ represents hydrogen, or an alkyl group having 1 to 20 carbon atoms), and a hydrogenated product thereof can have an increased interaction such as hydrogen bonds and further decreased water contact angles.

Furthermore, the optical multilayered film comprising the ring-opening metathesis polymer and/or a hydrogenated product thereof of the present invention is a film which, as in the anti-reflection film, selectively transmits or reflects a desired light due to its structure formed by sequential lamination of a layer having high refractive index which includes a material having high refractive index and a layer having low refractive index which includes a material having low refractive index.

As a method for projection of an image, an overhead projector or a slide projector is widely used. Further, in domestic applications, a video projector or moving image film projector using liquid crystal is distributed, in which as a projection method of these projectors, a light emitted from a light source is light-modulated, for example, by a transmission-type liquid crystal panel, or the like to form an image light, and this image light is exited through an optical system such as a lens to project it on a screen. In the projector, a screen for projection is used to obtain a projected image, but the screens for projection are classified broadly into a transmission type screen in which a projection light is radiated from a backside of a screen, and a reflection type screen in which a projection light is radiated from an outside of a screen to show a reflected light on the screen. With any one of these, it is required to obtain a bright image and a high contrast image in order to realize a screen with good visibility.

In the reflection type screen, since inhibition of a relatively outer light can be inhibited, as compared with conventional screens, by selectively reflecting a light at a specific wavelength, reduction of the contrast of an image formed on a screen can be inhibited, as well as a bright image can be obtained with effective reduction of reflection of an outer light. Further, in the reflection type screen, a clear image can be obtained even in a bright projection environment, and thus a clear image can be obtained without any influence of the brightness of the projection environment.

The optical multilayer film used in the projector, or the like can be formed by sequential lamination of a layer with a high refractive index comprising a material with a high refractive index and a layer with a low refractive index including a material with a low refractive index, as in the anti-reflection film. Thus, the ring-opening metathesis polymer and/or a hydrogenated product thereof of the present invention can be used as a layer with a high refractive index.

Furthermore, a film material comprising the ring-opening metathesis polymer and/or a hydrogenated product thereof of the present invention can be used as a liquid crystal substrate. Conventionally, as the liquid crystal substrate, a glass substrate has been usually used. The glass substrate has problems such as that a thin shape is difficult to be attained due to poor mechanical strength of the glass, that a shape cannot be freely selected due to lack of flexibility, and that the productivity is low due to easy generation of cracks. Recently, a liquid crystal display used in the remarkably distributed mobile information terminals such as a mobile phone, a mobile machine such as a notebook PC and a subnotebook PC, and a liquid crystal substrate to be used therefor require low weight, thinness, and absence of cracks. Thus, in the liquid crystal display in the applications requiring low weight, thinness, and absence of cracks, a liquid crystal substrate film including a transparent resin made of a resin instead of a glass substrate is now used. In the glass substrate, the coated alignment film is baked at a temperature as high as 200° C. or higher, but the heat resistance of a liquid crystal substrate film made of a transparent resin PES (polyethersulfone) that has been conventionally used in this application is limited to from 160 to 170° C., and further, a transparent resin film having high heat resistance is required.

The liquid crystal substrate comprising the ring-opening metathesis polymer and/or a hydrogenated product thereof according to the present invention has a high glass transition temperature and excellent heat resistance property at a temperature used, as well as exhibits thermoplasticity providing suitable flowability at a temperature for a molding process such as melt molding, or the like. Thus, it can be suitably used as a liquid crystal substrate. Moreover, the thickness of the substrate when used as a liquid crystal substrate is not particularly limited, but it is possible to obtain a film having a thickness of 1 µm to 1 mm by the above-mentioned solution cast method or a melt extrusion method. Moreover, it can be used as a stretched alignment film by carrying out stretching, and can be used as a liquid crystal substrate exhibiting improved heat resistance and chemical resistance by carrying out the crosslinking.

The process for producing the optical film material is not particularly limited as long as the ring-opening metathesis polymer and/or a hydrogenated product thereof of the present invention is/are molded into a film for obtaining the optical film, and known molding methods can be employed. For example, examples of the methods include a solution cast method using polymer solution; an extrusion molding methods such as a T die method for molding using a melt polymer, and an inflation method; a blow molding method; a calendar molding method; and an injection molding method.

The method for molding the ring-opening metathesis polymer and/or a hydrogenated product thereof is not particularly limited, but, for example, the following methods are used for a solution cast method or a melt extrusion method.

The solution cast method is a method in which a polymer solution is cast onto a smooth plate or a film in a thin film state, and the solvent is removed to obtain a film. For application of the solution on a smooth plate or a film, a spin coat method, a bar coat method, a gravure coat method, a kiss coat method, a blade coat method, a roll coat method, a dip coat method, or other methods can be used.

In a case of preparing a film or sheet using the solution cast method, a solvent having the solubility of the polymer is selected, and the solvent can be used alone, or in combination of two or more kinds thereof, if necessary. Examples of the solvent for the solution cast method include ethers such as tetrahydrofuran, dibutyl ether, dimethoxyethane, dioxane, and PGMEA; esters such as ethyl acetate and butyl acetate; aromatic hydrocarbons such as benzene, toluene, xylene, and ethyl benzene; aliphatic hydrocarbons such as hexane and heptane; aliphatic cyclic hydrocarbons such as cyclohexane, methylcyclohexane, dimethylcyclohexane, and decalin; ketones such as methyl ethyl ketone, cyclopentanone, and cyclohexanone; and halogenated hydrocarbons such as chloroform, chlorobenzene, and trichlorobenzene, and these may be used in combination of two or more kinds thereof. The solvent is not limited to these, and particularly for the purpose of controlling the volatilization rate of the solvent, a good solvent for a polymer (for example, tetrahydrofuran and cyclohexanone), and a poor solvent (for example, alcohols such as methanol and ethanol) can be combined.

The solution casting method is specifically a method in which a film is formed on a mold release film that flows on a casting roll using a solution of the ring-opening metathesis polymer or a hydrogenated product thereof which has been adjusted to a predetermined concentration and optionally subjected to filtration and defoaming treatment. Thereafter, the obtained film is allowed to pass between the casting roll and a smoothing roll that is in contact with the casting roll in order to adjust the thickness and smooth out the surface, and the mold release film is removed and rolled out through a drying machine.

In order to obtain the film, it is preferable to carry out sufficient drying or a treatment for solvent removal. In order to carry out sufficient drying, it is preferable, for example, to select a condition of a drying temperature of 100 to 200° C. and a drying time of from 10 seconds to 24 hours. As a drying atmosphere, any one of air, an inert gas or reduced pressure may be used, and in some situations, contact with a steam of a poor solvent may be allowed. Alternatively, a film may be formed at from 20 to 200° C.

As a treatment for solvent removal, for example, a method in which a film comprising the ring-opening metathesis polymer and/or a hydrogenated product thereof, that is/are molded, but not yet dried, is passed through a liquid or vapor of a second solvent in which the ring-opening metathesis polymer or a hydrogenated product thereof is not substantially dissolved, to make it easier to remove the solvent remaining in the polymer, can be mentioned.

Furthermore, a melt-extrusion device for forming a film by melt-extrusion in the present invention is not limited to a certain extruder, and a single or twin screw extruder may be used. The diameter and length of the cylinder are not limited, but it is preferable that the diameter of the cylinder is in a range of from 20 mm to 150 mm, and L/D (a ratio of the length to the diameter) is in a range of from 10 to 40. The kind of the screw that can be used in the present invention is not limited. Thus, various screws ranging from a screw having a simple shape such as a full flight type screw and a barrier flight type screw to a screw having an improved mixing property, such as a Dulmage type screw, a pin type screw, a pineapple type screw, a uni-melt type screw, and the like can be used.

The device for the downstream of the cylinder is not limited. Also, a gear pump, a polymer filter, and a thermogenizer on a flow path are preferably provided so as to establish a stable flow rate, and to remove unwanted products. Further preferably, a polymer filter can be used. In order to obtain a transparent optical film having an industrially high quality, it is preferably to use a polymer filter. For the polymer filter, a metal fiber type filter element can be used. As a preferable example of a hole of the filter, a hole having a dimension of from 1 to 50 μm can be used.

The molding device for obtaining a film is not limited, but a T-die, an inflation die, a circulation die, and the like can be suitably used. Particularly preferably, the T-die can be used to obtain a uniform thickness of a transparent optical film.

The thickness of a film obtained by using the ring-opening metathesis polymer and/or a hydrogenated product thereof of the present invention in a solution cast method or a melt extrusion method varies depending on the applications. However, the thickness is not particularly limited; it is usually from 0.2 μm to 3 mm. In the solution cast method, a thin film having a thickness of from 0.2 μm to 500 μm can be prepared, and in the melt extrusion method, a film having a thickness of from 100 μm to 3 mm can be prepared. Further, in the melt extrusion method, a plate-type molded product having a higher thickness of from 1 mm or more can also be prepared.

Thus obtained film of the present invention is a film in which the ring-opening metathesis polymer and a hydrogenated product thereof have a uniform film thickness, optically very high transparency, heat resistance, and dimensional stability over time, in addition to excellent characteristics thereof.

[Molded Product]

The molded product of the present invention can be formed as a structure obtained by a molding process such as injection molding and extrusion molding. Further, the uses of the molded product are not particularly limited, but examples of the uses include an optical lens and an optical fiber. Examples of the optical lens include an image pick-up lens used in a camera, a video camera, and the like; a projection lens used in a projection TV, and the like; a fθ lens used a laser print; and a lens used in a microlens array, and the like.

The optical lens comprising the ring-opening metathesis polymer and/or a hydrogenated product thereof of the present invention has a refractive index for a light at a D-ray wavelength of preferably 1.48 or more, and more preferably from 1.48 to 1.70.

In order to increase the surface hardness for its use as an optical lens, an organotitanium compound or an organosilicon compound may be used for a surface treatment, and for this, a surface treatment for providing higher polarity to the surface of a lens is preferred.

For the optical lens comprising the ring-opening metathesis polymer and/or a hydrogenated product thereof of the present invention, the polarity of a surface of the resulting lens can be arbitrarily controlled by adjusting the content of the structural units [A] containing a substituent comprising an organic acid residue.

The optical lens comprising the ring-opening metathesis polymer and/or a hydrogenated product thereof of the present invention has a light transmittance in a visible light region of 80% or more, and preferably from 85 to 100%.

The ring-opening metathesis polymer and a hydrogenated product thereof in the present invention have excellent thermoplasticity and thermal stability, and accordingly it can be subjected to melt molding.

A method for molding optical lens including the ring-opening metathesis polymer and/or a hydrogenated product thereof of the present invention is not particularly limited, and examples of the method include injection molding, press molding, compression molding, injection compression molding, and extrusion molding. Further, the molding temperature for melt molding the optical lens of the present invention is preferably 300° C. or lower. Moreover, additives such as an ultraviolet ray absorber, an antioxidant, a flame retardant, an antistatic agent, and a colorant can be added for molding within a range not causing reduction of transparency or not affecting an Abbe's number.

The optical lens obtained by molding the ring-opening metathesis polymer and/or a hydrogenated product thereof of the present invention has an Abbe's number of preferably 60 or less, more preferably from 30 to 60, and further preferably from 40 to 60. If the Abbe's number is 60 or less, for example, use in combination with a lens with a low refractive index can exhibit a required corrective effect of chromatic aberration.

Moreover, the optical lens in the present invention has a haze value, as one of the indices indicating reduction of transparency that occurs by light diffuse reflection, of preferably 2% or less, and more preferably 1% or less. Also, the haze has a lower limit of around 0.5%.

Furthermore, the ring-opening metathesis polymer and/or a hydrogenated product thereof of the present invention can be used in applications involving an optical fiber. The optical fiber in which a core portion and a clad portion are each made of a transparent resin has a low weight, excellent/flexibility, and good processability, and as a result, it is at present used in the applications of internal light transmission of automobile, OA devices, FA (Factory Automation) devices, and the like. This optical fiber is usually used in a form of an optical fiber having a coating material around the fiber, but if the optical fiber made of a resin is coated, the coating temperature is usually at a high temperature in a range of from approximately 120 to 160° C., or higher. Accordingly, the optical fiber is heated due to the coating material made of a resin at a high temperature, and consequently, light transmission characteristics are deteriorated in many cases. This is because conventional optical fibers usually comprise a transparent resin such as a polymethylmethacrylate, a polystyrene, and a polycarbonate, and since the transparent resin has a low thermal deformation temperature, coating with a resin at a high temperature causes thermal deformation of the optical fiber. Accordingly, so as not to impair light transmission characteristics of the optical fiber, it is necessary to lower the melting point of the coating material, and the coating material to be used is narrowly limited to a polyethylene, a polyvinyl chloride, and the like. The resin has poor heat resistance, as well as poor bending/flexibility, and significantly limits the application range of the optical fiber. The ring-opening metathesis polymer and a hydrogenated product thereof of the present invention have high glass transition temperature and excellent heat resistance at a temperature used, and exhibit thermoplasticity such as suitable flowability at a temperature for a molding process such as melt extrusion molding for use an optical fiber. Thus, they can be suitably used as optical fibers.

Furthermore, for the optical fiber comprising the ring-opening metathesis polymer and/or a hydrogenated product thereof of the present invention, a hydrogenated product is preferably used from the viewpoints of stability against heat or light and a light transmission property. Also, if necessary, within a range of not impairing the effect of the present invention, a known antioxidant, an ultraviolet ray absorbent, a stabilizer, an antistatic agent, a flame retardant, an impact resistance-modifying elastomer, and the like can be added to a resin used as a material for an optical fiber. Further, for the purpose of improving processability, an additive such as a lubricating agent can be added.

As the method for obtaining an optical fiber from the ring-opening metathesis polymerization and/or a hydrogenated product thereof of the present invention, a known method can be used, and examples of the method include a method in which a resin is melt-heated, and drawn to give fibers, thereby forming a core material, and then a clad material is adhered thereto. For the clad material, a known resin, for example, a polytetrafluoroethylene, a tetrafluoroethylene/perfluoroalkyl vinylether copolymer, a tetrafluoroethylene/hexafluoropropylene copolymer, a polychlorotrifluoroethylene, a tetrafluoroethylene/ethylene copolymer, a polyvinyl fluoride, a polyvinylidene fluoride copolymer, a polyamide resin, a polyamideimide resin, an epoxy resin, a polyalkylsiloxane rubber, or the like can be used. The diameter of the core material is, for example, from 0.2 mm to 50 mm, preferably from 0.5 mm to 20 mm, and the thickness of the clad material is from 0.1 µm to 100 µm, and preferably from 0.5 µm to 60 µm.

Furthermore, the ring-opening metathesis polymerization and/or a hydrogenated product thereof of the present invention can be added with a crosslinking agent, melt-heated at a high temperature, and exposed to an ultraviolet light with a specific wavelength to perform a crosslinking reaction with a carboxylic acid or an organic acid to give a crosslinking resin, whereby an optical fiber having improved heat resistance, chemical resistance, water resistance, mechanical characteristics, or the like can be provided.

[Resist Material]

The ring-opening metathesis polymer and/or a hydrogenated product thereof of the present invention can be used as a base resin for a photoresist.

The ring-opening metathesis polymer and a hydrogenated product thereof of the present invention comprises at least the repeating structural units [A] represented by General Formula [1] and the repeating structural units [B] represented by General Formula [2] at a constitutional molar ratio [A]/[B] of 0.1/99.9 to 100/0, and preferably at a constitutional molar ratio [A]/[B] of 1/99 to 100/0. The constitutional units in this range are very suitable for preparation of a resist, and are extremely important as a base resin constituting a resist that is dissolved in a polar solvent with a high-polarity photosensitive agent and applied on a substrate to be treated such as a silicone substrate. That is, in the preparation of a resist comprising a ring-opening metathesis polymer and/or a hydrogenated product thereof, the solubility or the dissolution rate in a polar solvent can be increased to form a uniform and smooth coating film.

Particularly, the ring-opening metathesis polymer and/or a hydrogenated product thereof comprising the structural units selected from at least the structural unit [A] represented by the General Formula [1] in which $X^1$ is selected from —O—, —S—, —NR$^5$—, and —PR$^5$— (wherein $R^5$ represents hydrogen, or an alkyl group having 1 to 20 carbon atoms) and the structural unit [B] represented by the General Formula [2] in which $X^2$ is selected from —O—, —S—, —NR$^{10}$—, and —PR$^{10}$— (wherein $R^{10}$ represents hydrogen, or an alkyl group having 1 to 20 carbon atoms) has/have an effect of further improving the cohesiveness with a substrate to be treated such as a silicone substrate, the wetting tension upon development by an alkali aqueous solution, and the solubility of a resist in a polar organic solvent such as ketones and alcohols used in a process for application onto a silicon wafer. Further, the hydrophilicity to water is also improved, and the developability of an alkali aqueous solution, or the like, for a remover (or a developer) after exposure is correspondingly improved.

As described above, the ring-opening metathesis polymer and/or a hydrogenated product thereof in the present invention comprise(s) at least the repeating structural units [A] represented by General Formula [1] and the repeating structural units [B] represented by General Formula [2] at a constitutional molar ratio [A]/[B] of 0.1/99.9 to 100/0 is/are useful as a base polymer for a photoresist.

The resist material of the present invention is used, for example, as a positive resist composition, together with an acid generator and a solvent. As used herein, the acid generator is a substance which generates a Bronsted acid or a Lewis acid upon exposure to an activating radiation ray. Also, the resist can be incorporated with a dissolution controller, a surfactant, a preservative stabilizer, a sensitizer, or a striation preventing agent, or the like. For this resist, the composition can be, for example, applied to the surface of a substrate such as a silicon wafer by a conventional method such as spin coating, and then a solvent is removed by drying, to form a resist film, and the exposure for pattern formation is effected by irradiating a resist film with a far ultraviolet ray, a KrF excimer laser, an ArF excimer laser, an electron beam, and if a thermal treatment (baking after exposure) is further conducted, higher sensitization can be accomplished. Then, an exposed part is washed off by a developer such as an alkali aqueous solution to obtain a relief pattern. The relief pattern formed by using the ring-opening metathesis polymer and/or a hydrogenated product thereof of the present invention is/are extremely good in both the resolution and the contrast. Further, a substrate can be etched by using a pattern formed as described above as a mask.

The ring-opening metathesis polymer and/or a hydrogenated product thereof including an organic acid residue of the present invention can be used as negative type(s) by dissolving an acid generator component, a crosslinking agent component, and if necessary, an amine component, a carboxylic acid component, or the like, in an organic solvent.

The acid generating component can be suitably selected from known acid generators used in conventional chemical amplification type negative resists, and used. Among these, an onium salt including a halogenated alkyl sulfonic acid ion as an anion is particularly suitable.

The crosslinking agent component is not particularly limited, and it can be arbitrarily selected from known crosslinking agents used in conventionally known chemical amplification type negative resists. However, a glycoluril in which an N position is substituted with a hydroxyalkyl group and/or a lower alkoxyalkyl group as a crosslinking group is preferably used.

If desired, an amine as a quencher component can be contained in order to further improve the resist pattern shape, stability over time, or the like. And an organic carboxylic acid or an oxo acid of phosphor or a derivative thereof can be contained as another optional component, for the purpose of solving a problem concerning the deterioration of the sensitivity due to the addition of an amine component as a quencher, or the dependency on a substrate. These are additional components that are practically used for chemical amplification-type negative resists.

If desired, the negative resist can be further incorporated with miscible additives, for example, practically used additives such as a plasticizer, a stabilizer, a colorant, a surfactant, and the like, so as to improve the performance of a resist film.

The negative resist can be used by dissolving the ring-opening metathesis polymer and/or a hydrogenated product thereof comprising an organic acid residue of the present invention, an acid generator component, a crosslinking agent component, and optionally, an amine component, a carboxylic acid component, and the like in an organic solvent.

The organic solvent as used herein is not particularly limited as long as each of the components can be dissolved in the solvent. Examples of the solvent include ketones such as methyl ethyl ketone, cyclohexanone, methyl isoamyl ketone, and 2-heptanone; polyhydric alcohols and derivatives thereof such as ethylene glycol, ethylene glycol monoacetate, diethylene glycol, diethylene glycol monoacetate, propylene glycol, propylene glycol monoacetate, dipropylene glycol, or a monomethyl ether, monoethyl ether, monopropyl ether, monobutyl ether or monophenyl ether of dipropylene glycol monoacetate; cyclic ethers such as dioxane; and esters such as methyl lactate, ethyl lactate, methyl acetate, ethyl acetate, butyl acetate, methyl pyruvate, ethyl pyruvate, methyl methoxypropionate, and ethyl ethoxypropionate. These can be used alone or in combination of two or more kinds thereof.

EXAMPLE

Hereinbelow, the present invention is described in detail with reference to Examples, but is not limited thereto.

Furthermore, the physical properties of the polymers obtained in Examples were measured by the following methods.

[Average Molecular Weight]

The molecular weights of a cyclic olefinic ring-opening metathesis polymer, and a hydrogenated product of the polymer were calibrated at 40° C. at a flow rate of 1.0 ml/min by a standard polystyrene conversion method using GPC, 830-RI and 875-UV manufactured by JASCO Corporation as a detector, and Shodexk-805, 804, 803, and 802.5 as columns, after the resulting cyclic olefinic ring-opening metathesis polymer, and a hydrogenated product of the polymer had been dissolved in a tetrahydrofuran.

[Polymerization Rate]

The presence of the cyclic olefin monomer used was confirmed using a 270 MHz-$^1$H-NMR spectrum.

[Hydrogenation Rate]

A powder of a cyclic olefinic hydrogenated ring-opening metathesis polymer was dissolved in deuterated chloroform, and a reduction magnitude of a peak assigned to a carbon-carbon double bonds in the main chain at $\delta=4.0$ to 6.5 ppm caused by a hydrogenation reaction, was calculated by using 270 MHz-$^1$H-NMR.

[Glass Transition Temperature (Tg)]

Measurement was carried out on a sample to be measured by using DSC-50 manufactured by SHIMADZU CORPORATION at a temperature elevating rate of 10° C./min under nitrogen.

[Temperature for 5% Reduction of Weight]

Measurement of the temperature for 5% reduction in weight of a sample was carried out by using DTG-60 A manufactured by SHIMADZU CORPORATION at a temperature elevating rate of 10° C./min under nitrogen.

[Measurement of Content of Carboxylic Acid]

Measurement was carried out neutralization titration using Bromothymol Blue as an indicator or checking a peak assigned to carbonyl carbon at 170 ppm to 190 ppm in a 400 MHz-$^{13}$C-NMR spectrum.

[Water Contact Angle]

Evaluation was carried out by spin-coating a polymer solution on a glass plate, then drying, and measuring an obtained sample by a sessile drop method using pure water, and using an analytical software FAMAS, in accordance with JIS-R3257, by means of an automatic contact angle meter of a CA-V type manufactured by Kyowa Interface Science Co. Ltd.

[Refractive Index for Light at D-Ray Wavelength]

Measurement was carried out using a multi-wavelength Abbe refractometer manufactured by ATAGO Ltd.

[Adhesion Strength]

The adhesion strength was measured by peeling in a 90° direction at a rate of 50 mm/min in accordance with an IPC-TM650 method. The measurement was carried out three times.

[Melt Viscosity]

Measurement was carried out after maintaining a sample with an orifice by 1.0 mm (diameter)×10 mm (length), under a load of 9.806 MPa and measurement temperatures of 260° C., 270° C., 280° C., and 290° C. for 5 minutes, by means of a flow tester (CFT500A) manufactured by Shimadzu Corporation.

Example 1

In a 300 ml Schlenk flask, tetracyclo[4.4.0.1$^{2,5}$.1$^{7,10}$]-3-dodecene (monomer [D]; 24.52 g) and 8-(1'-ethylcyclopentyloxycarbonyl)-tetracyclo[4.4.0.1$^{2,5}$.1$^{7,10}$]-3-dodecene (monomer [C]; 5.11 g) as cyclic olefin monomers were dissolved in 200 ml of tetrahydrofuran (hereinafter referred to as THF) under nitrogen. To the solution was added 0.70 g of 1,5-hexadiene, and the mixture was stirred. Then, W(N-2,6-Me$_2$C$_6$H$_3$)(CHCMe$_2$Ph)(OC(CF$_3$)$_2$Me)$_2$ (27 mg) as a polymerization catalyst was added thereto, and the mixture was stirred at room temperature for 1 hour. Thereafter, butyraldehyde (7 mg) was added thereto, and the mixture was stirred for 30 min. The reaction solution was subjected to NMR measurement, and as a result, no remaining cyclic olefin monomer was found. The molar ratio [C]/[D] of the cyclic olefin monomers used in the polymerization is 10/90.

This ring-opening metathesis polymer solution was added to water to form a precipitate, which was separated by filtration, and then dried in vacuo to obtain 31.8 g of a ring-opening metathesis polymer in the form of a white powder. The molar ratio [C]/[D] of the cyclic olefin monomers used in the polymerization is 10/90. The polymer had an Mw of 11700 and an Mw/Mn of 2.32. Further, the resulting polymer had a water contact angle of 93°, a refractive index for a light at a D-ray wavelength of 1.59, and a Tg of 178° C.

10 g of the resulting ring-opening metathesis polymer was added to a solution of 2.5 ml of trifluoroacetic acid in 500 ml of toluene in a 1000 ml eggplant form flask, and the mixture was heated to 80° C. for 1 hour. Then, the solvent was distilled off. The resulting mixture was further dissolved in THF, and added to water for to form a precipitate, which was filtered, and dried in vacuo to obtain 9.2 g of a white powder. The content of the carboxylic acid component was 7 mol % in result of titration analysis, and the molar ratio [A]/[B] of the structural units was 7/93. The Mw was 11000, the Mw/Mn was 2.32, the water contact angle was 91°, the refractive index was 1.59, and the Tg was 185° C. The $^{13}$C-NMR chart of the resulting ring-opening metathesis polymer is shown in the drawing.

On a silver-deposited surface of an aluminum film having a thickness of 50 μm obtained by depositing silver as an adherend on a film to a thickness of 150 nm, a ring-opening metathesis polymer solution dissolved in THF at a concentration of 20 wt % was cast-applied to a thickness after drying of 10 μm, and heated and dried at a temperature of 100° C. for 10 minutes to prepare two adhesive sheets.

Thereafter, three sheets with a width of 3.2 mm were cut out from one sheet of the resulting adhesive sheets, and the polymer-applied surfaces of the remaining adhesive sheets were superposed onto the polymer-applied surfaces of the three obtained adhesive sheets that have been cut. Here, the three obtained adhesive sheets were not superposed onto each other.

Next, about 1 cm in width from an edge of the other side of the adhesive sheet was not pressed, and interposed between two metal sheets in which their surfaces were mirror polished and polyimide sheets as cushioning materials, subjected to heating and pressurizing treatments under a load of 5 MPa at a temperature of 230° C. for 1 minute by means of a heating press machine, and then taken out and cooled to prepare a laminated sheet.

Then, the adhesive sheet side that had not been cut in the resulting laminated sheet was adhered onto a sheet made of an epoxy resin reinforced with a glass cloth that was fixed by a jig, using a double-side tape, and an edge of the cut adhesive sheet on the other side, that had not been pressed, was secured with a clamp. Then, in accordance with an IPC-TM650 method, drawing was continuously performed at a peel angle of 90° between the fixed surface on the sheet made of an epoxy resin and the surface of the sheet secured by the clamp at a rate of 50 mm/min to measure a peel strength, that is, an adhesion strength, which was 0.7 kN/m.

Example 2

10 g of the ring-opening metathesis polymer obtained in Example 1 was heated at 80° C. for 2 hours with trifluoroacetic acid in the same manner as in Example 1 to obtain 9.2 g of a white powder. The content of the carboxylic acid component was 10 mol % in result of titration analysis, and the molar ratio [A]/[B] was 10/90. The Mw was 13100, the Mw/Mn was 2.43, the water contact angle was 90°, the refractive index was 1.59, and the Tg was 189° C., the temperature for 5% reduction of weight was 352° C., and the adhesion strength as measured in the same manner as in Example 1 was 1.1 kN/m.

Example 3

Polymerization was carried out in the same manner as in Example 1, except that tetracyclo[4.4.0.1$^{2,5}$.1$^{7,10}$]-3-dodecene (monomer [D]; 24.52 g), 8-tert-butyloxycarbonyl-11-oxa-tetracyclo[4.4.0.1$^{2,5}$.1$^{7,10}$]-3-dodecene (monomer [C]; 4.46 g) as cyclic olefin monomers, and 0.82 g of 1,6-heptadiene were used, and as a result, no remaining cyclic olefin monomer was found, and 29.0 g of a ring-opening metathesis polymer in the form of a powder was obtained. The molar ratio [C]/[D] of the cyclic olefin monomers used in the polymerization is 10/90. The polymer had an Mw of 12700 and an Mw/Mn of 2.36. Further, the resulting polymer had a water contact angle of 92°, a refractive index for a light at a D-ray wavelength 1.57, and a Tg of 180° C.

10 g of the resulting ring-opening metathesis polymer was heated at 80° C. for 20 minutes with trifluoroacetic acid in the same manner as in Example 1 to obtain 9.4 g of a white powder. The content of the carboxylic acid component was 3 mol % in result of titration analysis, and the molar ratio [A]/[B] of the structural units was 3/97. The Mw was 12900, the Mw/Mn was 2.42, the water contact angle was 91°, the refractive index was 1.57, and the Tg was 181° C., and the adhesion strength as measured in the same manner as in Example 1 was 0.5 kN/m.

Example 4

10 g of the ring-opening metathesis polymer obtained in Example 3 was heated at 80° C. for 20 minutes with trifluoroacetic acid in the same manner as in Example 1 to obtain 9.20 g of a white powder. The content of the carboxylic acid component was 10 mol % in result of titration analysis, and the molar ratio [A]/[B] of the structural units was 10/90. The Mw was 13100, the Mw/Mn was 2.43, the water contact angle was 89°, the refractive index was 1.57, and the Tg was 190° C., the temperature for 5% reduction of weight was 352° C., and the adhesion strength as measured in the same manner as in Example 1 was 1.0 kN/m.

Example 5

Polymerization was carried out using tetracyclo[4.4.0.1$^{2,5}$.1$^{7,10}$]-3-dodecene (monomer [D]; 21.80 g) and 8-tert-butyloxycarbonyl-11-oxa-tetracyclo[4.4.0.1$^{2,5}$.1$^{7,10}$]-3-dodecene (monomer [C]; 8.92 g) as cyclic olefin monomers, and W(N-2,6-Me$_2$C$_6$H$_3$)(CHCMe$_2$Ph)(OC(CF$_3$)$_2$Me)$_2$ (1.94 g) as a polymerization catalyst, while not using 1,5-hexadiene. After completion of the polymerization, butyraldehyde (0.52 g) was added to the mixture to stop the reaction. As for the rest, polymerization was carried out in the same manner as in Example 1, and as a result, no remaining cyclic olefin monomer was found, and 30.1 g of a ring-opening metathesis polymer in the form of a powder was obtained. The molar ratio [C]/[D] of the cyclic olefin monomers used in the polymerization is 20/80. The polymer had an Mw of 26800, and an Mw/Mn of 1.10. Further, the resulting polymer had a water contact angle of 92°, a refractive index of 1.57, and a Tg of 191° C.

10 g of the resulting ring-opening metathesis polymer was heated at 80° C. for 1 hour with trifluoroacetic acid in the same manner as in Example 1 to obtain 9.2 g of a white powder. The content of the carboxylic acid component was 10 mol % in result of titration analysis, and the molar ratio [A]/[B] of the structural units was 11/89. The Mw was 27200, the Mw/Mn was 1.11, the water contact angle was 90°, the refractive index was 1.57, and the Tg was 199° C., the temperature for 5% reduction of weight was 335° C., and the adhesion strength as measured in the same manner as in Example 1 was 1.2 kN/m.

Example 6

10 g of the ring-opening metathesis polymer obtained in Example 5 was heated at 80° C. for 3 hours with trifluoroacetic acid in the same manner as in Example 1 to obtain 9.0 g of a white powder. The content of the carboxylic acid component was 20 mol % in result of titration analysis, and the molar ratio [A]/[B] of the structural units was 20/80. The Mw was 27500, the Mw/Mn was 1.12, the water contact angle was 88°, the refractive index was 1.57, and the Tg was 206° C., the temperature for 5% reduction of weight was 343° C., and the adhesion strength as measured in the same manner as in Example 1 was 1.4 kN/m.

Example 7

Polymerization was carried out in the same manner as in Example 1, except that tetracyclo[4.4.0.1$^{2,5}$.1$^{7,10}$]-3-dodecene (monomer [D]; 21.80 g), 8-(1'-ethylcyclopentyloxycarbonyl)-tetracyclo[4.4.0.1$^{2,5}$.1$^{7,10}$]-3-dodecene (monomer [C]; 10.21 g) as cyclic olefin monomers, and 0.34 g of 1,5-hexadiene were used, Mo(N-2,6-Pr$^i_2$C$_6$H$_3$)(CHCMe$_3$)(OCMe(CF$_3$)$_2$)$_2$ (24 mg) was used as a polymerization catalyst, and 0.96 g of 1-octene were used, and as a result, no remaining cyclic olefin monomer was found, and 31.8 g of a ring-opening metathesis polymer in the form of a powder was obtained. The molar ratio [C]/[D] of the cyclic olefin monomers used in the polymerization is 20/80. The polymer had an Mw of 23000, an Mw/Mn of 2.55, a water contact angle of 93°, a refractive index of 1.59, and a Tg of 187° C.

10 g of the resulting ring-opening metathesis polymer was heated at 80° C. for 1 hour with trifluoroacetic acid in the same manner as in Example 1 to obtain 9.2 g of a white powder. The content of the carboxylic acid component was 10 mol % in result of titration analysis, and the molar ratio [A]/[B] of the structural units was 11/89. The Mw was 23200, the Mw/Mn was 2.56, the water contact angle was 90°, the refractive index was 1.59, and the Tg was 195° C., and the adhesion strength as measured in the same manner as in Example 1, except that the temperature capable of adhesion by an adhesive sheet was 240° C., was 1.0 kN/m.

Example 8

10 g of the ring-opening metathesis polymer obtained in Example 7 was heated at 80° C. for 4 hours with trifluoroacetic acid in the same manner as in Example 1 to obtain 9.0 g of a white powder. The content of the carboxylic acid component was 20 mol % in result of titration analysis, and the molar ratio [A]/[B] of the structural units was 20/80. The Mw was 23500, the Mw/Mn was 2.60, the water contact angle was 88°, the refractive index was 1.59, and the Tg was 200° C., and the adhesion strength as measured in the same manner as in Example 1, except that the temperature capable of adhesion by an adhesive sheet was 240° C., was 1.2 kN/m.

Example 9

Polymerization was carried out in the same manner as in Example 1, except that 8-cyano-tetracyclo[4.4.0.1$^{2,5}$.1$^{7,10}$]-3-dodecene (monomer [D]; 25.20 g), 8-(1'-ethylcyclopentyloxycarbonyl)-tetracyclo[4.4.0.1$^{2,5}$.1$^{7,10}$]-3-dodecene (monomer [C]; 10.21 g) as cyclic olefin monomers, and 0.34 g of 1,5-hexadiene were used, and Mo(N-2,6-Me$_2$C$_6$H$_3$)(CHCMe$_3$)(OCMe(CF$_3$)$_2$)$_2$ (22 mg) was used as a polymerization catalyst, and as a result, no remaining cyclic olefin monomer was found, and 33.9 g of a ring-opening metathesis polymer in the form of a powder. The molar ratio [C]/[D] of the cyclic olefin monomers used in the polymerization is 20/80. The polymer had an Mw of 24200, an Mw/Mn of 2.42, a water contact angle of 93°, a refractive index of 1.58, and a Tg of 251° C.

10 g of the resulting ring-opening metathesis polymer was heated at 80° C. for 4 hours with trifluoroacetic acid in the same manner as in Example 1 to obtain 9.1 g of a white powder. The content of the carboxylic acid component was 20 mol % in result of titration analysis, and the molar ratio [A]/[B] of the structural units was 20/80. The Mw was 24500, the Mw/Mn was 2.51, the water contact angle was 88°, the refractive index was 1.58, the Tg was 268° C., the temperature for 5% reduction of weight was 318° C., and the adhesion strength as measured in the same manner as in Example 1, except that the temperature capable of adhesion by an adhesive sheet was 300° C., was 1.0 kN/m.

Example 10

Polymerization was carried out in the same manner as in Example 1, except that tetracyclo[4.4.0.1$^{2,5}$.1$^{7,10}$]-3-dodecene (monomer [D]; 19.06 g), 8-tert-butyloxycarbonyl-11-oxa-tetracyclo[4.4.0.1$^{2,5}$.1$^{7,10}$]-3-dodecene (monomer [C]; 13.38 g) as cyclic olefin monomers, and 0.82 g of 1,6-heptadiene were used, and Mo(N-2,6-Me$_2$C$_6$H$_3$)(CHCMe$_3$)(OCMe(CF$_3$)$_2$)$_2$ (22 mg) were used as a polymerization catalyst, and as a result, no remaining cyclic olefin monomer was found, and 32.4 g of a ring-opening metathesis polymer in the form of a powder was obtained. The molar ratio [C]/[D] of the cyclic olefin monomers used in the polymerization is 30/70. The polymer had an Mw of 14100, an Mw/Mn of 2.35, a water contact angle of 92°, a refractive index of 1.56, and a Tg of 176° C.

10 g of the resulting ring-opening metathesis polymer was heated at 80° C. for 4 hours with trifluoroacetic acid in the same manner as in Example 1 to obtain 8.8 g of a white powder. The content of the carboxylic acid component was 30 mol % in result of titration analysis, and the molar ratio [A]/[B] of the structural units was 30/70. The Mw was 14700, the Mw/Mn was 2.41, the water contact angle was 86°, the refractive index was 1.56, and the Tg was 199° C., and the adhesion strength as measured in the same manner as in Example 1, except that the temperature capable of adhesion by an adhesive sheet was 240° C., was 1.7 kN/m.

Example 11

Polymerization was carried out in the same manner as in Example 1, except that tetracyclo[4.4.0.1$^{2,5}$.1$^{7,10}$]-3-dodecene (monomer [D]; 13.62 g), 8-(1'-ethylcyclopentyloxycarbonyl)-tetracyclo[4.4.0.1$^{2,5}$.1$^{7,10}$]-3-dodecene (monomer [C]; 25.54 g) as cyclic olefin monomers, and 0.96 g of 1-octene were used, and W(N-2,6-Me$_2$C$_6$H$_3$)(CHCHCMe$_2$)(OC(CF$_3$)$_2$Me)$_2$(PMe$_3$)(28 mg) was used as a polymerization catalyst, and as a result, no remaining cyclic olefin monomer was found, and 39.0 g of a ring-opening metathesis polymer in the form of a powder was obtained. The molar ratio [C]/[D] of the cyclic olefin monomers used in the polymerization is 50/50. The polymer had an Mw of 12800, an Mw/Mn of 2.30, a water contact angle of 92°, a refractive index of 1.58, and a Tg of 148° C.

10 g of the resulting ring-opening metathesis polymer was heated at 80° C. for 20 minutes with trifluoroacetic acid in the same manner as in Example 1 to obtain 8.7 g of a white powder. The content of the carboxylic acid component was 21 mol % in result of titration analysis, and the molar ratio [A]/[B] of the structural units was 30/70. The Mw was 13100, the Mw/Mn was 2.32, the water contact angle was 88°, the refractive index was 1.58, and the Tg was 153° C., and the adhesion strength as measured in the same manner as in Example 1, except that the temperature capable of adhesion by an adhesive sheet was 200° C., was 1.2 kN/m.

Example 12

10 g of the ring-opening metathesis polymer obtained in Example 11 was heated at 80° C. for 6 hours with trifluoroacetic acid in the same manner as in Example 1 to obtain 7.9 g of a white powder. The content of the carboxylic acid component was 50 mol % in result of titration analysis, and the molar ratio [A]/[B] of the structural units was 50/50. The Mw was 13000, the Mw/Mn was 2.34, the water contact angle was 85°, the refractive index was 1.58, and the Tg was 185° C., and the adhesion strength as measured in the same manner as in Example 1 was 1.8 kN/m.

Example 13

Polymerization was carried out in the same manner as in Example 1, except that 8-(1'-ethylcyclopentyloxycarbonyl)-tetracyclo[4.4.0.1$^{2,5}$.1$^{7,10}$]-3-dodecene (monomer [C]; 51.07 g) as cyclic olefin monomers, and 0.34 g of 1,5-hexadiene were used, and as a result, no remaining cyclic olefin monomer was found, and 50.3 g of a ring-opening metathesis polymer in the form of a powder was obtained. The molar ratio [C]/[D] of the cyclic olefin monomers used in the polymerization is 100/0. The polymer had an Mw of 24100, an Mw/Mn of 2.56, a water contact angle of 92°, a refractive index of 1.57, and a Tg of 160° C.

In a 500 ml autoclave, a hydrogenation reaction was carried out using 20 g of the resulting ring-opening metathesis polymer, 120 g of THF, and palladium carbon as a hydrogenation catalyst at a hydrogen pressure of 8.0 MPa, at 130° C. for 8 hours, and the temperature was returned to room temperature to discharge a hydrogen gas. This solution of a hydrogenated product of the ring-opening metathesis polymer was added to water to form a precipitate, which was separated by filtration, and then dried in vacuo to obtain 19.6 g of a hydrogenated product of the ring-opening metathesis polymer in the form of a white powder. The hydrogenation rate as calculated from $^1$H-NMR of the resulting hydrogenated ring-opening metathesis polymer was 100%, as no peak assigned to a proton of an olefin in the main chain was detected. The Mw was 36800, the Mw/Mn was 2.92, the water contact angle was 92°, the refractive index was 1.55, and the Tg was 126° C.

10 g of the hydrogenated product of the ring-opening metathesis polymer was heated at 80° C. for 10 hours with trifluoroacetic acid in the same manner as in Example 1 to obtain 6.6 g of a white powder. The content of the carboxylic acid component was 100 mol % in result of titration analysis, and the molar ratio [A]/[B] of the structural units was 100/0. The Mw was 34200, the Mw/Mn was 2.90, the water contact angle was 80°, the refractive index was 1.55, and the Tg was 161° C., and the adhesion strength as measured in the same manner as in Example 1, except that the temperature capable of adhesion by an adhesive sheet was 210° C., was 1.9 kN/m.

Example 14

Hydrogenation was carried out in the same manner as in Example 13, except that 20 g of the ring-opening metathesis polymer obtained in Example 13 was subjected to a hydrogenation reaction under the condition of 130° C. for 3 hours, to obtain 19.2 g of a hydrogenated product of the ring-opening metathesis polymer. The hydrogenation rate was 52%, the Mw was 29800, the Mw/Mn was 2.72, the water contact angle was 92°, the refractive index was 1.56, and the Tg was 143° C. The resulting hydrogenated product of the ring-opening metathesis polymer was heated at 80° C. for 10 hours with trifluoroacetic acid in the same manner as in Example 1 to obtain 7.8 g of a white powder. The content of the component was 100 mol % in result of titration analysis, and the molar ratio [A]/[B] of the structural units was 100/0. The Mw was 29200, the Mw/Mn was 2.75, the water contact angle was 82°, the refractive index was 1.56, and the Tg was 178° C., and the adhesion strength as measured in the same manner as in Example 1 was 1.8 kN/m.

Example 15

Polymerization was carried out in the same manner as in Example 1, except that 8-tert-butyloxycarbonyl-11-oxa-tetracyclo[4.4.0.1$^{2,5}$.1$^{7,10}$]-3-dodecene (monomer [C]; 44.60 g) was used as a cyclic olefin monomer, Mo(N-2,6-Pr$^i$$_2$C$_6$H$_3$)(CHCMe$_2$Ph)(OCMe (CF$_3$)$_2$)$_2$ (26 mg) was used as a polymerization catalyst, and 0.40 g of 1,6-heptadiene were used, and as a result, no remaining cyclic olefin monomer was found, and 44.3 g of a ring-opening metathesis polymer in the form of a powder was obtained. The molar ratio [C]/[D] of the cyclic olefin monomers used in the polymerization is 100/0. The polymer had an Mw of 26800, an Mw/Mn of 2.71, a water contact angle of 90°, a refractive index of 1.56, and a Tg of 168° C.

Hydrogenation was carried out using 20 g of the resulting ring-opening metathesis polymer in the same manner as in Example 13 to obtain 19.4 g of a hydrogenated product of the ring-opening metathesis polymer. The hydrogenation rate was 100%, the Mw was 27500, the Mw/Mn was 2.88, the water contact angle was 90°, the refractive index was 1.53, and the Tg was 133° C.

10 g of the resulting hydrogenated product of the ring-opening metathesis polymer was heated at 80° C. for 10 hours with trifluoroacetic acid in the same manner as in Example 1 to obtain 6.3 g of a white powder. The content of the carboxylic acid component was 100 mol % in result of titration analysis, and the molar ratio [A]/[B] of the structural units was 100/0. The Mw was 38900, the Mw/Mn was 2.92, the water contact angle was 78°, the refractive index was 1.53, and the Tg was 172° C., and the adhesion strength as measured in the same manner as in Example 1 was 2.1 kN/m.

Example 16

Polymerization was carried out in the same manner as in Example 1, except that 4-oxa-tricyclo[5.2.1.0$^{2,6}$]-8-decen-3-one (monomer [D] (ONBL); 12.93 g), 8-(1'-ethylcyclopentyloxycarbonyl)-tetracyclo[4.4.0.1$^{2,5}$.1$^{7,10}$]-3-dodecene (monomer [C]; 25.54 g) as cyclic olefin monomers, and 1.31 g of 1,6-heptadiene were used, and as a result, no remaining cyclic olefin monomer was found, and 38.6 g of a ring-opening metathesis polymer in the form of a powder was obtained. The molar ratio [C]/[D] of the cyclic olefin monomers used in the polymerization is 50/50.

Hydrogenation was carried out using 20 g of the resulting polymer in the same manner as in Example 13 to obtain 19.2 g of a hydrogenated product of the polymer. The hydrogenation rate was 100%, the Mw was 11900, the Mw/Mn was 2.35, the water contact angle was 92°, the refractive index was 1.54, and the Tg was 101° C.

10 g of the resulting hydrogenated product of the ring-opening metathesis polymer was heated at 80° C. for 2 hours with trifluoroacetic acid in the same manner as in Example 1 to obtain a 8.8 g of a white powder. The content of the carboxylic acid component was 22 mol % in result of titration analysis, and the molar ratio [A]/[B] of the structural units was 31/69. The Mw was 12100, the Mw/Mn was 2.36, the water contact angle was 90°, the refractive index was 1.54, and the Tg was 116° C., and the adhesion strength as measured in the same manner as in Example 1, except that the temperature capable of adhesion by an adhesive sheet was 160° C., was 1.4 kN/m.

Example 17

10 g of the hydrogenated product of the ring-opening metathesis polymer obtained in Example 16 was heated at 80° C. for 6 hours with trifluoroacetic acid in the same manner as in Example 1 to obtain 8.4 g of a white powder. The content of the carboxylic acid component was 50 mol % in result of titration analysis, and the molar ratio [A]/[B] of the structural units was 50/50. The Mw was 12500, the Mw/Mn was 2.34, the water contact angle was 85°, the refractive index was 1.54, and the Tg was 139° C., and the adhesion strength as measured in the same manner as in Example 1, except that the temperature capable of adhesion by an adhesive sheet was 180° C., was 1.7 kN/m.

Example 18

5 g of the ring-opening metathesis polymer obtained in Example 17 and 2.8 g of a hydrogenated bisphenol A type diglycidylether compound (epoxy equivalent 205 g/eq, "YX-8000" manufactured by Japan Epoxy Resins Co., Ltd.) were mixed. This mixture was slowly heated on a plate heater, and the flowability disappeared at about 200° C. to give a rubber-like product, which was not dissolved in THF.

Example 19

Polymerization was carried out in the same manner as in Example 1, except that 8-(1'-ethylcyclopentyloxycarbonyl)-tetracyclo[4.4.0.1$^{2,5}$.1$^{7,10}$]-3-dodecene (monomer [C]; 5.54 g), tetracyclo[4.4.0.1$^{2,5}$.1$^{7,10}$]-3-dodecene (monomer [C]; 8.17 g), and 4-oxa-tricyclo[5.2.1.0$^{2,6}$]-8-decen-3-one (monomer [D] (ONBL); 5.17 g) were used as cyclic olefin monomers, and as a result, no remaining cyclic olefin monomer was found, and 38.7 g of a ring-opening metathesis polymer in the form of a powder was obtained. The molar ratio [C]/[D] of the cyclic olefin monomers used in the polymerization is 50/50.

Hydrogenation was carried out using 20 of the resulting polymer in the same manner as in Example 13 to obtain 19.6 g of a hydrogenated product of the polymer. The hydrogenation rate was 100%, the Mw was 18100, the Mw/Mn was 2.63, the water contact angle was 93°, the refractive index was 1.55, and the Tg was 117° C.

10 g of the resulting hydrogenated product of the ring-opening metathesis polymer was heated at 80° C. for 6 hours with trifluoroacetic acid in the same manner as in Example 1 to obtain 8.2 g of a white powder. The content of the carboxylic acid component was 50 mol % in result of titration analysis, and the molar ratio [A]/[B] of the structural units was 50/50. The Mw was 19000, the Mw/Mn was 2.65, the water contact angle was 84°, the refractive index was 1.55, and the Tg was 146° C., and the adhesion strength as measured in the same manner as in Example 1, except that the temperature capable of adhesion by an adhesive sheet was 180° C., was 1.6 kN/m.

Example 20

Polymerization was carried out in the same manner as in Example 1, except that 2-(bicyclo[2.2.1]hepta-5-en-2-ylmethyl)-1,1,1,3,3,3-hexafluoropropan-2-yl acetate (monomer [C]; 26.88 g) and tetracyclo[4.4.0.1$^{2,5}$.1$^{7,10}$]-3-dodecene (monomer [D]; 13.62 g) were used as cyclic olefin monomers, and as a result, no remaining cyclic olefin monomer was found, and 40.3 g of a ring-opening metathesis polymer in the form of a powder was obtained. The molar ratio [C]/[D] of the cyclic olefin monomers used in the polymerization is 50/50.

Hydrogenation was carried out using 20 g of the resulting polymer in the same manner as in Example 13 to obtain 19.7 g of a hydrogenated product of the polymer. The hydrogenation rate was 100%, the Mw was 15800, the Mw/Mn was 2.45, the water contact angle was 94°, the refractive index was 1.51, and the Tg was 101° C.

10 g of the resulting hydrogenated product of the ring-opening metathesis polymer was dissolved in 100 ml of THF, 10 ml of 10 wt % NaOH aqueous solution was then added to the solution, and the mixture was heated under reflux for 2 hours. The resulting solution was neutralized with hydrochloric acid, discharged into water, and dried to obtain 8.5 g of a white powder. As a result of $^1$H-NMR analysis, all the acetyl groups were eliminated, and the ratio [A]/[B] of the structural units was 50/50. The Mw was 15200, the Mw/Mn was 2.48, the water contact angle was 86°, the refractive index was 1.51, and the Tg was 85° C. Next, the adhesion strength as measured in the same manner as in Example 1, except that a polycarbonate film (trademark "ElMECH" manufactured by Kaneka Corporation) having a thickness of 66 μm was used as an adherend, and the temperature capable of adhesion by an adhesive sheet was 120° C., was 1.3 kN/m.

Example 21

Polymerization was carried out in the same manner as in Example 1, except that 4-oxa-tricyclo[5.2.1.0$^{2,6}$]-8-decen-3-one (monomer [D]; 12.93 g), 2-(bicyclo[2.2.1]hepta-5-en-2-ylmethyl)-1,1,1,3,3,3-hexafluoropropan-2-yl acetate (monomer [C]; 26.88 g) as cyclic olefin monomers, and 0.96 g of 1-octene were used, and as a result, no remaining cyclic olefin monomer was found, and 36.5 g of a ring-opening metathesis polymer in the form of a powder was obtained. The molar ratio [C]/[D] of the cyclic olefin monomers used in the polymerization is 50/50.

Hydrogenation was carried out using 20 g of the resulting polymer in the same manner as in Example 13 to obtain 19.6 g of a hydrogenated product of the polymer. The hydrogenation rate was 100%, the Mw was 16900, the Mw/Mn was 2.50, the water contact angle was 91°, the refractive index was 1.50, and the Tg was 92° C.

10 g of the resulting hydrogenated product of the ring-opening metathesis polymer was subjected to elimination of an acetyl group in the same manner as in Example 20 to obtain 8.2 g of a white powder. As a result of $^1$H-NMR analysis, all the acetyl groups were eliminated, and the ratio [A]/[B] of the structural units was 50/50. The Mw was 16500, the Mw/Mn was 2.55, the water contact angle was 83°, the refractive index was 1.50, and the Tg was 72° C. Next, the adhesion strength as measured in the same manner as in Example 1, except that a polycarbonate film (trademark "ElMECH" manufactured by Kaneka Corporation) having a thickness of 66 μm was used as an adherend, and t the temperature capable of adhesion by an adhesive sheet was 100° C., was 1.6 kN/m.

Example 22

Polymerization was carried out in the same manner as in Example 1, except that 2-(bicyclo[2.2.1]hepta-5-en-2-ylmethyl)-1,1,1,3,3,3-hexafluoropropan-2-yl acetate (monomer [C]; 53.76 g) was used as the cyclic olefin monomer, and as a result, no remaining cyclic olefin monomer was found, and 53.3 g of a ring-opening metathesis polymer in the form of a powder was obtained. The molar ratio [C]/[D] of the cyclic olefin monomers used in the polymerization is 100/0.

Hydrogenation was carried out using 20 g of the resulting polymer in the same manner as in Example 13 to obtain 19.3 g of a hydrogenated product of the polymer. The hydrogenation rate was 100%, the Mw was 12800, the Mw/Mn was 2.35, the water contact angle was 93°, the refractive index was 1.48, and the Tg was 42° C.

10 g of the resulting hydrogenated product of the ring-opening metathesis polymer was operated in the same manner as in Example 20 to obtain 6.0 g of a white powder. As a result of $^1$H-NMR analysis, all the acetyl groups were eliminated, and the ratio [A]/[B] of the structural units was 100/0. The Mw was 12500, the Mw/Mn was 2.51, the water contact angle was 84°, the refractive index was 1.48, and the Tg was 28° C. Next, the adhesion strength as measured in the same manner as in Example 1, except that a polyethylene terephthalate film (trademark "Lumirror" manufactured by Toray Industries, Inc.) having a thickness of 50 μm was used as an adherend, and the temperature capable of adhesion by an adhesive sheet was 70° C., was 1.2 kN/m.

Example 23

20 g of the polymer obtained in Example 22 was treated with 10 wt % NaOH aqueous solution in the same manner as in Example 20 to obtain 12.5 g of a white powder. As a result of $^1$H-NMR analysis, all the acetyl groups were eliminated, and the ratio [A]/[B] of the structural units was 100/0. The Mw was 11000, the Mw/Mn was 2.09, the water contact angle was 85°, the refractive index was 1.50, and the Tg was 56° C.

Hydrogenation was carried out using 10 g of the resulting polymer in the same manner as in Example 13 to obtain 9.6 g of a hydrogenated product of the polymer. The hydrogenation rate was 100%, the Mw was 12600, the Mw/Mn was 2.48, the water contact angle was 84°, the refractive index was 1.48, and the Tg was 26° C. Next, the adhesion strength as measured in the same manner as in Example 1, except that a polyethylene terephthalate film (trademark "Lumirror" manufactured by Toray Industries, Inc.) having a thickness of 50 μm was used as an adherend, and the temperature capable of adhesion by an adhesive sheet was 70° C., was 1.2 kN/m.

Example 24

The same reaction was carried out as in Example 1, except that 4,10-dioxa-tricyclo[5.2.1.0$^{2,6}$]-8-decen-3,5-dione (monomer [C]; 14.12 g) and tetracyclo[4.4.0.1$^{2,5}$.1$^{7,10}$]-3-dodecene (monomer [D]; 13.62 g) were used as cyclic olefin monomers, 1,5-hexadiene was not used, and Mo(N-2,6-Pr$^i_2$C$_6$H$_3$)(CHCMe$_3$)(OCMe(CF$_3$)$_2$)$_2$ (2.40 g) was used as a polymerization catalyst. Thereafter, butyraldehyde (0.74 g) was added thereto, and the mixture was stirred for 30 minutes. Further, polymerization was carried out as in Example 1, and as a result, no remaining cyclic olefin monomer was found, and 27.8 g of a ring-opening metathesis polymer in the form of a powder was obtained. The molar ratio [C]/[D] of the cyclic olefin monomers used in the polymerization is 50/50. The Mw was 13100, the Mw/Mn was 1.03, the water contact angle was 93°, the refractive index was 1.56, and the Tg was 146° C.

10 g of the resulting ring-opening metathesis polymer was dissolved in 100 ml of THF, 10 ml of 10 wt % NaOH aqueous solution was then added to the solution, and the mixture was heated under reflux for 2 hours. The solution was neutralized, discharged into water, and dried to obtain 9.8 g of a white powder. As a result of $^{13}$C-NMR analysis, all the anhydrides were hydrolyzed, and the ratio [A]/[B] of the structural units was 50/50. The Mw was 14200, the Mw/Mn was 1.06, the water contact angle was 80°, the refractive index was 1.56, and the Tg was 189° C., and the adhesion strength as measured in the same manner as in Example 1, except that the temperature capable of adhesion by an adhesive sheet was 230° C., was 2.0 kN/m.

Example 25

5 g of a ring-opening metathesis polymer obtained in Example 24 in which all the anhydrides were hydrolyzed, which was mixed with 2.8 g of a hydrogenated bisphenol A type diglycidylether compound (epoxy equivalent 205 g/eq, "YX-8000" manufactured by Japan Epoxy Resins Co., Ltd.). This mixture was slowly heated on a plate heater, and the flowability disappeared at about 200° C. to give a rubber-like product, which was not dissolved in THF.

Example 26

Polymerization was carried out in the same manner as in Example 24, except that 4-oxa-10-thia-tricyclo[5.2.1.0$^{2,6}$]-8-decen-3,5-dione (monomer [C]; 15.49 g) and tetracyclo[4.4.0.1$^{2,5}$.1$^{7,10}$]-3-dodecene (monomer [D]; 13.62 g) were used as cyclic olefin monomers, and 1,5-hexadiene was not used, and as a result, no remaining cyclic olefin monomer was found, and 29.1 g of a ring-opening metathesis polymer in the form of a powder was obtained. The molar ratio [C]/[D] of the cyclic olefin monomers used in the polymerization is 50/50. The Mw was 16900, the Mw/Mn was 1.07, the water contact angle was 93°, the refractive index was 1.60, and the Tg was 148° C.

The same procedure as in Example 24 was carried out using 10 g of the resulting ring-opening metathesis polymer to obtain 9.9 g of a white powder. As a result of $^{13}$C-NMR analysis, all the anhydrides were hydrolyzed, and the ratio [A]/[B] of the structural units was 50/50. The Mw was 17200, the Mw/Mn was 1.10, the water contact angle was 81°, the refractive index was 1.60, and the Tg was 191° C., and the adhesion strength as measured in the same manner as in Example 1, except that the temperature capable of adhesion by an adhesive sheet was 230° C., was 1.9 kN/m.

Comparative Example 1

Polymerization was carried out in the same manner as in Example 1, except that tetracyclo[4.4.0.1$^{2,5}$.1$^{7,10}$]-3-dodecene (monomer [D]; 27.24 g) was used as cyclic olefin monomers, and as a result, no remaining cyclic olefin monomer was found, and 27.3 g of a ring-opening metathesis polymer in the form of a powder was obtained. The molar ratio [C]/[D] of the cyclic olefin monomers used in the polymerization is 0/100. The Mw was 13000, the Mw/Mn was 2.36, the water contact angle was 95°, the refractive index was 1.59, and the Tg was 182° C.

The adhesion strength of the resulting ring-opening metathesis polymer as measured in the same manner as in Example 1, except that the temperature capable of adhesion by an adhesive sheet was 220° C., was 0.04 kN/m, which was remarkably lower than that of the polymer having an organic acid residue as in Examples of the present application.

Example 27

20 parts by weight of a ring-opening metathesis polymer obtained by scale-up synthesis in the same manner as in Example 6, in which all the esters were decomposed to carboxylic acids, and 80 parts by weight of "APEL (trademark) 6015 T" (manufactured by Mitsui Chemicals, Inc., a cyclic polyolefin resin) were mixed, and molded using a melt-extrusion molding machine at a cylinder temperature of 280° C. through a T-die to form a film having a thickness of 100 μm. A decomposed product of the polymer or a gel was not found in the film.

The resulting film had a water contact angle of 89° and a refractive index of 1.55.

Two sheets of the molded films were subjected to a heat treatment under the condition of a load of 5 MPa, a temperature 220° C., and a time of 1 minute to prepare an adhesive sheet. The obtained sheet was used to carry out a 90° peeling test, and as the result, the peeling strength was 0.6 kN/m.

Example 28

20 parts by weight of a ring-opening metathesis polymer obtained by scale-up synthesis in the same manner as in Example 8, in which all the esters were decomposed to carboxylic acids, and 80 parts by weight of "APEL (trademark) 6015 T" (manufactured by Mitsui Chemicals, Inc., a cyclic polyolefin resin) were mixed in the same manner as in Example 27, and molded to form a film having a thickness of 100 μm. A decomposed product of the polymer or a gel was not found in the film. The resulting film had a water contact angle of 90°, and a refractive index of 1.55.

Two sheets of the molded films were subjected to a heat treatment under the condition of a load of 5 MPa, a temperature 220° C., and a time of 1 minute to prepare an adhesive sheet. The obtained sheet was used to carry out a 90° peeling test, and as the result, the peeling strength was 0.4 kN/m.

Comparative Example 2

Only "APEL (trademark) 6015 T" (manufactured by Mitsui Chemicals, Inc., a cyclic polyolefin resin) was molded using a melt-extrusion molding machine at a cylinder temperature of 280° C. through a T-die to form a film having a thickness of 100 μm.

The resulting film had a water contact angle of 94°, a refractive index of 1.54, and a Tg of 145° C.

Two sheets of the molded films were subjected to a heat treatment under the condition of a load of 5 MPa, a temperature 200° C., and a time of 10 minutes to prepare an adhesive sheet. The resulting sheet was used to carry out a 90° peeling test, and as the result, the peeling strength was 0.02 kN/m.

The adhesiveness was remarkably lower, as compared with Example in which the ring-opening metathesis polymer having a carboxylic acid of the present invention was mixed.

Example 29

The resolution properties of the negative type one in the exposure to a KrF excimer laser were evaluated using the polymer of Example 24 in which all the anhydrides were decomposed to carboxylic acids as a base resin. 3 parts by mass of an acid generator represented by the following formula (5), 10 parts by mass of tetramethoxymethyl glycoluril as a crosslinking agent, 0.5 part by mass of tri-n-butylamine as a basic compound, and 425 parts by mass of a propyleneglycol monomethyl ether acetate as solvent were mixed with 100 parts by weight of the polymer. Then, these were filtered through a Teflon (trademark) filter (pore diameter: 0.2 μm) to give a resist material. The resulting resist solution was applied by spin coating on a silicon wafer having a diameter of 4 inches, then baked at a temperature of 120° C. to form a resist coating film having a film thickness of 0.7 μm. Through a pattern mask the resist coating film was exposed by using a KrF excimer laser stepper (manufactured by Nikon Corp., NA=0.5), and a thermal treatment was performed at 110° C. for 90 seconds. Then, a paddle development was effected for 60 seconds using 2.38% tetramethylammonium hydroxide aqueous solution, and then the film was washed with water, and dried to form a negative resist pattern. At this time, the exposure amount (optimum exposure amount) at which a line-and-space pattern having a line width of 0.5 μm could be formed as designed was 380 J/m$^2$, a development residue between the patterns was not recognized, and the pattern shape was rectangle.

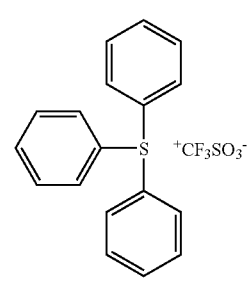

(5)

Example 30

A negative resist pattern was formed using the polymer of Example 17 in which all the anhydrides were decomposed to carboxylic acids as a base resin, in the same manner as in Example 29. At this time, the exposure amount (optimum exposure amount) at which a line-and-space pattern having a line width of 0.5 μm could be formed as designed was 400 J/m², a development residue between the patterns was not recognized, and the pattern shape was rectangle.

Example 31

The results of measurement of the melt viscosity of the ring-opening metathesis polymer, in which all the esters were decomposed to carboxylic acids, obtained in Example 10, are shown in Table 1. The ring-opening metathesis polymer having a carboxylic acid of the present Example has a high Tg, and high heat resistance, but has low melt viscosity at a high temperature.

Comparative Example 3

The results of measurement of the melt viscosity of the ring-opening metathesis polymer containing no carboxylic acid obtained in Comparative Example 1 are shown in Table 1.

The ring-opening metathesis polymer containing no carboxylic acid of the present Comparative Example has a lower melt viscosity at a temperature of from 260 to 270° C. than that of the ring-opening metathesis polymer containing a carboxylic acid as shown in Example 31, but at 290° C., the ring-opening metathesis polymer containing a carboxylic acid has a low melt viscosity.

TABLE 1

| | Measured Temperature | Units | Example 31 | Comparative Example 3 |
|---|---|---|---|---|
| Glass transition temperature (Tg) | — | ° C. | 199 | 182 |
| Melt viscosity | 260° C. | Pa · s | 15000 or more | 12000 |
| | 270° C. | | 11700 | 8800 |
| | 280° C. | | 6200 | 6000 |
| | 290° C. | | 2000 | 3300 |

As shown above, the ring-opening metathesis polymer and a hydrogenated product thereof according to Examples have a specific structure having repeating structural units including an organic acid residue, and accordingly, they have high surface polarity, excellent transparency, and crosslinking reactivity, as well as, excellent optical characteristics, electric characteristics, high rigidity, heat resistance, adhesiveness or cohesiveness with a substrate, the surface treatment properties of a surface coat or a coating, photo- or thermocurability for crosslinking, and the like. Therefore, the ring-opening metathesis polymer and a hydrogenated product thereof can be suitably used in wide industrial applications including materials for car parts, electric or electric materials such as a circuit substrate, and semiconductor materials such as a photoresist material and a sealing material, whereby they are of an industrially high value.

The invention claimed is:

1. A ring-opening metathesis polymer comprising at least repeating structural units [A] represented by the following General Formula [1]

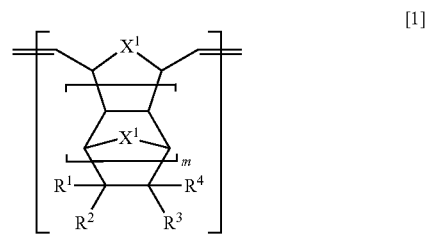

(wherein one of $R^1$ to $R^4$ is selected from a carboxylic acid having one carbon atom and a fluorine-containing alkyl alcohol having 1 to 20 carbon atoms, and the remainders of $R^1$ to $R^4$ are hydrogen, while $R^1$ to $R^4$ may be bonded to each other to form a cyclic ester structure capable of forming a carboxylic acid anhydride, and $X^1$ is selected from —O—, —S—, —$NR^5$—, —$PR^5$—, and —$CR^5{}_2$— (wherein $R^5$ represents hydrogen, or an alkyl group having 1 to 20 carbon atoms), and may be the same as or different from each other, m represents 0 or an integer of 1 to 3), and repeating structural units [B] represented by the following General Formula [2]

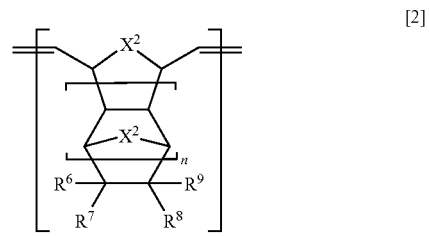

(wherein $R^6$ to $R^9$ are each a group selected from the group consisting of hydrogen, and a cyano group, or $R^6$ to $R^9$ are bonded to each other to form a cyclic ester structure capable of forming a lactone ring, and $X^2$ is —$CR^{10}{}_2$— (wherein $R^{10}$ represents hydrogen), and may be the same as or different from each other, n represents 0 or an integer of 1 to 3) at a constitutional molar ratio [A]/[B] of 0.1/99.9 to 50/50.

2. The hydrogenated product of the ring-opening metathesis polymer as set forth in claim 1, wherein 50 to 100% of the double bonds in the main chain of the polymer is hydrogenated.

3. The ring-opening metathesis polymer as set forth in claim 1, wherein $X^1$ of the structural units [A] represented by General Formula [1] is —O— or —S—.

4. The hydrogenated product of the ring-opening metathesis polymer as set forth in claim 2, wherein $X^1$ of the structural units [A] represented by General Formula [1] is —O— or —S—.

5. The ring-opening metathesis polymer as set forth in claim 1, wherein the water contact angle is 105° or less.

6. The hydrogenated product of the ring-opening metathesis polymer as set forth in claim 2, wherein the water contact angle is 105° or less.

7. The ring-opening metathesis polymer as set forth in claim 1, wherein the refractive index for a light at a D-ray wavelength is 1.48 or more.

8. The hydrogenated product of the ring-opening metathesis polymer as set forth in claim 2, wherein the refractive index for the light at a D-ray wavelength is 1.48 or more.

9. The ring-opening metathesis polymer as set forth in claim 1, wherein the adhesion strength is 0.1 kN/m or more, and the glass transition temperature is from 20° C. to 300° C.

10. The hydrogenated product of the ring-opening metathesis polymer as set forth in claim 2, wherein the adhesion strength is 0.1 kN/m or more, and the glass transition temperature is from 20° C. to 300° C.

11. A material for an optical component, comprising the ring-opening metathesis polymer and/or the hydrogenated product thereof as set forth in claim 1.

12. A film obtained by molding the material for an optical component as set forth in claim 11.

13. A molded product obtained by molding the material for an optical component as set forth in claim 11.

14. A resist material comprising the ring-opening metathesis polymer and/or the hydrogenated product thereof as set forth in claim 1.

15. A process for producing the ring-opening metathesis polymer as set forth in claim 1, comprising:
polymerizing at least one kind of a cyclic olefin monomer [C] represented by the following General Formula [3]

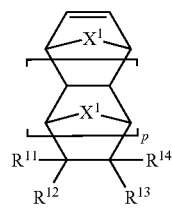

[3]

(wherein at least one of $R^{11}$ to $R^{14}$ is a substituent capable of forming a carboxylic acid having one carbon atom and a fluorine-containing alkyl alcohol having 1 to 20 carbon atoms by hydrolysis or acid elimination using acid or alkali, and the remainders of $R^{11}$ to $R^{14}$ are hydrogen, while $R^{11}$ to $R^{14}$ may be bonded to each other to form a cyclic ester structure capable of forming a carboxylic acid anhydride, and $X^1$ is selected from —O—, —S—, —NR$^{15}$—, —PR$^{15}$—, and —CR$^{15}{}_2$— (wherein $R^{15}$ represents hydrogen, or an alkyl group having 1 to 20 carbon atoms), and may be the same as or different from each other, p represents 0 or an integer of 1 to 3), or at least two kinds of the cyclic olefin monomers from a cyclic olefin monomer [C] represented by General Formula [3] and a cyclic olefin monomer [D] represented by the following General Formula [4]

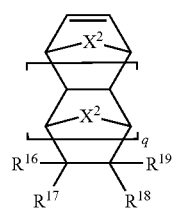

[4]

(wherein $R^{16}$ to $R^{19}$ are each a group selected from the group consisting of hydrogen, and a cyano group, or $R^{16}$ to $R^{19}$ are bonded to each other to form a cyclic ester structure capable of forming a lactone ring, and $X^2$ is —CR$^{20}{}_2$— (wherein $R^{20}$ represents hydrogen), and may be the same as or different from each other, q represents 0 or an integer of 1 to 3) in the presence of a ring-opening metathesis polymerization catalyst, and
subjecting it to hydrolysis or acid elimination.

16. A process for producing the hydrogenated product of the ring-opening metathesis polymer as set forth in claim 2, comprising:
polymerizing at least one kind of a cyclic olefin monomer [C] represented by the following General Formula [3]

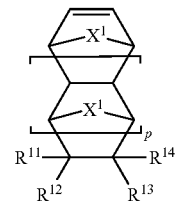

[3]

(wherein one of $R^{11}$ to $R^{14}$ is a substituent capable of forming a carboxylic acid having one carbon atom and a fluorine-containing alkyl alcohol having 1 to 20 carbon atoms by hydrolysis or acid elimination using acid or alkali, and the remainders of $R^{11}$ to $R^{14}$ are hydrogen, while $R^{11}$ to $R^{14}$ may be bonded to each other to form a cyclic ester structure capable of forming a carboxylic acid anhydride, and $X^1$ is selected from —O—, —S—, —NR$^{15}$—, —PR$^{15}$—, and —CR$^{15}{}_2$— (wherein $R^{15}$ represents hydrogen, or an alkyl group having 1 to 20 carbon atoms), and may be the same as or different from each other, p represents 0 or an integer of 1 to 3), or at least two kinds of the cyclic olefin monomers from a cyclic olefin monomer [C] represented by General Formula [3] and a cyclic olefin monomer [D] represented by the following General Formula [4]

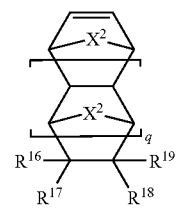

[4]

(wherein $R^{16}$ to $R^{19}$ are each a group selected from the group consisting of hydrogen, and a cyano group, or $R^{16}$ to $R^{19}$ are bonded to each other to form a cyclic ester structure capable of forming a lactone ring, and $X^2$ is —CR$^{20}{}_2$— (wherein $R^{20}$ represents hydrogen), and may be the same as or different from each other, q represents 0 or an integer of 1 to 3) in the presence of a ring-opening metathesis polymerization catalyst,
subjecting it to hydrolysis or acid elimination, and
further subjecting it to hydrogenation in the presence of a hydrogenation catalyst.

17. A process for producing the hydrogenated product of the ring-opening metathesis polymer as set forth in claim 2, comprising:

polymerizing at least one kind of a cyclic olefin monomer [C] represented by the following General Formula [3]

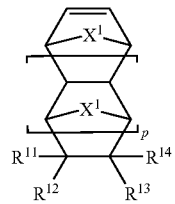

[3]

(wherein one of $R^{11}$ to $R^{14}$ is a substituent capable of forming a carboxylic acid having one carbon atom and a fluorine-containing alkyl alcohol having 1 to 20 carbon atoms by hydrolysis or acid elimination using acid or alkali, and the remainders of $R^{11}$ to $R^{14}$ are hydrogen, while $R^{11}$ to $R^{14}$ may be bonded to each other to form a cyclic ester structure capable of forming a carboxylic acid anhydride, and $X^1$ is selected from —O—, —S—, —$NR^{15}$—, —$PR^{15}$—, and —$CR^{15}{}_2$— (wherein $R^{15}$ represents hydrogen, or an alkyl group having 1 to 20 carbon atoms), and may be the same as or different from each other, p represents 0 or an integer of 1 to 3), or at least two kinds of a cyclic olefin monomer [C] represented by General Formula [3] and a cyclic olefin monomer [D] represented by the following General Formula [4]

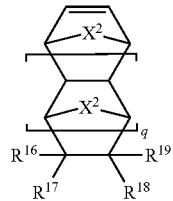

[4]

(wherein $R^{16}$ to $R^{19}$ are each a group selected from the group consisting of hydrogen, and a cyano group, or $R^{16}$ to $R^{19}$ are bonded to each other to form a cyclic ester structure capable of forming a lactone ring, and $X^2$ is —$CR^{20}{}_2$— (wherein $R^{20}$ represents hydrogen), and may be the same as or different from each other, q represents 0 or an integer of 1 to 3) in the presence of a ring-opening metathesis polymerization catalyst, subjecting it to hydrogenation in the presence of a hydrogenation catalyst, and further subjecting it to hydrolysis or acid elimination.

\* \* \* \* \*